United States Patent
Fukui et al.

(10) Patent No.: US 9,209,332 B2
(45) Date of Patent: Dec. 8, 2015

(54) SOLAR CELL ELEMENT AND SOLAR CELL MODULE

(75) Inventors: Kenji Fukui, Higashiomi (JP);
Tomonari Sakamoto, Higashiomi (JP);
Naoya Kobamoto, Higashiomi (JP);
Norikazu Nakatani, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 792 days.

(21) Appl. No.: 12/935,579

(22) PCT Filed: Mar. 30, 2009

(86) PCT No.: PCT/JP2009/056560
§ 371 (c)(1),
(2), (4) Date: Sep. 29, 2010

(87) PCT Pub. No.: WO2009/123149
PCT Pub. Date: Oct. 8, 2009

(65) Prior Publication Data
US 2011/0023962 A1 Feb. 3, 2011

(30) Foreign Application Priority Data

Mar. 31, 2008 (JP) .................................. 2008-089498
May 29, 2008 (JP) .................................. 2008-140544

(51) Int. Cl.
*H01L 31/00* (2006.01)
*H01L 31/0352* (2006.01)
(Continued)

(52) U.S. Cl.
CPC .. *H01L 31/035272* (2013.01); *H01L 31/02245* (2013.01); *H01L 31/0516* (2013.01); *Y02E 10/50* (2013.01)

(58) Field of Classification Search
CPC ............... H01L 31/022425; H01L 31/035272; H01L 31/042; H01L 31/0516; Y02E 10/50

USPC .......................................................... 136/256
See application file for complete search history.

(56) References Cited

U.S. PATENT DOCUMENTS 3,502,507 A     3/1970 Mann
5,478,402 A *  12/1995 Hanoka ......................... 136/251
(Continued)

FOREIGN PATENT DOCUMENTS

EP     0881694 A1    12/1998
JP     63-211773       9/1988
(Continued)

OTHER PUBLICATIONS

Japanese language office action dated Sep. 3, 2013 and its English language Statement of Relevance of Non-English References Pursuant to 37 CFR 1.98(a)(3)(i) issued in corresponding Japanese application 2012259819 cites the foreign patent documents listed above.
(Continued)

*Primary Examiner* — Tamir Ayad
(74) *Attorney, Agent, or Firm* — Procopio, Cory, Hargreaves & Savitch LLP

(57) ABSTRACT

A solar cell element comprising a semiconductor substrate including a first surface to receive light, and a second surface provided on a back side of the first surface, a plurality of base collector electrodes provided on the second surface of the semiconductor substrate, a plurality of collector electrodes provided on the plurality of base collector electrodes, a connector electrode to electrically connect the collector electrodes adjacent to each other across a region between the plurality of base collector electrodes among the plurality of collector electrodes. A first extracting electrode provided between the plurality of base collector electrodes, and a second extracting electrode electrically connected to at least one of the plurality of collector electrodes.

16 Claims, 58 Drawing Sheets

(51) Int. Cl.
*H01L 31/0224* (2006.01)
*H01L 31/05* (2014.01)

(56) References Cited

U.S. PATENT DOCUMENTS

| | | | |
|---|---|---|---|
| 6,384,317 | B1 | 5/2002 | Kerschaver et al. |
| 7,144,751 | B2 * | 12/2006 | Gee et al. ............ 438/98 |
| 2005/0172996 | A1 | 8/2005 | Hacke et al. ............ 136/256 |
| 2008/0041437 | A1 | 2/2008 | Yamaguchi |
| 2011/0023962 | A1 | 2/2011 | Fukui et al. |

FOREIGN PATENT DOCUMENTS

| | | |
|---|---|---|
| JP | 252362 U | 4/1990 |
| JP | 2002-500825 | 1/2002 |
| JP | 2004119687 A | 4/2004 |
| JP | 2006120944 A | 5/2006 |
| JP | 2006324590 A | 11/2006 |
| JP | 2007-521668 | 8/2007 |
| JP | 2008-034609 | 2/2008 |
| JP | 5149376 B2 | 2/2013 |
| WO | WO 2006/029250 A2 | 3/2006 |

OTHER PUBLICATIONS

Extended European Search Report dated Jul. 20, 2015 issued by the European Patent Office for Counterpart European Application No. EP 09726666.2.

* cited by examiner

F I G. 1
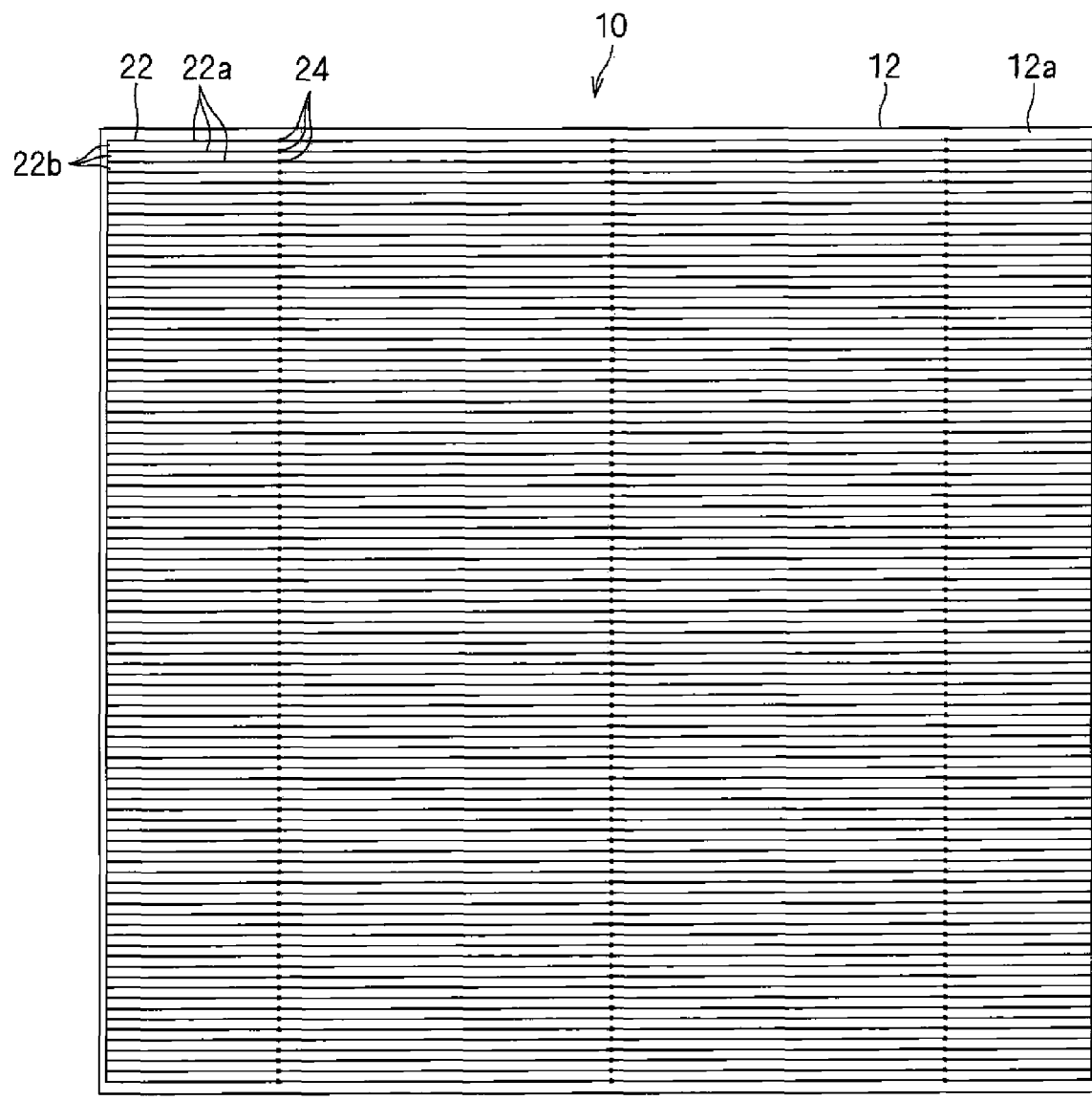

F I G . 3
10
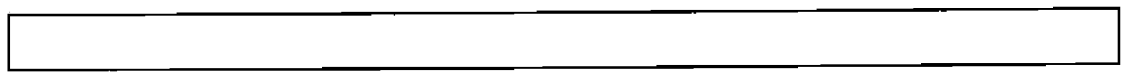

F I G . 4
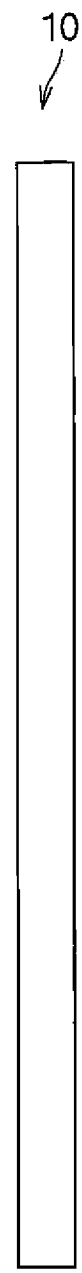

F I G. 1 9
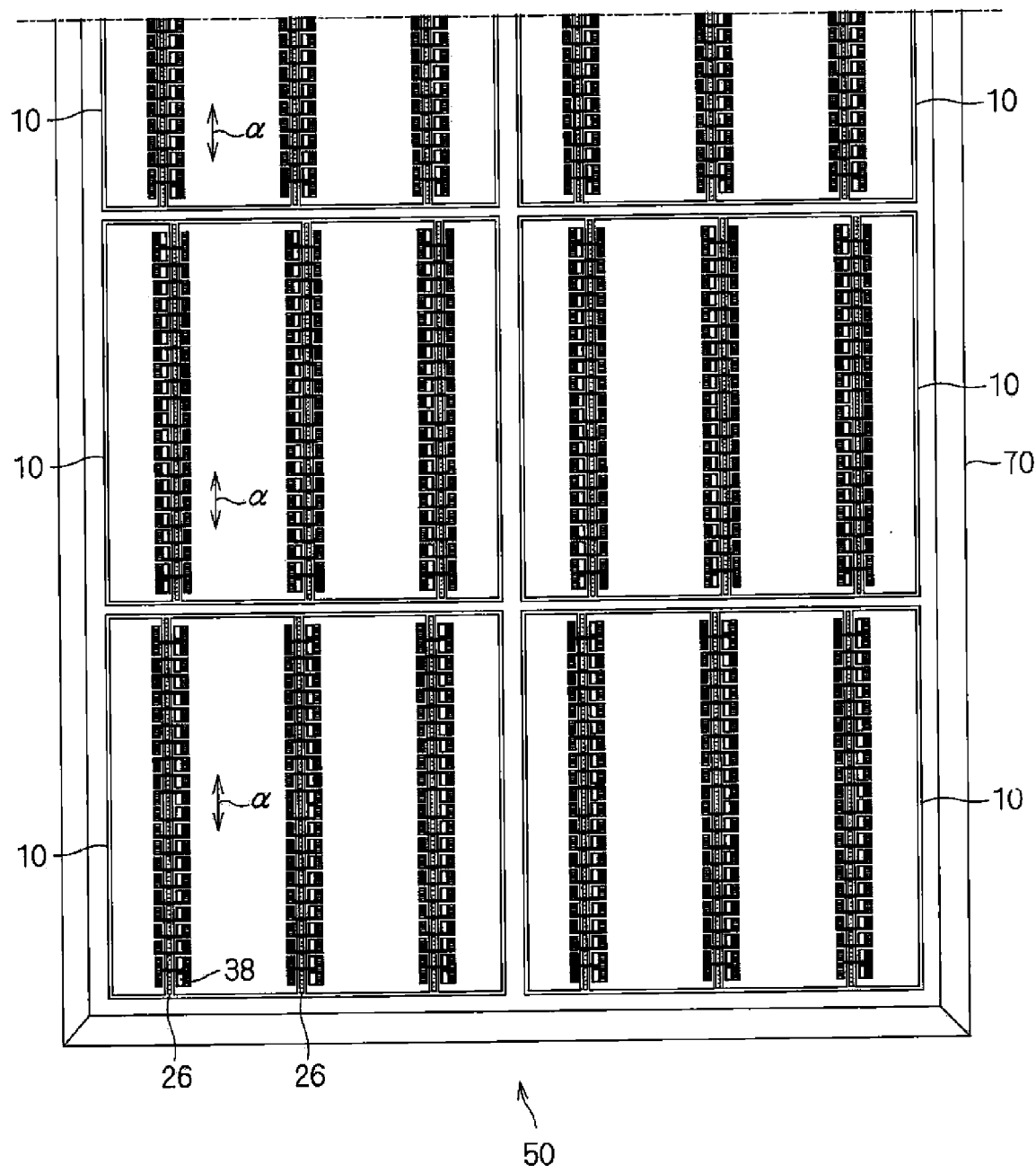

F I G. 2 3
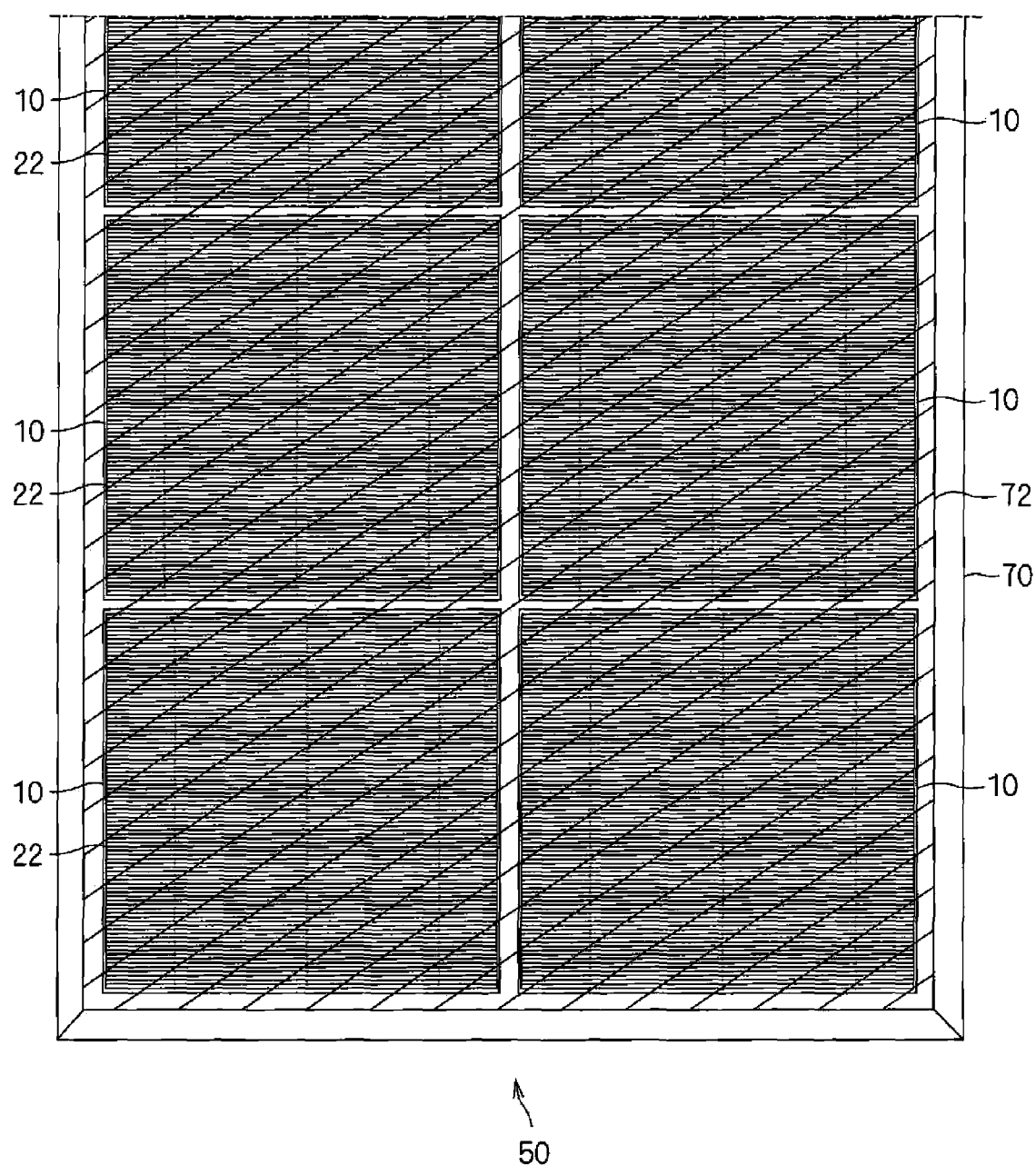

F I G . 3 1
110
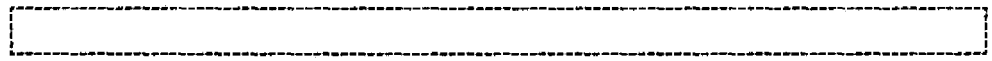

F I G . 3 2

F I G . 3 4
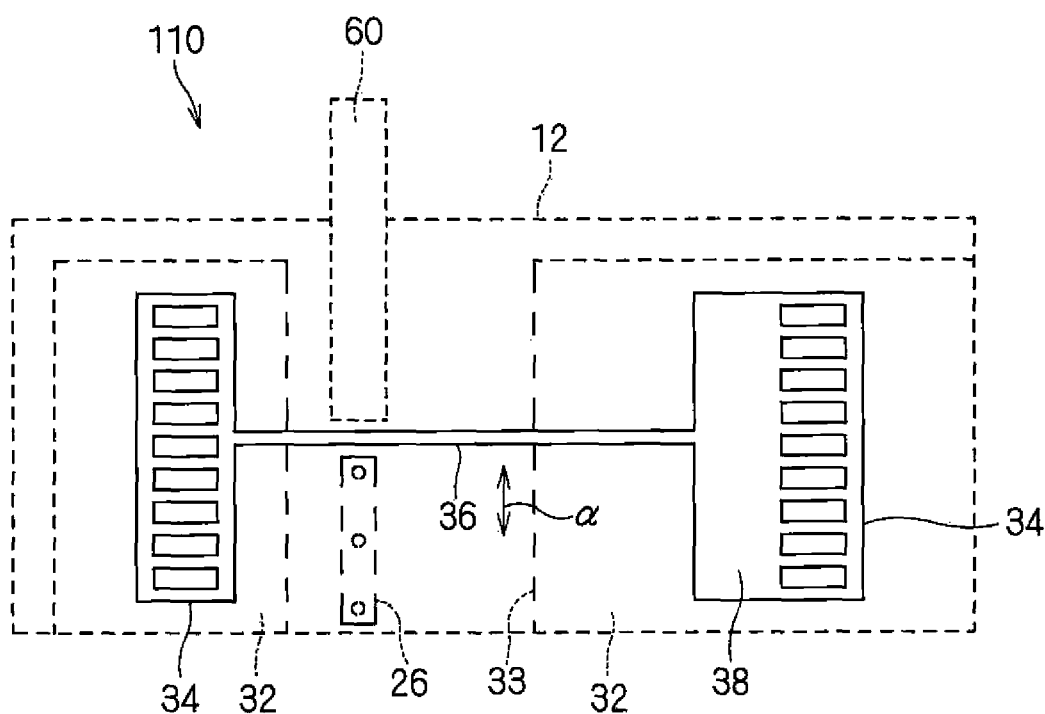

F I G. 3 7
210
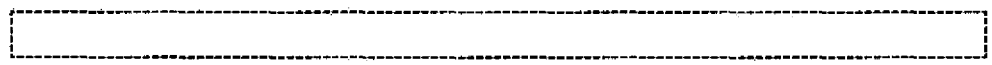

F I G. 3 8

F I G. 4 4
310
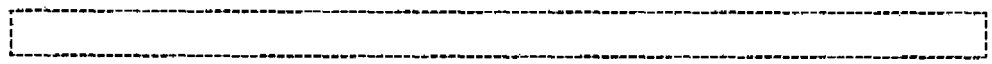

F I G. 4 9
410
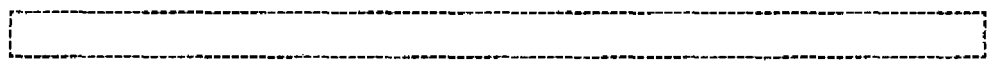

F I G. 5 2
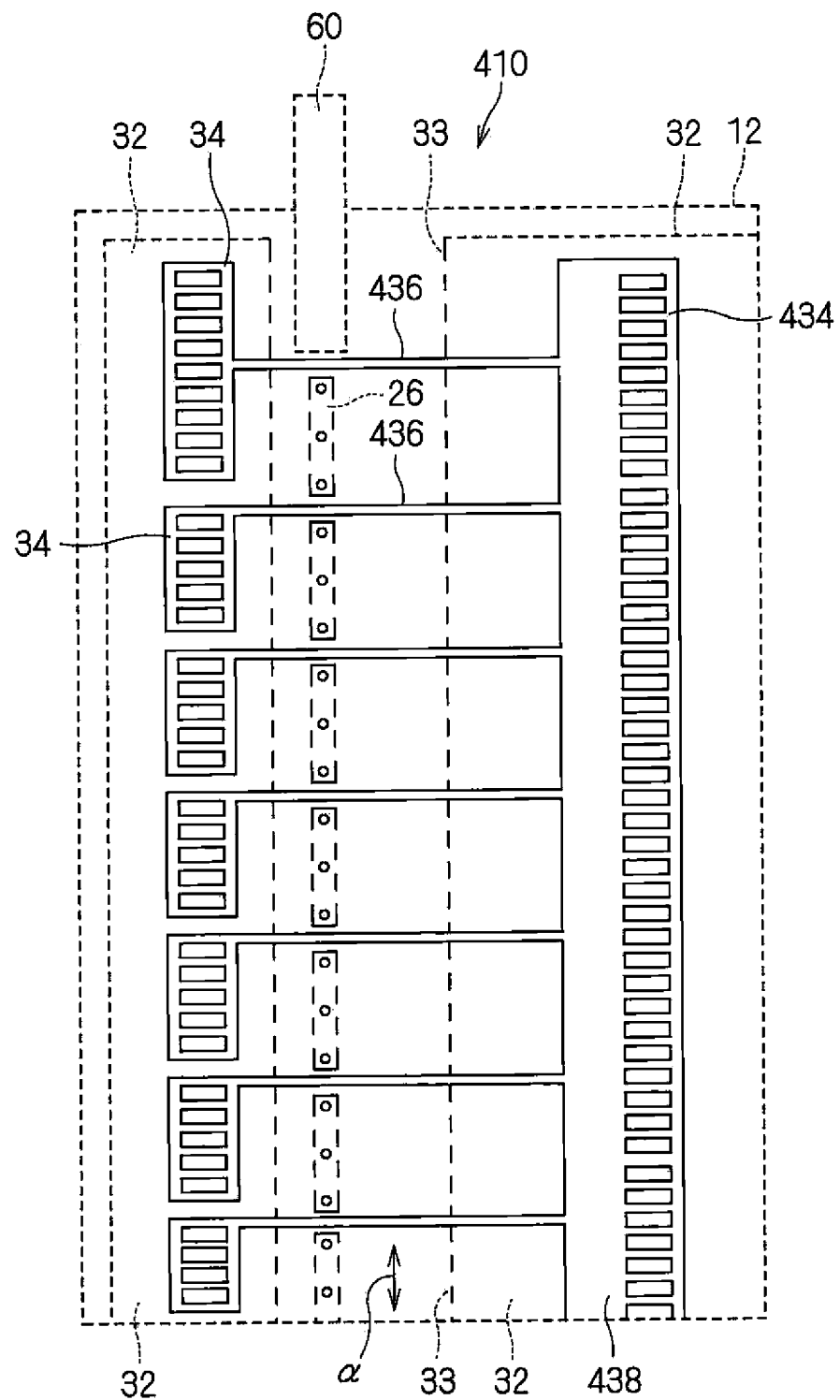

F I G. 5 5
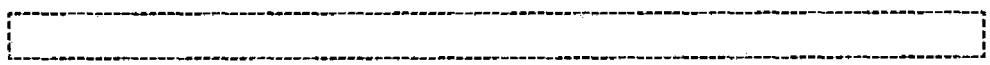
510

510

SOLAR CELL ELEMENT AND SOLAR CELL MODULE

CROSS-REFERENCE TO THE RELATED APPLICATIONS

This application is a national stage of international application No. PCT/JP2009/056560, filed Mar. 30, 2009, and claims the benefit of priority under 35 USC 119 to Japanese Patent Application No. 2008-089498, filed Mar. 31, 2008 and Japanese Patent Application No. 2008-140544, filed May 29, 2008, the entire contents of which are incorporated herein by reference.

TECHNICAL FIELD

The present invention relates to a solar cell element and a solar cell module.

BACKGROUND ART

A back-contact type solar cell element includes a grid electrode formed on a surface of substrate, an n electrode formed on a back surface of the substrate, and a p electrode formed on the back surface of the substrate. The grid electrode is electrically connected to the p electrode through a through hole formed in the substrate. Thus, outputs of both electrodes can be extracted from the back surface of the substrate through the n electrode and the p electrode.

There are Japanese Unexamined Patent Application Publication No. 63-211773 and Japanese Unexamined Patent Application Publication (Translation of PCT Application) No. 2002-500825 as technique documents relating to the above.

DISCLOSURE OF THE INVENTION

The number of the n electrodes or the p electrodes is to be adjusted in the above solar cell element in some cases.

For example, when a solar cell module is produced using the plurality of solar cell elements, the n electrodes and the p electrodes are mutually connected between the solar cell elements.

In this case, when the number of the n electrodes does not coincide with the number of the p electrodes provided on the back surface of the solar cell element, after the n electrodes and the p electrodes are mutually connected on one-on-one basis, an extra electrode which is not used for the connection between the solar cell elements is generated. The extra electrode is left as it is or separately connected to another electrode. In the former case, the generated power is wasted. In the latter case, it needs an extra external connection operation.

Thus, it is an object of the present invention to enable the number of extracting electrodes of a solar cell element to be easily adjusted.

In order to solve the above problem, a solar cell element according to a first aspect includes a semiconductor substrate including a first surface to receive solar light, and a second surface provided on a back side of the first surface, a plurality of base collector electrodes provided on the second surface of the semiconductor substrate, a plurality of collector electrodes provided on the plurality of base collector electrodes, a connector electrode to electrically connect the collector electrodes adjacent to each other across a region between the plurality of base collector electrodes among the plurality of collector electrodes, a first extracting electrode provided between the plurality of base collector electrodes, and a second extracting electrode electrically connected to at least one of the plurality of collector electrodes electrically connected through the connector electrode, on the second surface of the semiconductor substrate.

Thus, the outputs from the adjacent collector electrodes can be unified by the connector electrode and extracted through the second extracting electrode. Therefore, the number of the extracting electrodes of the solar cell element can be easily adjusted.

The object, characteristics, aspect, advantage of the solar cell element and the solar cell module become clearer by the following detailed description and accompanying drawings.

BRIEF DESCRIPTION OF THE DRAWINGS

FIG. 1 is a front view of a solar cell element according to a first embodiment.
FIG. 3 is a plan view of the above solar cell element.
FIG. 4 is a left side view of the above solar cell element.
FIG. 19 is a back view of the lower half part of the solar cell module.
FIG. 22 is a view showing a see-through part in.
FIG. 16.
FIG. 23 is a view showing a see-through part in FIG. 17.
FIG. 31 is a plan view of the above solar cell element.
FIG. 32 is a left side view of the above solar cell element.

FIG. 34 is a view showing a state in which an external wiring is connected in FIG. 33.

FIG. 37 is a plan view of the above solar cell element.

FIG. 38 is a left side view of the above solar cell element.

FIG. 44 is a left side view of the above solar cell element.

FIG. 49 is a plan view of the above solar cell element.

FIG. 52 is a view showing a state in which an external wiring is connected in FIG. 51.

FIG. 55 is a plan view of the above solar cell element.

BEST MODE FOR CARRYING OUT THE INVENTION

{First Embodiment}

Hereinafter, a description will be made of a solar cell element and a solar cell module according to a first embodiment.

The solar cell element is an element which receives light and generates electricity, and the solar cell module comprises the plurality of solar cell elements. Here, the solar cell element will be described first and then, the solar cell module will be described.

<Solar Cell Element>

Figure 6:
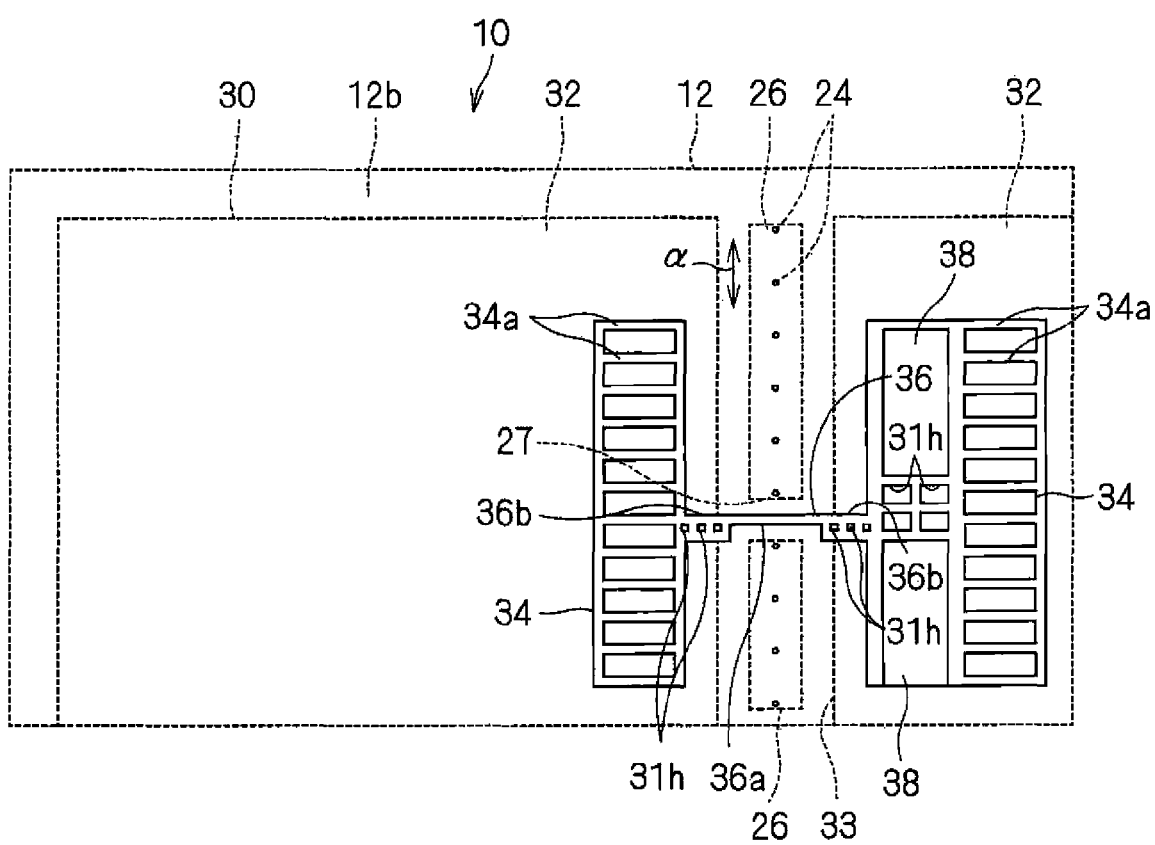
FIG. 6 is an enlarged view of a part A1-A2 in FIG. 2.
Figure 7:
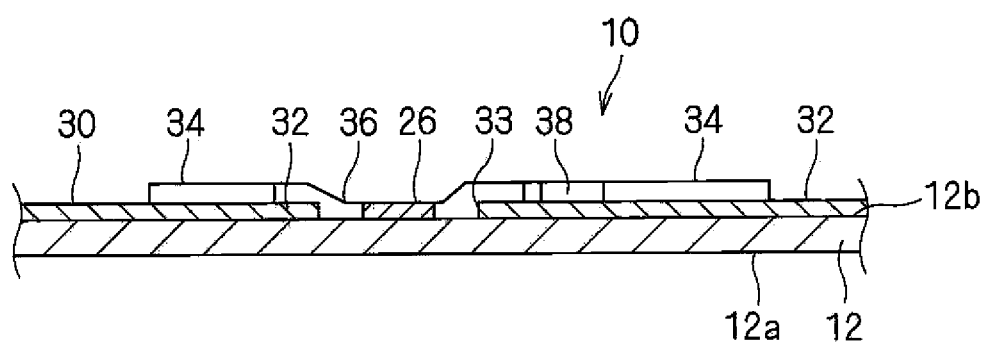
FIG. 7 is a cross-sectional view taken along a line VII-VII in FIG. 5.
Figure 8:
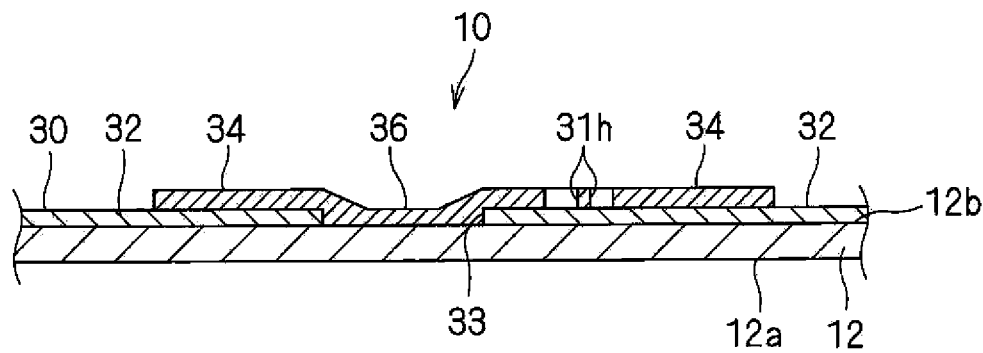
FIG. 8 is a cross-sectional view taken along a line VIII-VIII in FIG. 5.
Figure 9:
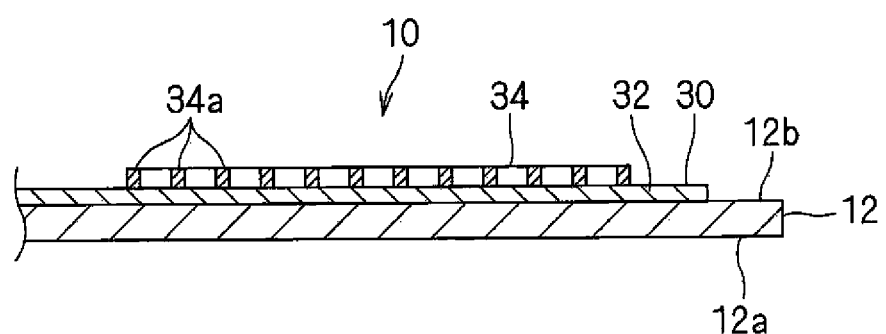
FIG. 9 is an enlarged view of a part of cross-section taken along a line IX-IX in FIG. 5.

In FIGS. 1 to 4, a bottom view of a solar cell element 10 is symmetrical to a plan view thereof, and a right side view of the solar cell element 10 is symmetrical to a left side view thereof. In addition, a design of the solar cell element 10 can be figured out from FIGS. 1 to 5. FIG. 6 is a view showing a part which can be figured out as a partial design with solid lines. In addition, in each drawing, a line showing a boundary between a second extracting electrode 38 and a collector electrode 34 is a line provided for convenience of description, and the boundary does not appear as the design.

Regarding the solar cell element 10, a light-receiving surface electrode 22 is provided on a first surface 12a, which receives light such as sun light, of a semiconductor substrate 12. The first surface 12a is also called a light-receiving surface. In addition, a first extracting electrode 26 electrically connected to the light-receiving surface electrode 22 is provided on a second surface 12b provided on the back side of the first surface 12a of the semiconductor substrate 12. The second surface 12b is also called a back surface. Furthermore, a base collector electrode 32, the collector electrode 34, a connector electrode 36, and the second extracting electrode 38 are provided on the second surface 12b of the semiconductor substrate 12. Thus, outputs of both electrodes can be extracted on the second surface side of the semiconductor substrate 12 through the first extracting electrode 26 and the second extracting electrode 38.

Here, a layer structure of the solar cell element 10 will be described. The solar cell element 10 comprises the semiconductor substrate 12, a first electrode 20, and a second electrode 30.

The semiconductor substrate 12 is in the form of a plate, or rectangle plate here. A thickness of the whole semiconductor substrate 12 is preferably 300 µm or less, more preferably 250 µm or less, and further preferably 150 µm or less.

A through hole 12h penetrating between the first surface 12a and the second surface 12b is formed in the semiconductor substrate 12. A diameter of the through hole 12h is preferably 50 µm to 300 µm.

In addition, the semiconductor substrate 12 has a one-conductivity type layer 13, and an opposite-conductivity type layer 14. The one-conductivity type layer 13 and the opposite-conductivity type layer 14 show opposite conductivity types, respectively and here, it is assumed that the one-conductivity type layer 13 shows a p type and the opposite-conductivity type layer 14 shows an n type in the following description.

The one-conductivity type layer 13 constitutes a bulk region of the semiconductor substrate 12. The opposite-conductivity type layer 14 has a first opposite-conductivity type layer part 14a formed on the first surface 12a side of the semiconductor substrate 12, a second opposite-conductivity type layer part 14b formed on an inner peripheral surface of the through hole 12h, and a third opposite-conductivity type layer part 14c formed on the second surface 12b side of the semiconductor substrate 12.

The first opposite-conductivity type layer part 14a is formed approximately all over the first surface 12a of the semiconductor substrate 12 except for the through hole 12h. A thickness of the first opposite-conductivity type layer part 14a is preferably about 0.2 to 0.5 µm. The second opposite-conductivity type layer part 14b is formed approximately all over the inner peripheral surface of the through hole 12h. In addition, the third opposite-conductivity type layer part 14c is formed in an opening edge of the through hole 12h on the second surface 12b of the semiconductor substrate 12 in the form of a approximately annular shape.

A p-n junction is formed between the one-conductivity type layer 13 and the opposite-conductivity type layer 14 in the semiconductor substrate 12.

In addition, the semiconductor substrate 12 has a high-concentration doped layer 16 in its inside. The high-concentration doped layer 16 is a part in which a dopant element is doped at a concentration higher than a concentration of a dopant element in the one-conductivity type layer 13. The high-concentration doped layer 16 is provided approximately all over the second surface 12b of the semiconductor substrate 12 except for a contact part with the opposite-conductivity type layer 14.

The high-concentration doped layer 16 is provided to obtain a BSF effect (back surface field effect). The high-concentration doped layer 16 is a layer to form an internal electric field in the semiconductor substrate 12, in order to reduce power generation efficiency from being lowered due to generation of carrier recombination in the vicinity of the second surface 12b of the semiconductor substrate 12.

In addition, the base collector electrode 32 is formed on a surface of the high-concentration doped layer 16, and an ohmic contact is formed between them.

In addition, the first surface 12a of the semiconductor substrate 12 may be in the form of a concavo-convex shape having many fine projections. The concavo-convex shape has a role to reduce reflection of incident light on the first surface 12a, and allowing the light to be absorbed more into the semiconductor substrate 12.

In addition, an antireflection film may be formed on the first surface 12a of the semiconductor substrate 12.

The first electrode 20 is formed of a conductive material such as silver, and shows a predetermined polarity by the power generation of the solar cell element 10, and comprises the light-receiving surface electrode 22, the first extracting electrode 26, and a conduction part 24.

The light-receiving surface electrode 22 is provided on the first surface 12a of the semiconductor substrate 12, and collect carriers generated on the first surface 12a. The first extracting electrode 26 is provided on the second surface 12b of the semiconductor substrate 12, and used as a wiring connection part connected to an external wiring with soldering or the like. In addition, the conduction part 24 is provided in the through hole 12h, and electrically connects the light-receiving surface electrode 22 to the first extracting electrode 26.

The second electrode 30 is formed of a conductive material, and shows polarity different from that of the first electrode 20, by the power generation of the solar cell element 10, and comprises the base collector electrode 32, the collector electrode 34, the connector electrode 36, and the second extracting electrode 38.

The base collector electrode 32 is formed on the high-concentration doped layer 16 in the second surface 12b of the semiconductor substrate 12. Here, the base collector electrode 32 is formed approximately all over the surface of the high-concentration doped layer 16. In addition, the base collector electrode 32 has an opening 32h, and the second extracting electrode 38 is formed so as to be in contact with the surface of the semiconductor substrate 12 in the opening 32h. In addition, the second extracting electrode 38 may be formed so as to be in contact with the surface of the high-concentration doped layer 16 as need arises. The base collector electrode 32 is formed of a conductive material such as aluminum, and collects carriers generated on the second surface 12b of the semiconductor substrate 12. The second extracting electrode 38 is formed of a conductive material such as silver, and used as a wiring connection part connected to the external wiring with soldering or the like.

Here, as for the second extracting electrode 38, when the second extracting electrode 38 is provided on the second surface 12b of the semiconductor substrate 12 in the opening 32h partially formed in the base collector electrode 32, the second extracting electrode 38 is large in thickness and large in cross-sectional area, so that a difference in level on the second surface 12b side of the solar cell element 10 can be reduced as much as possible, whereby stress at the time of thermal expansion and contraction can be small. As a matter of course, the base collector electrode 32 and the second extracting electrode 38 may be integrally formed at the time of formation of them, or may appear as an integral body after they have been formed separately.

The collector electrode 34 is provided on the surface of the base collector electrode 32 so as to be electrically connected to the second extracting electrode 38. The collector electrode 34 enables a current to efficiently flow from the base collector electrode 32 to the second extracting electrode 38, and reduces thermal stress generated in the base collector electrode 32. A detailed description will be made below in this respect.

The connector electrode 36 electrically connects the collector electrodes 34 to each other, or the collector electrode 34 to the second extracting electrode 38 so that a current can be extracted from the shared second extracting electrode 38, and it is also called a via electrode.

The collector electrode 34 and the connector electrode 36 are formed of a conductive material such as silver, and here, they are formed as the same one layer in the same production step. Alternatively, the collector electrode 34 and the connector electrode 36 may be produced separately in separate production steps.

In addition, the first extracting electrode 26, the collector electrode 34, the connector electrode 36, and the second extracting electrode 38 are preferably formed of a material having conductivity higher than that of the base collector electrode 32. For example, it is preferable that the base collector electrode 32 is formed of aluminum, and the first extracting electrode 26, the collector electrode 34, the connector electrode 36, and the second extracting electrode 38 are formed of silver.

Next, a description will be made of positions and shapes of the first electrode 20 and the second electrode 30 of the solar cell element 10.

Figure 10:
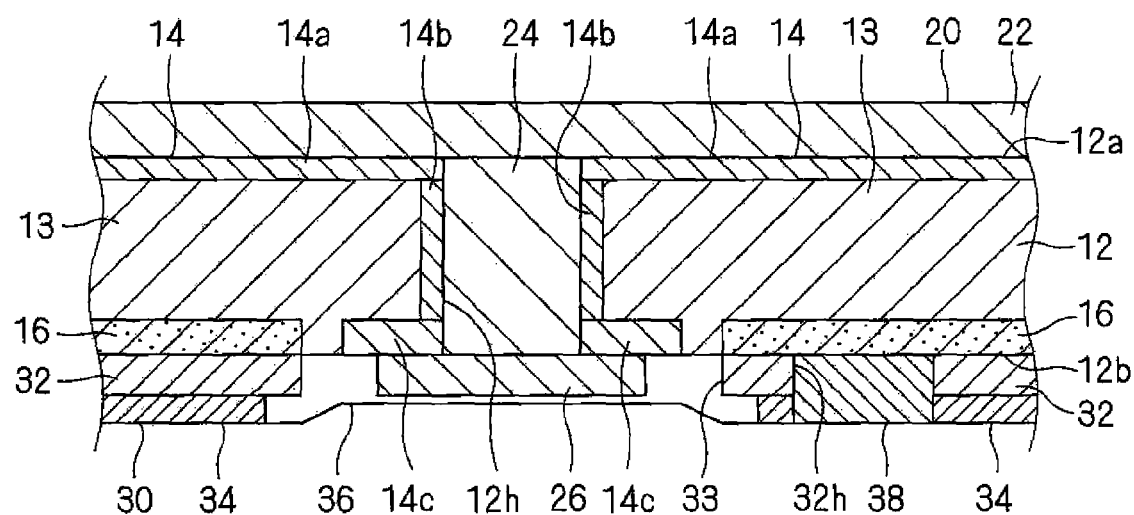
FIG. 10 is an enlarged view of a part of cross-section taken along a line X-X in FIG. 5.

As shown in FIGS. 1 and 10, the light-receiving surface electrode 22 is provided on the first surface 12a of the semiconductor substrate 12.

The light-receiving surface electrode 22 has a plurality of linear conductors 22a formed in approximately parallel, on the first surface 12a of the semiconductor substrate 12. Here, the plurality of linear conductors 22a are formed at approximately regular intervals in approximately parallel. The light-receiving surface electrode 22 is also called a finger electrode. In addition, the conduction part 24 is provided in the longitudinal middle of each linear conductor 22a, and the plurality of linear conductors 22a are electrically connected to the first extracting electrode 26 through the conduction part 24. Here, the three conduction parts 24 are provided at three points in the longitudinal middle of each linear conductor 22a. In addition, the adjacent linear conductors 22a are electrically connected at their ends by a light-receiving surface side connection part 22b extending in a direction approximately perpendicular to each linear conductor 22a. The light-receiving surface side connection part 22b may be omitted.

As shown in FIGS. 2, and 5 to 10, the first extracting electrode 26, the base collector electrode 32, the collector electrode 34, the connector electrode 36, and the second extracting electrode 38 are provided on the second surface 12b of the semiconductor substrate 12.

The base collector electrode 32 is divided into several (four in this case) regions on the second surface 12b of the semiconductor substrate 12 with a space 33 provided therebetween. The spaces 33 are provided in approximately parallel. Each base collector electrode 32 occupies approximately a rectangular region, and the base collector electrode 32 provided at each end in their arranged direction among the plurality of base collector electrodes 32 is smaller in width than the one provided in the middle of the arranged direction, and its width is approximately half as long here. Here, the width of the base collector electrode 32 is a width provided in the arrangement direction of the base collector electrodes 32.

In addition, the base collector electrodes 32 only have to be arranged in the several sections, and its number is optional. For example, the two base collector electrodes 32 may be arranged in two regions.

The collector electrodes 34 are provided on each surface of the base collector electrodes 32. Here, the plurality of collector electrodes 34 are provided along each edge of the base collector electrode 32 on the side of the space 33. The space 33 is provided between the plurality of collector electrodes 34 provided along the edges of the base collector electrodes 32.

In addition, the one positioned in the middle part of the base collector electrodes 32 (that is, the base collector electrode 32 having the width larger than the base collector electrode 32 at each end) has a plurality of collector electrodes 34 along both edges of the base collector electrode 32. Therefore, the carriers collected by the base collector electrode 32 can reach the collector electrode 34 in a relatively short distance, so that the recombination of the carries can be efficiently reduced.

Each collector electrode 34 has a plurality of fine line parts 34a mutually and electrically connected as one conductor. More specifically, each collector electrode 34 has a ladder shape in which the two spaced fine line parts 34a arranged in parallel are connected by the plurality of fine line parts 34a. The collector electrode 34 having the above shape is also called the finger electrode.

Figure 2:
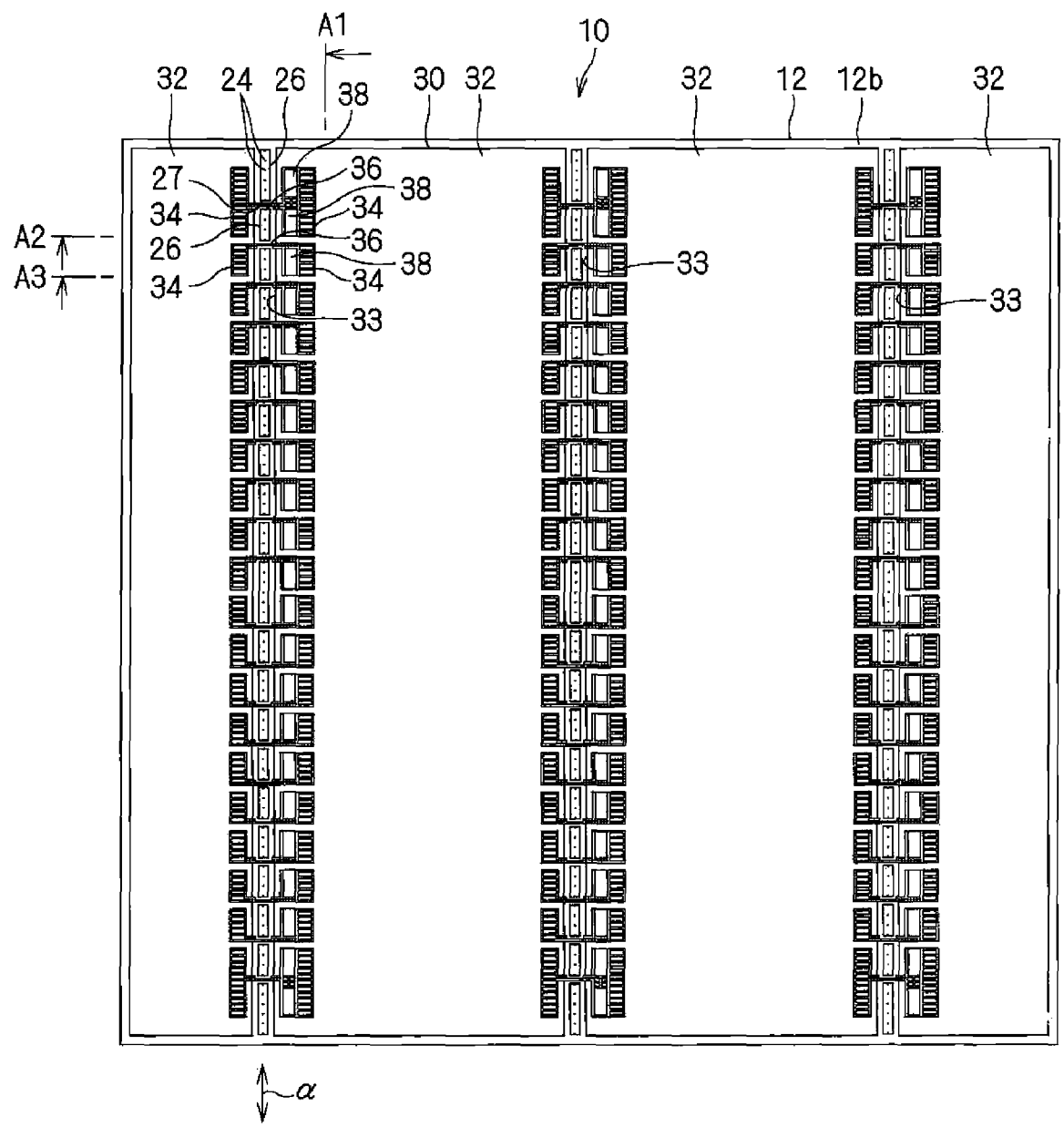
FIG. 2 is a back view of the above solar cell element.
Figure 5:
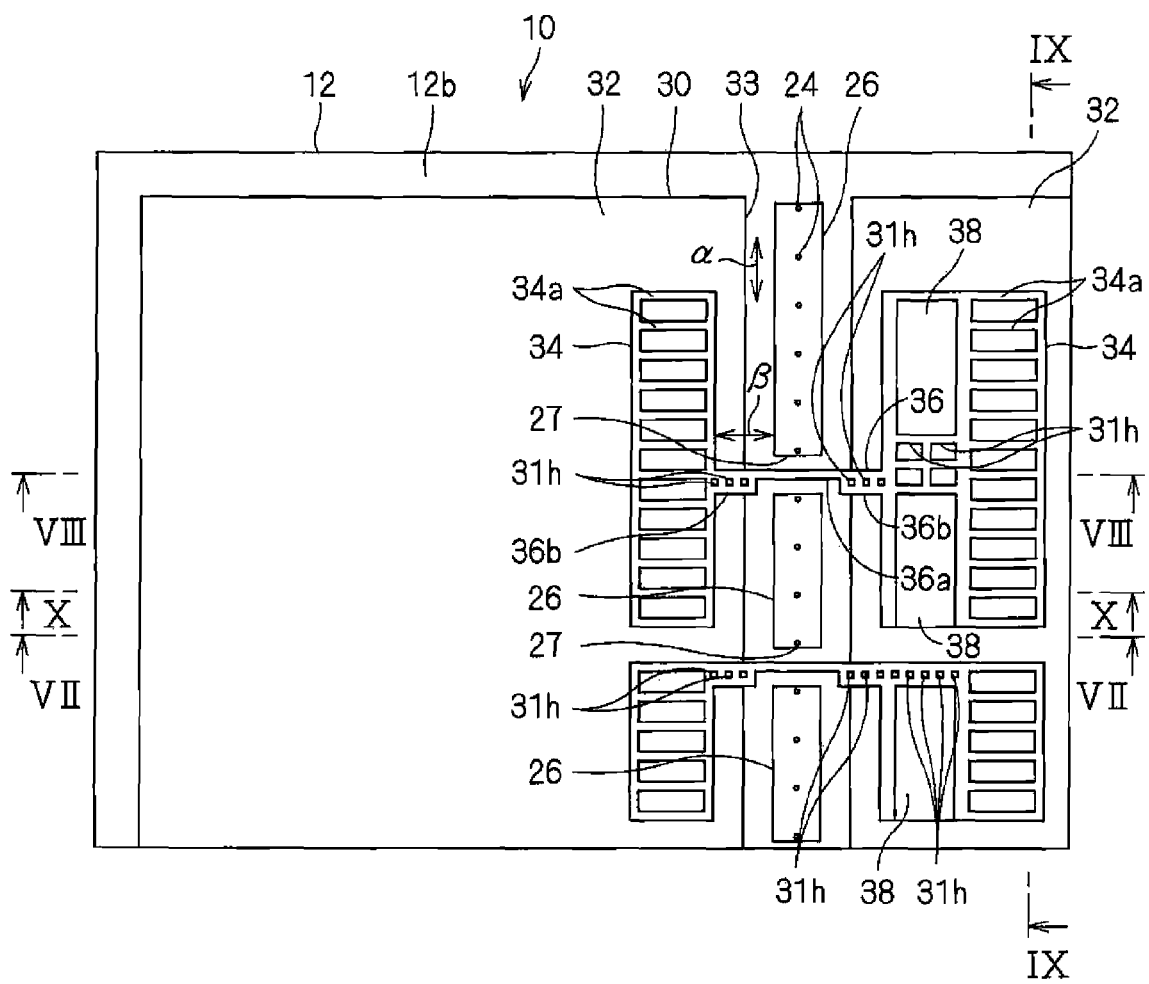
FIG. 5 is an enlarged view of a part A1-A3 in FIG. 2.

In addition, referring to FIG. 2, the collector electrode 34 provided at each end in a direction of the edge of the base collector electrode 32 is longer than the collector electrode 34 provided in the middle in the direction of the above edge, and this is approximately twice as long here.

The collector electrode 34 is not limited to the above configuration, and it may have a configuration such that the fine line parts are provided in a comb-shape or net-shape.

When the collector electrode 34 comprises the plurality of fine line parts 34a, the collector electrode 34 is in contact with the base collector electrode 32 at appropriately dispersed regions. Thus, the collector electrode 34 is in contact with the base collector electrode 32 by a relatively low contact resistance, so that a resistance loss between the base collector electrode 32 and the second extracting electrode 38 can be reduced, and therefore, the current can be more efficiently extracted. In addition, a surface contact part between the base collector electrode 32 and the collector electrode 34 can be reduced, so that thermal stress generated in the base collector electrode 32 due to a difference in thermal contraction rate between the base collector electrode 32 and the collector electrode 34 can be reduced.

The second extracting electrode 38 is in contact with one of the collector electrodes 34 provided in the base collector electrode 32 across the space 33, on the surface of the base collector electrode 32. In FIG. 2, it is in contact with the collector electrode 34 on the right side among the collector electrodes 34 provided across the space 33.

The second extracting electrode 38 is in a form of a rectangle having a longer side in an extending direction of the space 33 ($\alpha$ direction). Refer to FIG. 2, as for the second extracting electrode 38 provided for the collector electrode 34 provided at each end in the $\alpha$ direction among the collector electrodes 34, its length is shorter than a half of a length of the corresponding collector electrode 34.

In addition, as for the second extracting electrode 38 provided for the one provided in the middle part of the $\alpha$ direction among the collector electrodes 34, its length is approximately the same as that of the corresponding collector electrode 34. In addition, here, the second extracting electrode 38 is surrounded on all four sides by conductor parts of the collector electrode 34. The all four sides of the second extracting electrode is not necessarily surrounded by the conductor part of the collector electrode 34, and only one side may be in contact with it.

The first extracting electrodes 26 are provided in the region (space 33) between the base collector electrodes 32, and continued in approximately parallel to the collector electrodes 34. Here, the plurality of first extracting electrode 26 are linearly continued along the $\alpha$ direction in the space 33 between the base collector electrodes 32, while being segmentalized by spaces 27. The connector electrode 36 which will be described below is formed in the space 27 of the first extracting electrode 26. In addition, the first extracting electrode 26 and the second extracting electrode 38 are sandwiched between the adjacent collector electrodes 34 provided across the space 33.

The connector electrode 36 is formed so as to pass between the first extracting electrodes 26, and the connector electrode 36 electrically connects the collector electrodes 34 adjacently provided across the space 33 among the plurality of collector electrodes 34. In addition, the connector electrode 36 is formed in a $\beta$ direction which intersects with the $\alpha$ direction.

In addition, referring to FIG. 2, the connector electrode 36 is shorter than the collector electrode 34 in the $\alpha$ direction, and in the form of a fine-band shape which can be arranged so as to pass through the space between the first extracting electrodes 26.

In addition, referring to FIG. 2, as for the one provided at each end in the $\alpha$ direction among the collector electrodes 34, the connector electrode 36 is provided near the middle of the collector electrode 34 in the $\alpha$ direction. In addition, as for the one provided in the middle in the $\alpha$ direction among the collector electrodes 34, the connector electrode 36 is provided at the end of the collector electrode 34 in the $\alpha$ direction. Thus, each connector electrode 36 is arranged in the space 33 so as to pass through the space 27 between the first extracting electrodes 26.

Here, as for the one provided in the middle in the $\alpha$ direction among the collector electrodes 34, the connector electrode 36 is provided at the end of the collector electrode 34, and accordingly, the space 27 between the first extracting electrodes 26 is provided at the end of the collector electrode 34. Thus, the first extracting electrodes 26 and the collector electrodes 34 are separated, respectively in the same position along the $\alpha$ direction.

In addition, one end of the connector electrode 36 is directly connected to one of the collector electrode 34 (on the left side across the space 33 in FIG. 2), and the other end of the connector electrode 36 is connected to the other of the collector electrode 34 (on the right side across the space 33 in FIG. 2) through the second extracting electrode 38. In addition, the collector electrode 34 directly connected to the second extracting electrode may be omitted as need arises.

In addition, a part 36a of the connector electrode 36 sandwiched between the first extracting electrodes 26 is finer than its end part. Thus, a sufficient insulation distance is ensured between the connector electrode 36 and the first extracting electrode 26.

In addition, a stress relaxation hole 31h is formed in the vicinity of the end part of the connector electrode 36. The stress relaxation hole 31h has only to be provided in the vicinity of the end part of the connector electrode 36, so that the stress relaxation hole 31h may be formed in the connector electrode 36 itself, or in the collector electrode 34 directly connected to the connector electrode 36, or in the second extracting electrode 38.

Here, the stress relaxation hole 31h is formed in a thick width part 36b provided at each end of the thin width part 36a of the connector electrode 36. In addition, the stress relaxation hole 31h is also formed in a part of the collector electrode 34 which surrounds the second extracting electrode 38 along the longitudinal direction of the connector electrode 36. Each stress relaxation hole 31h is formed to be in the form of a rectangular hole. Thus, when the external wiring is soldered or the like, heat applied to the first extracting electrode 26 and the second extracting electrode 38 can be efficiently radiated to the outside through the stress relaxation hole 31h. Thus, thermal stress can be efficiently released in peripheral parts of the first extracting electrode 26 and the second extracting electrode 38, and especially in the collector electrode 34.

In addition, at least the surface of the connector electrode 36 is covered with an insulation layer formed of a polyimide resin or polyurethane resin or the like, on the second surface 12b side of the semiconductor substrate 12. This insulation layer has a role to prevent short circuit from being caused from the external wiring to the connector electrode 36 between the first extracting electrodes 26, in connecting the linear external wiring to the linearly arranged first extracting electrodes 26.

Figure 11:
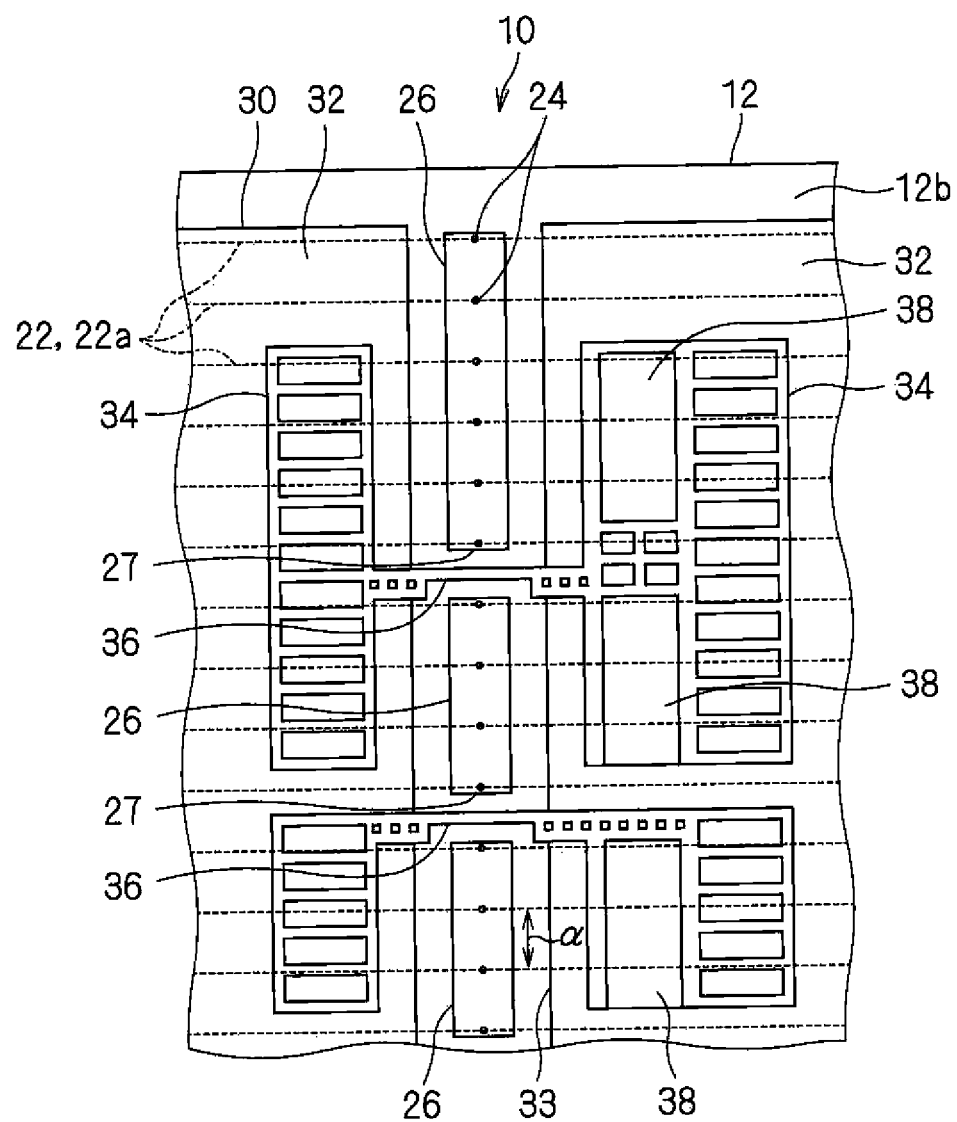
FIG. 11 is a view showing a relationship between a light-receiving surface electrode and a connector electrode.

In addition, as shown in FIG. 11, the light-receiving surface electrode 22 has a part which does not overlap with the connector electrode 36 in planar see-through view, in the space 33 between the base collector electrodes 32. Here, the connector electrode 36 is arranged between the linear conductors 22a of the light-receiving surface electrode 22, in the space 33, and extends in approximately the same direction as the linear conductor 22a. Thus, all of the conduction parts 24 can be connected to the first extracting electrodes 26 through the conduction parts 24 at positions except for the connector electrode 36. Thus, when all of the linear conductors 22a of the light-receiving surface electrode 22 can be connected to the first extracting electrodes 26 through the conduction parts 24, the connection wiring (such as the light-receiving side connection part 22b) to connect the linear conductors 22a in a direction approximately perpendicular to the linear conductors 22a can be eliminated or its number can be reduced in the side first surface 12a of the semiconductor substrate 12. Thus, the first surface 12a of the semiconductor substrate 12 can be improved in design performance.

In addition, a passivation layer may be formed of a silicon oxide film (SiO2 film), titanium oxide film (TiO2), or silicon nitride film (SiNx) or the like, on the non-light-receiving surface side.

<Method of Producing Solar Cell Element>

One example of a method of producing the above solar cell element 10 will be described.

First, a substrate showing one conductivity type (p-type conductivity type here) as a whole is prepared by doping a predetermined dopant (impurity for controlling the conductivity type), as an original substrate for the semiconductor substrate 12.

As the original substrate, a single-crystalline silicon substrate, polycrystalline silicon substrate, or a plate-shape silicon or the like is used.

The original substrate shows the p-type conductivity type for example by doping B (boron) or Ga (gallium) as a dopant element with $1\times10^{15}$ to $1\times10^{17}$ atoms/cm$^3$. The dopant element is for example doped by dissolving the dopant element itself or a dopant material containing the dopant element in silicon, in a silicon solution during production of a silicon ingot.

Then, the through hole 12h is formed in the original semiconductor substrate. The through hole 12h can be formed using a mechanical drill, water jet, or laser processing device or the like.

Then, the concavo-convex shape having the many fine projections is formed on the first surface 12a side of the original semiconductor substrate as need arises. The concavo-convex shape can be formed by wet etching or dry etching or the like.

Then, the first opposite-conductivity type layer part 14a is formed on the first surface 12a of the original semiconductor substrate, and the second opposite-conductivity type layer part 14b is formed on the inner peripheral surface of the through hole 12h, and the third opposite-conductivity type layer part 14c is formed on the second surface 12b side of the original semiconductor substrate, whereby the opposite-conductivity type layer 14 is formed.

The opposite-conductivity type layer 14 is formed by diffusing a dopant to implement the opposite-conductivity type in a predetermined part of the original semiconductor substrate. For example, when the semiconductor substrate having the p-type conductivity type is used, as the doping element to implement an n-type conductivity to form the opposite-conductivity type layer 14, phosphorus (P) is preferably used. In addition, a method of diffusing it includes an application thermal diffusion method in which $P_2O_5$ in a paste state is applied to the predetermined target part and thermally diffused, a gas-phase thermal diffusion method in which POCl$_3$ (phosphorus oxychloride) in a gas state as a diffusion source is diffused in the predetermined target part, and an ion implantation method in which p+ ions are directly diffused to the predetermined target part and the like.

Thus, the semiconductor substrate 12 has the one-conductivity type layer 13 and the opposite-conductivity type layer 14.

In addition, the antireflection film may be formed on the surface of the first surface 12a of the semiconductor substrate 12.

Then, the high-concentration doped layer 16 is formed on the second surface 12b side of the semiconductor substrate 12. For example, when boron is used as the dopant element, the high-concentration doped layer 16 can be formed by a thermal diffusion method using BB$_{r3}$ (boron tribromide) as the diffusion source under a temperature condition of 800 to 1100° C. In addition, when aluminum is used as the dopant element, for example, the high-concentration doped layer 16 can be formed by applying an aluminum paste containing aluminum powder and organic vehicle or the like to the second surface 12b of the semiconductor substrate 12 by a printing method, and diffusing aluminum on the second surface 12b of the semiconductor substrate 12 by a thermal (burning) process at the highest temperature of 700 to 850° C. In addition, in the case of the latter method, the aluminum layer formed on the second surface 12b after the burning can be used as the base collector electrode 32 as it is without being removed.

Then, the light-receiving surface electrode 22 and the conduction part 24 serving as the first electrode 20 is formed. The light-receiving surface electrode 22 and the conduction part 24 are formed by an application method. More specifically, a conductive paste provided by adding 10 to 30 parts by weight of organic vehicle and 0.1 to 10 parts by weight of glass frit, to 100 parts by weight of metal powder such as silver or the like is applied to a predetermined region of the first surface 12a of the semiconductor substrate 12, and also applied into the through hole 12h to form a coating film, and this coating film is burned at the highest temperature of 500 to 850° C. for several tens of seconds to several tens of minutes, whereby the light-receiving surface electrode 22 and the conduction part 24 are formed. In addition, as will be described below, since a conductive paste is also applied from the second surface 12b side into the through hole 12h when the first extracting electrode 26 is formed, the through hole 12h need not be completely filled with the conductive paste at this stage.

Then, the base collector electrode 32 is formed on the second surface 12b of the semiconductor substrate 12. The base collector electrode 32 can be also formed by the application method. More specifically, a conductive paste provided by adding 10 to 30 parts by weight of organic vehicle and 0.1 to 10 parts by weight of glass frit, to 100 parts by weight of metal powder such as aluminum or silver is applied to a predetermined region of the second surface 12b of the semiconductor substrate 12 to form a coating film, and this coating film is burned at the highest temperature of 500 to 850° C. for several tens of seconds to several tens of minutes, whereby the base collector electrode 32 is formed.

In addition, as described above, when the conductive paste containing aluminum is used, the high-concentration doped layer 16 and the base collector electrode 32 can be formed at the same time.

Then, the first extracting electrode 26, the collector electrode 34, the connector electrode 36, and the second extracting electrode 38 are formed on the second surface 12b side of the semiconductor substrate 12.

These electrodes can be formed by the application method. More specifically, a conductive paste provided by adding 10 to 30 parts by weight of organic vehicle and 0.1 to 10 parts by weight of glass frit, to 100 parts by weight of metal powder such as silver or the like is applied with a predetermined pattern to form a coating film. Then, this coating film is burned at the highest temperature of 500 to 850° C. for several tens of seconds to several tens of minutes, whereby the first extracting electrode 26, the collector electrode 34, the connector electrode 36 and the second extracting electrode 38 are formed.

At this time, the part formed into a configuration having the plurality of fine line parts 34a along the edge of the base collector electrode 32 serves as the collector electrode 34, the part formed to be in contact with the collector electrode 34 along the edge of the base collector electrode 32 serves as the second extracting electrode 38, the part formed along the space 33 serves as the first extracting electrode 26, and the part connecting the collector electrodes 34 adjacent to each other across the space 33, or connecting the collector electrode 34 to the second extracting electrode 38 serves as the connector electrode 36.

As a matter of course, the first extracting electrode 26, the collector electrode 34, the connector electrode 36, and the second extracting electrode 38 may be formed in separate steps, and also, may be formed of different conductive pastes.

In addition, when the passivation layer is formed on the non-light-receiving surface side, a silicon oxide film (SiO2 film), titanium oxide film (TiO2), or a silicon nitride film (SiNx) or the like is formed to be 10 nm to 50 µm in thickness by the sputtering method, evaporation method, or CVD method or the like. In addition, the semiconductor substrate 12 may be subjected to a heat treatment in a thermal oxidation furnace in an oxygen atmosphere or air atmosphere, or an oxide film (insulation material layer) may be formed by applying and burning an oxide film material by an application method such as a spin coat method, spray method, or screen printing method or the like.

Regarding the solar cell element 10 configured as described above, the adjacent collector electrodes 34 across the space 33 provided between the base collector electrodes 32 are electrically connected by the connector electrode 36, and the second extracting electrode 38 is in contact with at least one of the collector electrodes 34 electrically connected by the connector electrode 36, so that the outputs from the adjacent collector electrodes 34 are unified by the connector electrode 36, and extracted through the second extracting electrode 38. According to this embodiment, the outputs from the collector electrodes 34 arranged in two rows can be extracted by the second extracting electrodes 38 arranged in one row. Therefore, the number of the second extracting electrodes 38 of the solar cell element 10 can be easily adjusted so as to be smaller than the number or arrangement number of the collector electrodes 34. As a result for example, when the plurality of solar cell elements 10 are mutually connected, the number of the first extracting electrodes 26 can be the same as the number of the second extracting electrode 38 having the polarity different from that of the first extracting electrode 26. Thus for example, when the plurality of solar cell elements 10 are connected as will be described below, the first extracting electrode 26 and the second extracting electrode 38 can be connected one-on-one without generating an extra electrode which is connected nowhere, or without separately connecting the extra electrode to the outside or the like, so that wasting of the generated power can be easily reduced and the connection operation is facilitated.

In addition, since the light-receiving surface electrode 22 provided on the first surface 12a of the semiconductor substrate 12 is connected to the first extracting electrode 26 through the conduction part 24, both electrodes can be extracted from the second surface 12b of the semiconductor substrate 12. Thus, when the plurality of solar cell elements 10 are mutually connected, the connection is performed on the second surface 12b side, so that the mutual connection can be easily performed.

In addition, the collector electrode 34 and the connector electrode 36 are formed as the same layer, these can be easily formed while reducing a production step from being increased due to the formation of the connector electrode 36.

In addition, since the collector electrodes 34 electrically connected through the connector electrodes 36 sandwich the first extracting electrodes 26 and the seconds extracting electrode 38, and they are provided along the edges of the base collector electrodes 32, the heat applied to the first extracting electrode 26 and the second extracting electrode 38 in soldering or the like the external wiring can be easily radiated to the outside through the collector electrodes 34. That is, heat conductivity of the collector electrode 34 formed of silver or aluminum or the like is superior to heat conductivity of the semiconductor substrate 12, and especially the collector electrode 34 formed of silver is superior in heat conductivity. Therefore, as the collector electrode 34 is provided so as to sandwich the first extracting electrode 26 and the second extracting electrode 38, the heat is efficiently radiated outward from the collector electrode 34 provided on both sides. Especially, since the collector electrode 34 has the plurality of fine line parts 34a, its surface area is large and the heat is easily radiated. Therefore, the heat applied to the first extracting electrode 26 and the second extracting electrode 38 at the time of soldering or the like is efficiently radiated outward through the collector electrode 34, and heat stress can be released in the first extracting electrode 26 and the second extracting electrode 38, and in their peripheral parts.

In addition, since the connector electrode 36 is provided so as to pass through the space between the divided first extracting electrodes 26, it can electrically connect the collector electrodes 34 even in the middle of the α direction. Especially, as the plurality of connector electrodes 36 are provided between the adjacent first extracting electrodes 26, a current intensively flowing in the one connector electrode 36 is reduced.

Figure 12:
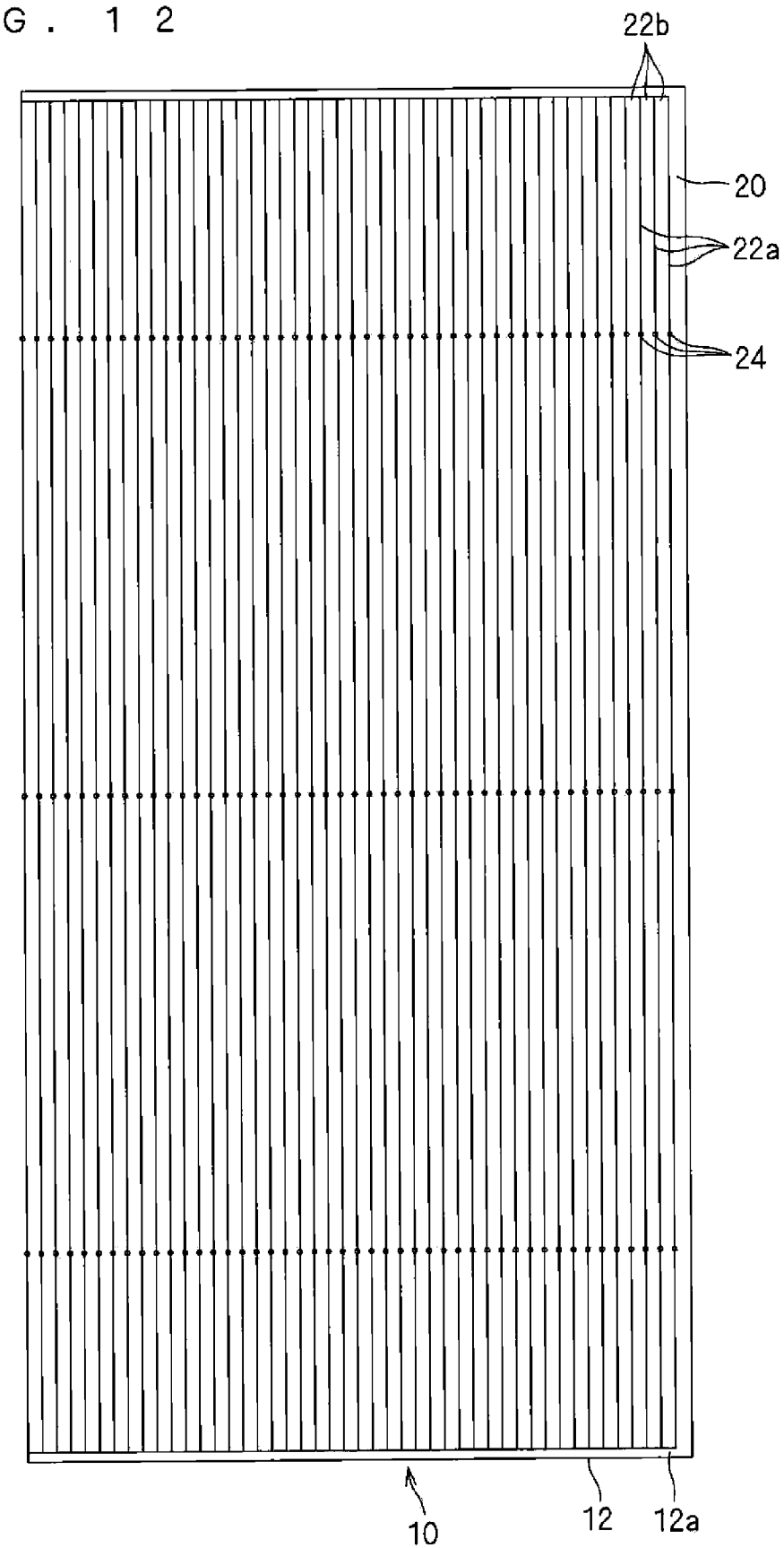
FIG. 12 is a front view showing one split part when the solar cell element is split.
Figure 13:
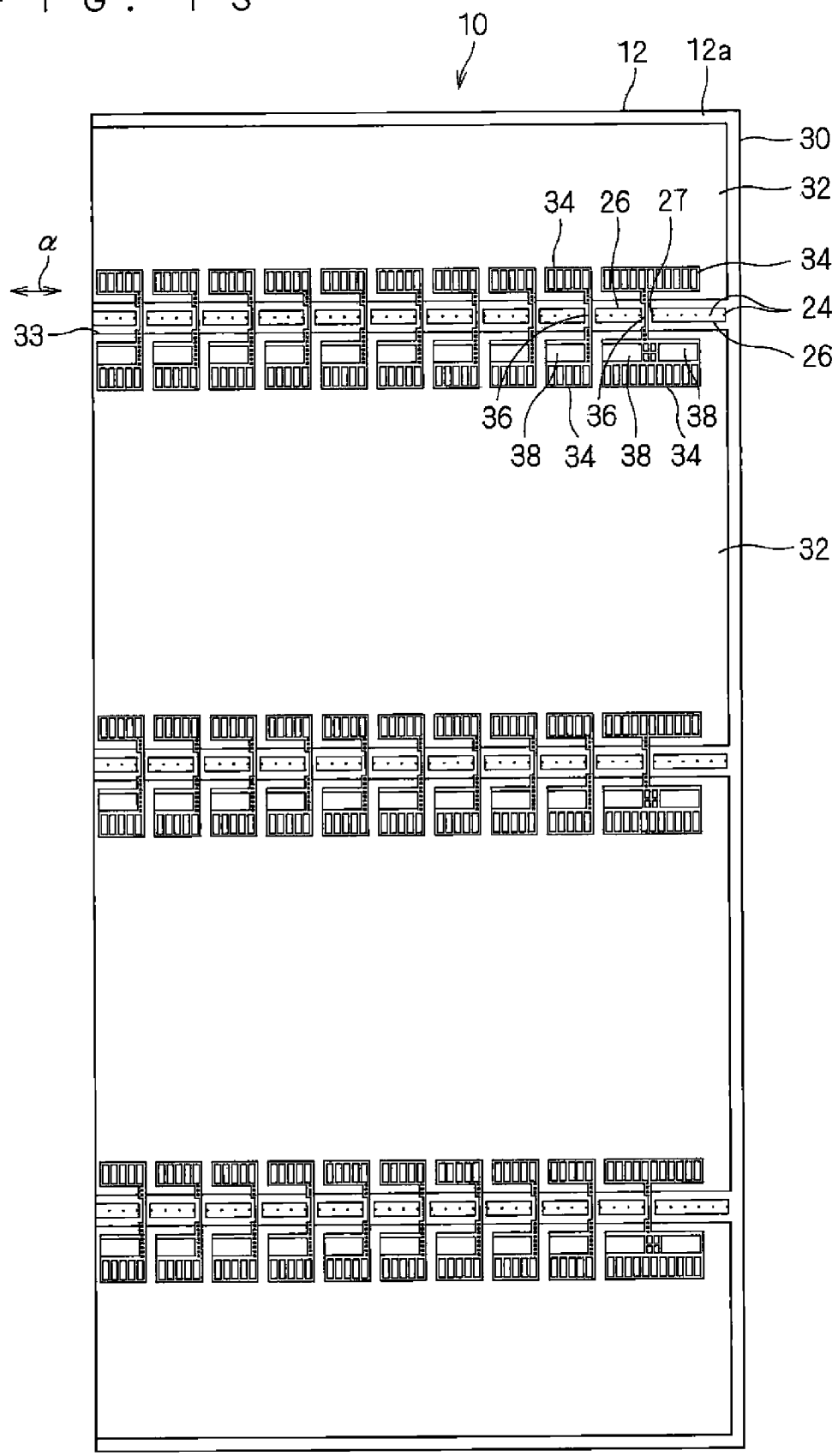
FIG. 13 is a back view showing the one split part when the solar cell element is split.

The above configuration is also effective when the solar cell element 10 is divided and used. For example, referring to FIGS. 12 and 13, the solar cell element 10 is divided in a direction approximately perpendicular to the space 33 along a straight line passing through the space between the first extracting electrodes 26, between the collector electrodes 34, and between the second extracting electrodes 38. In this case, even in the middle of the α direction, the collector electrodes 34 are electrically connected through the connector electrode 36, so that the state in which the collector electrodes 34 are electrically connected through the connector electrode 36 can be maintained in each divided part.

In addition, the first extracting electrodes 26 and the collector electrodes 34 are divided in approximately the same position along the α direction, so that the thickness of the solar cell element 10 can be approximately uniform on the straight line passing through the divided parts. Therefore for example, the solar cell element 10 can be divided by exposing the straight line to laser light without performing focus adjustment of the laser light. Thus, the solar cell element 10 can be easily divided.

Figure 14:
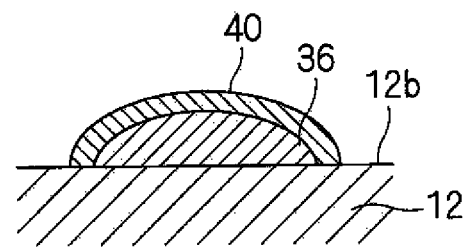
FIG. 14 is an explanatory view showing a state in which an insulation layer is formed on a surface of the connector electrode.
Figure 15:
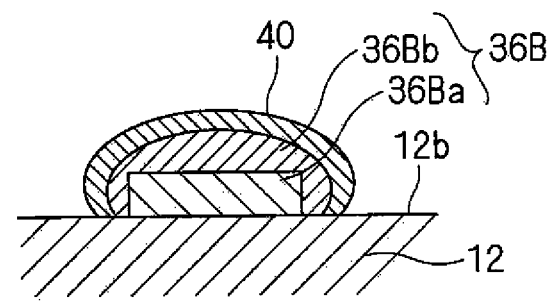
FIG. 15 is an explanatory view showing a state according to another example in which an insulation layer is formed on a surface of the connector electrode.
Figure 16:
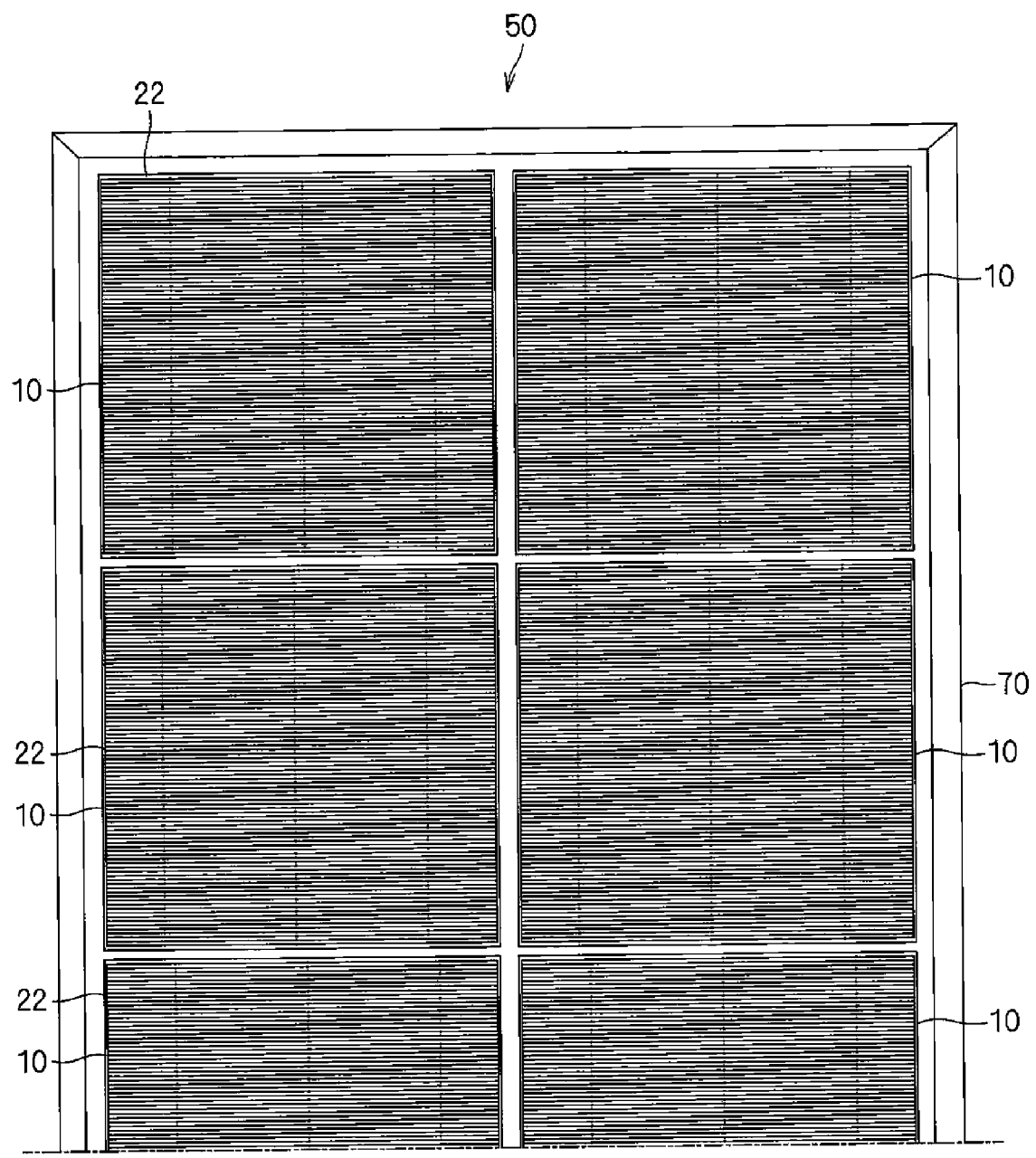
FIG. 16 is a front view of an upper half part of a solar cell module.
Figure 17:
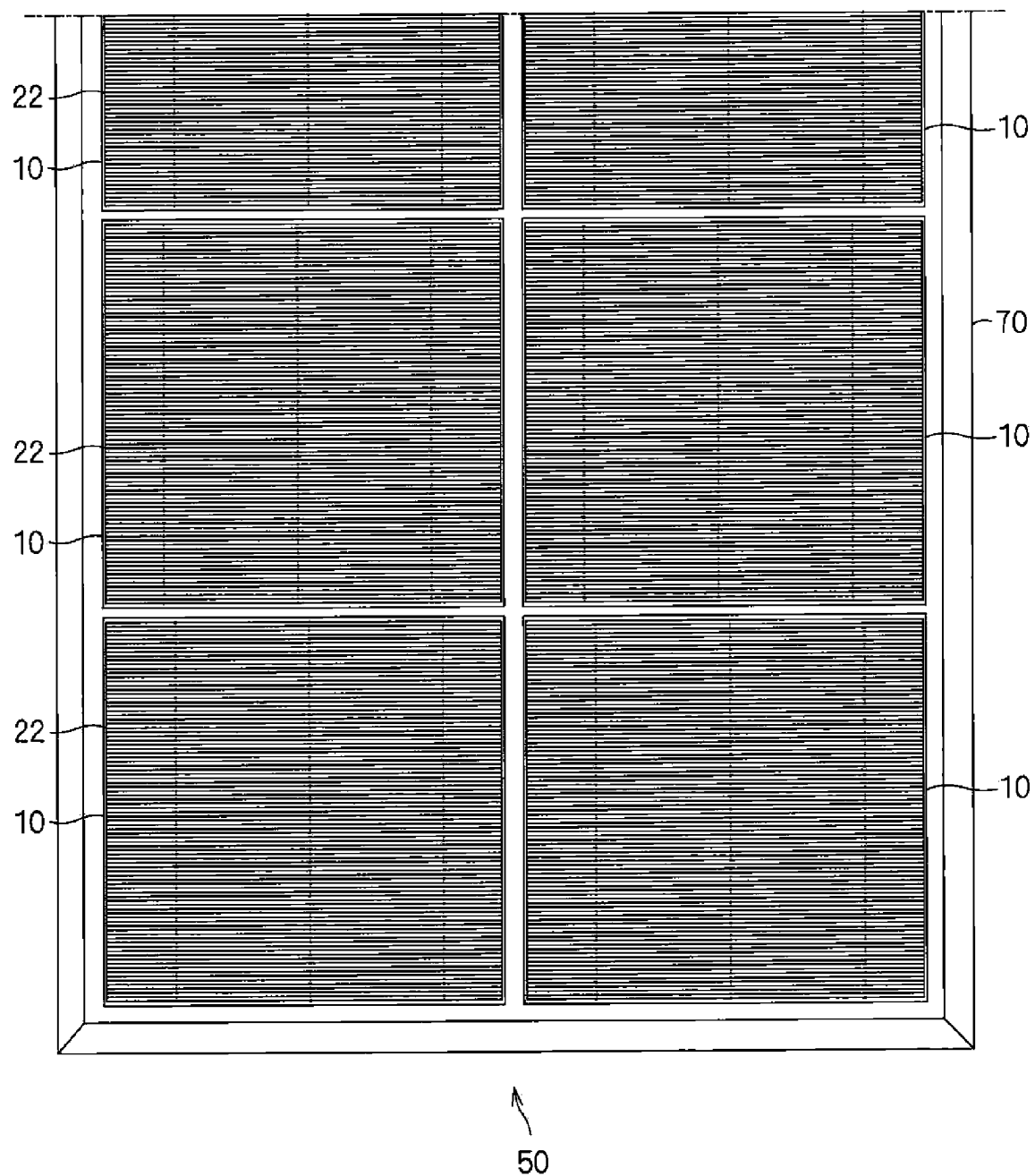
FIG. 17 is a front view of a lower half part of the solar cell module.
Figure 18:
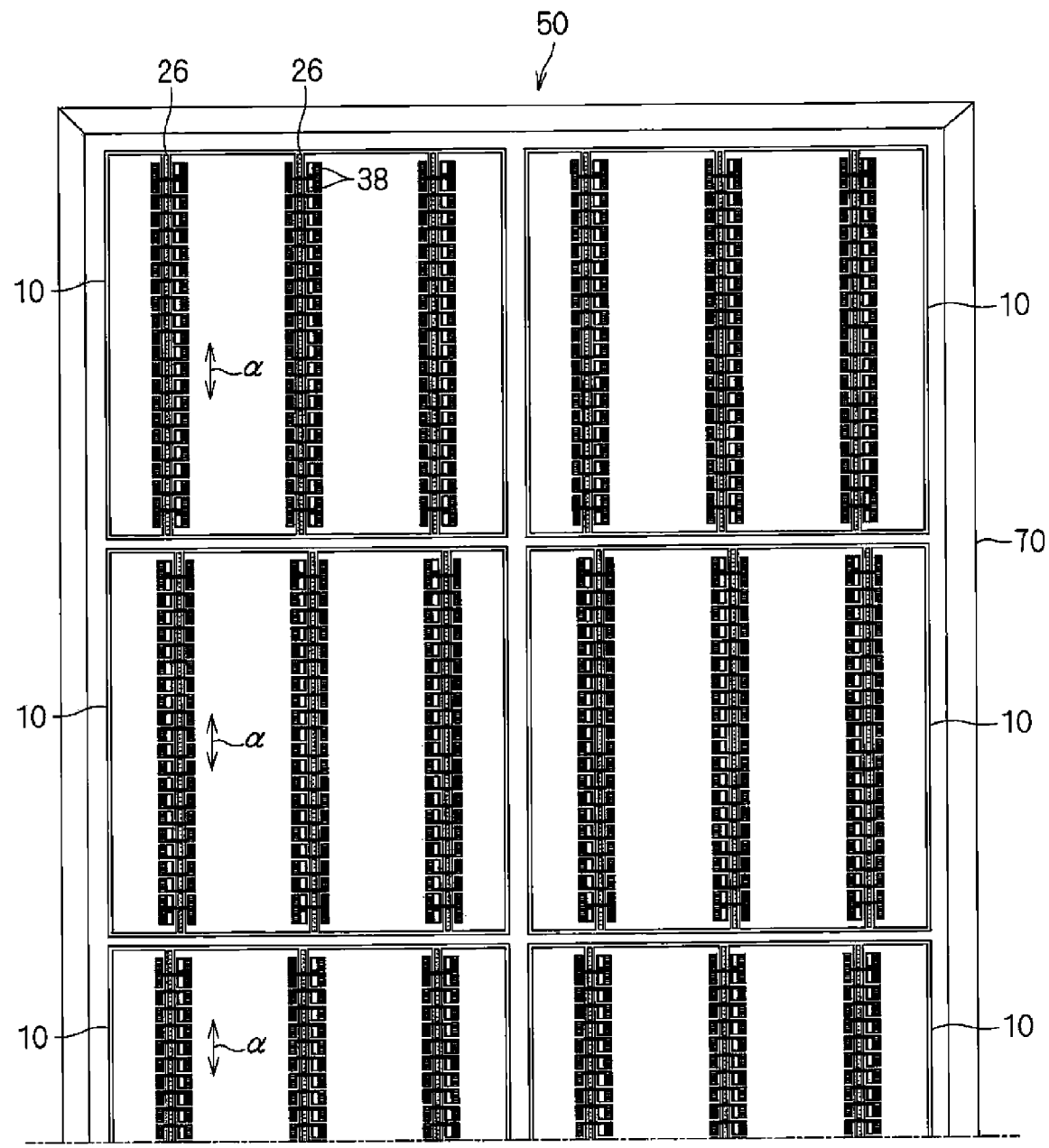
FIG. 18 is a back view of the upper half part of the solar cell module.

In addition, as shown in FIGS. 14 and 15, an insulation layer 40 is formed on the surface of the connector electrode 36 of the solar cell element 10. An external wiring 60 is connected to the first extracting electrodes 26 across the insulation film 40. In addition, the term "across" the insulation film 40 means that it is arranged over the insulation film 40, so that it may be directly in contact with the insulation film 40 or may be separated from the insulation layer 40. The insulation layer 40 is preferably formed of a material which is not likely to sink in the connector electrodes 36 and 36B. Thus, the insulation layer 40 can be likely to be uniform in thickness, and the insulation layer 40 is formed without leaving an unformed part.

For example, referring to FIG. 14, the insulation layer 40 is formed on the surface of the connector electrode 36 formed of silver. Thus, in forming the connector electrode 36, only a single material is to be applied, so that alignment of the layers or the like is not needed, and production is easy.

In addition, as shown in FIG. 15, a connector electrode 36B may comprise a center part 36Ba and a coverage part 36Bb which covers the center part 36Ba and having a cavity rate smaller than that of the center part 36Ba. Here, the "cavity rate" regarding the center part 36Ba and the coverage part 36Bb of the connector electrode 36B is a rate of a void part volume with respect to a whole volume of the target electrode film, and more specifically, it can be calculated as follows. That is, a cross-sectional part of the part containing the electrode part of the solar cell element is observed with an electron microscope or the like, and a whole area of the electrode film and an area of the void part are found from it. Thus, the cavity rate is calculated by the following formula;

Cavity rate (%)={(area of void part)÷(whole area of electrode film)}×100.

The center part 36Ba may be formed of for example silver, or aluminum by the screen printing method, and the coverage part 36Bb may be formed of for example silver, nickel, or aluminum by vapor deposition. Especially, when the center part 36Ba is formed of a material mainly composed of aluminum by the screen printing method, the coverage part 36Bb is formed of a material mainly composed of silver, so that ohmic contact between the center part 36Ba and the coverage part 36Bb can be preferably provided, and photoelectric conversion efficiency can be improved.

In addition, the insulation film 40 is formed of for example a polyimide resin, polyurethane resin, or epoxy resin or the like. The insulation layer 40 is formed for example by applying a polyimide-series resin or polyurethane-series resin onto the surface of the connector electrode 36, 36B by screen printing, and hardening it at 250 to 400° C. in the air atmosphere for 15 to 60 minutes. In this case, the connector electrode 36, 36B may be formed of a single material such as aluminum or silver or the like, or may be formed of combined materials. In addition, a burning condition of the connector electrode 36, 36B may be the same as that of the base collector electrode 32 or the collector electrode 34.

<Solar Cell Module>

Figure 20:
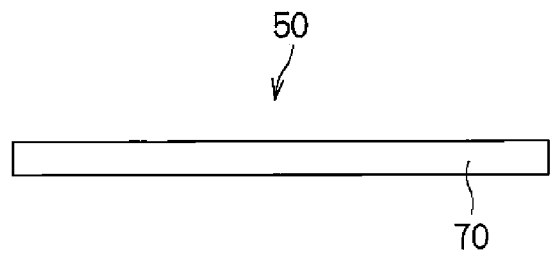
FIG. 20 is a plan view of the solar cell module.
Figure 21:
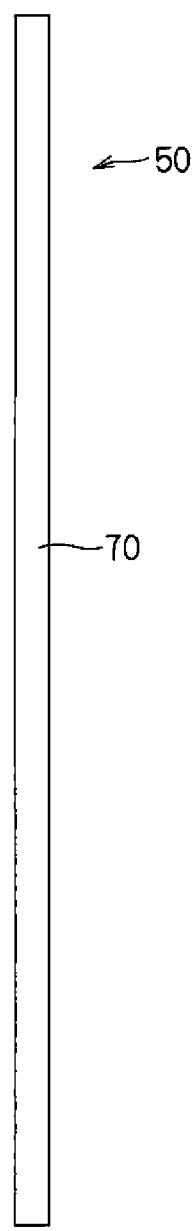
FIG. 21 is a left side view of the solar cell module.
Figure 22:
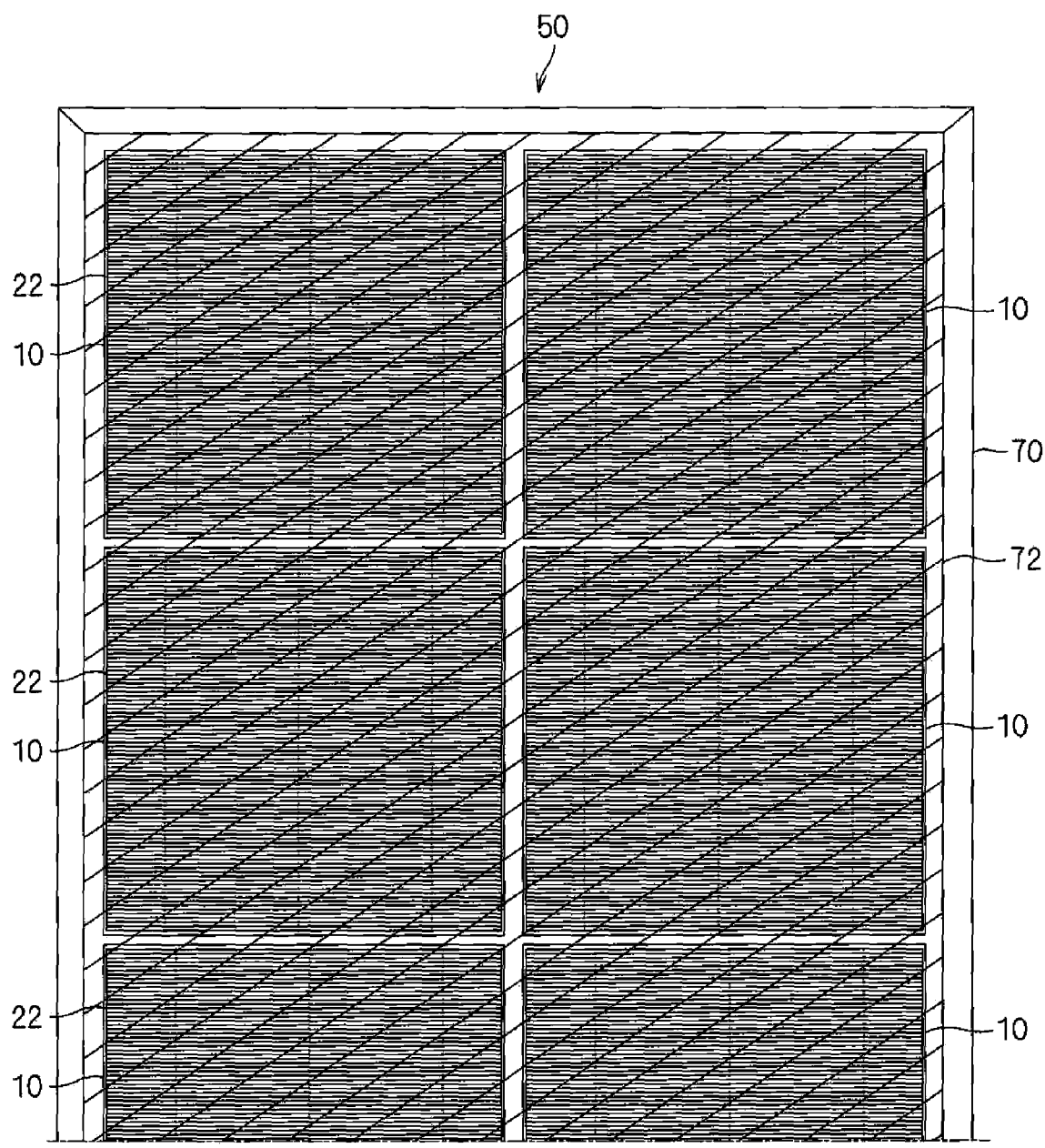
Figure 24:
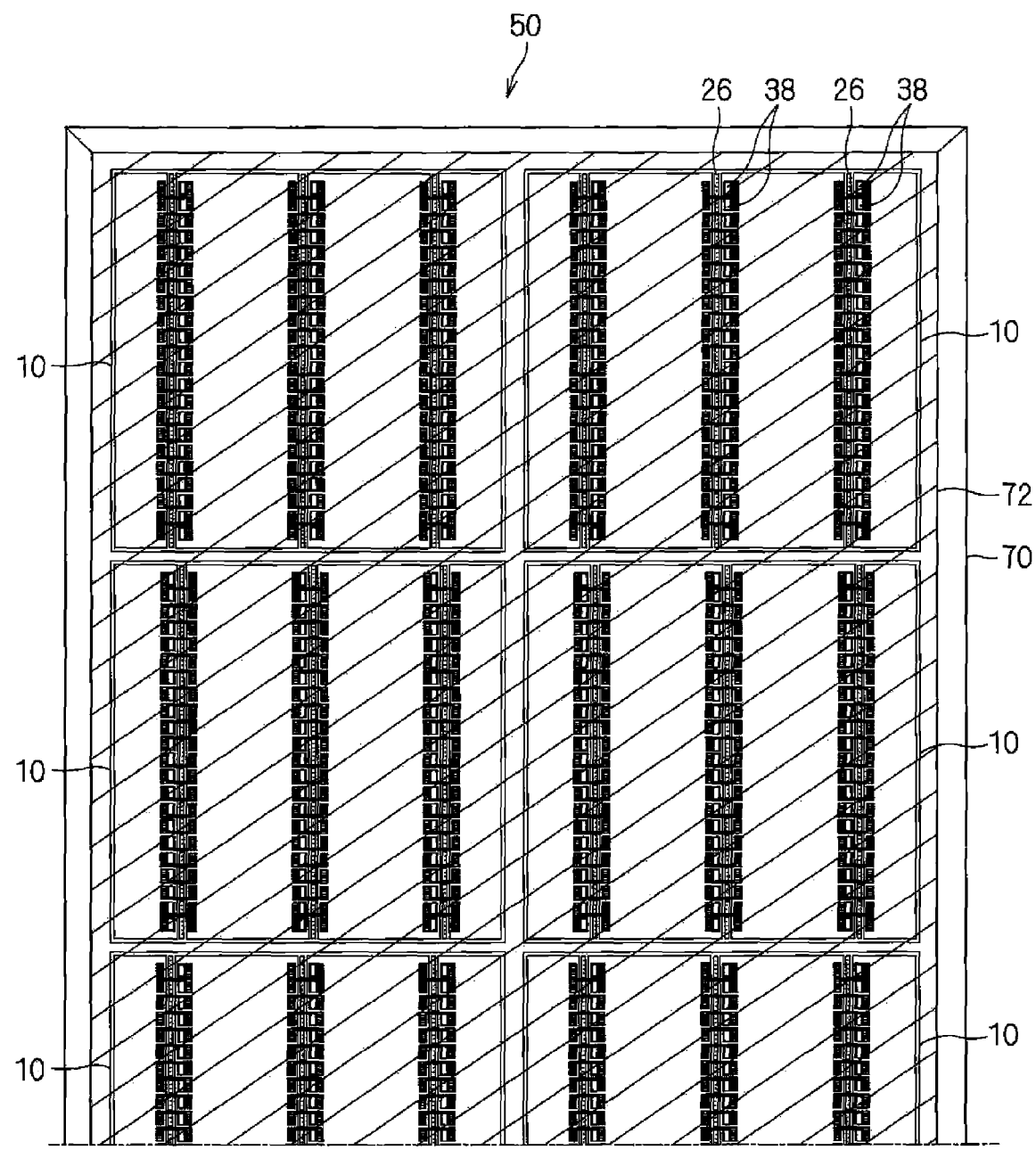
FIG. 24 is a view showing a see-through part in FIG. 18.
Figure 25:
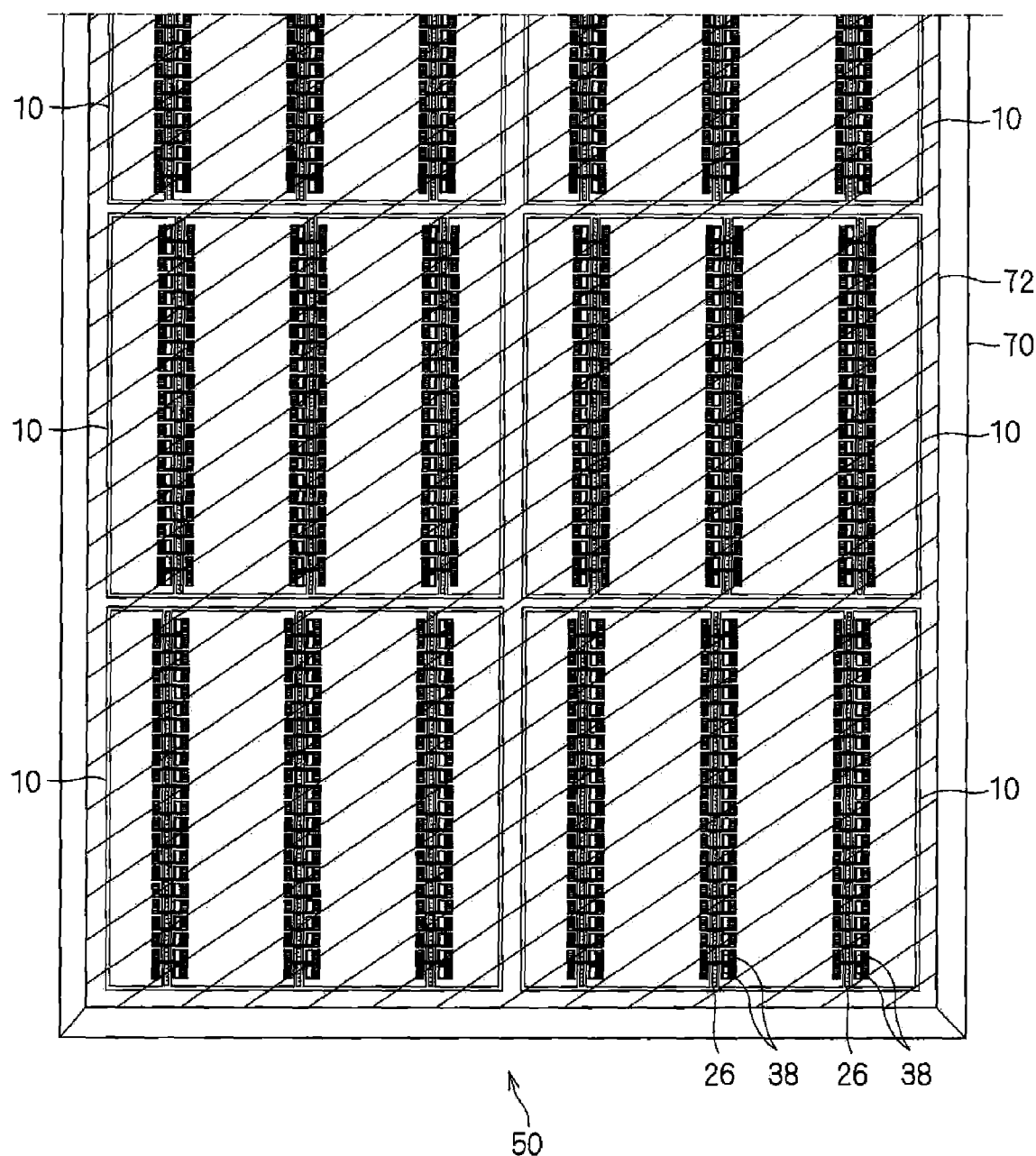
FIG. 25 is a view showing a see-through part in FIG. 19.

A description will be made of a solar cell module 50 comprising the above solar cell elements 10. In addition, while FIGS. 20 and 21 are shown on a scale different from that in FIGS. 16 to 19, actual outer length dimension is the same.

Figure 26:
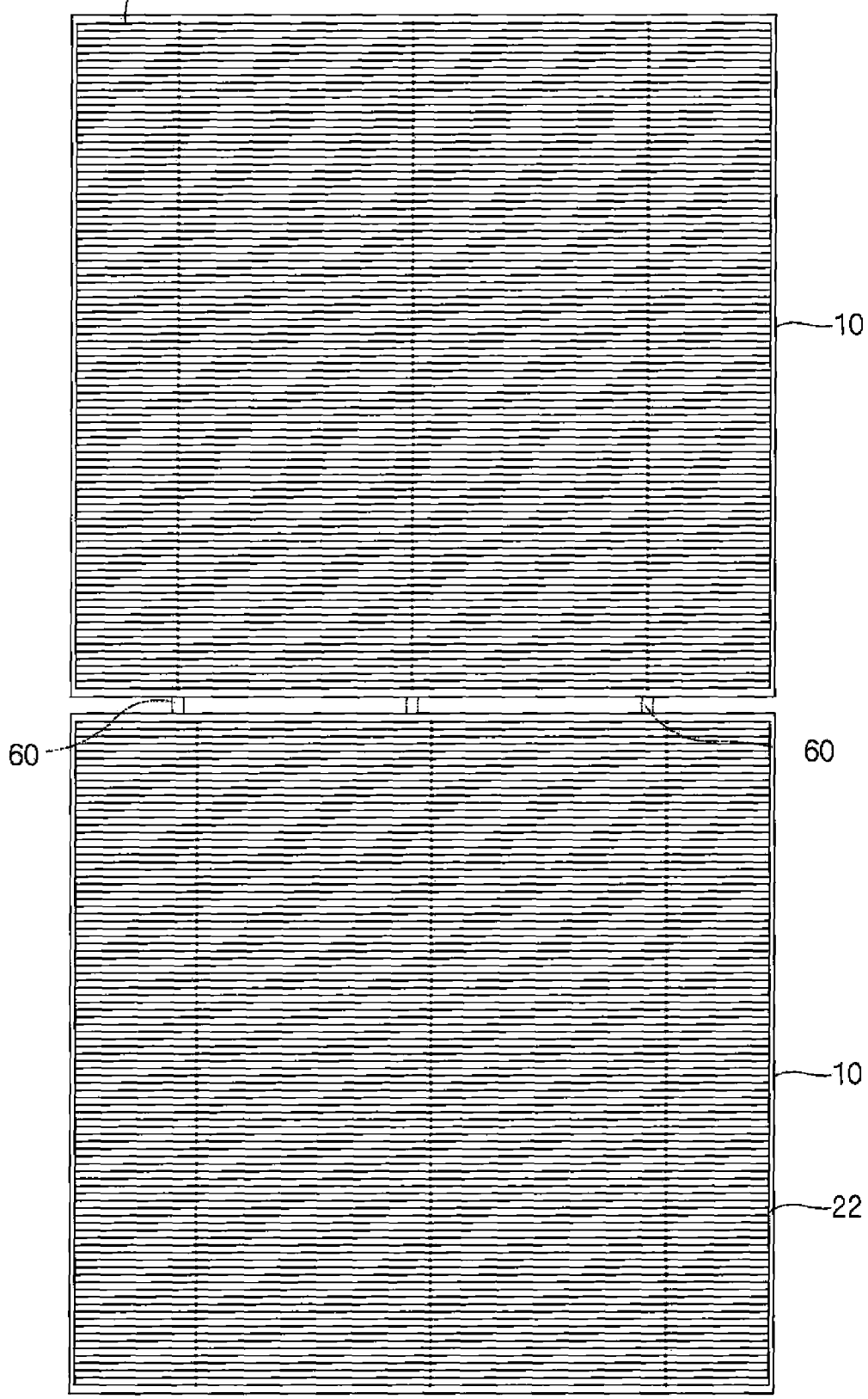
FIG. 26 is an enlarged front view showing the two connected solar cell element parts.
Figure 27:
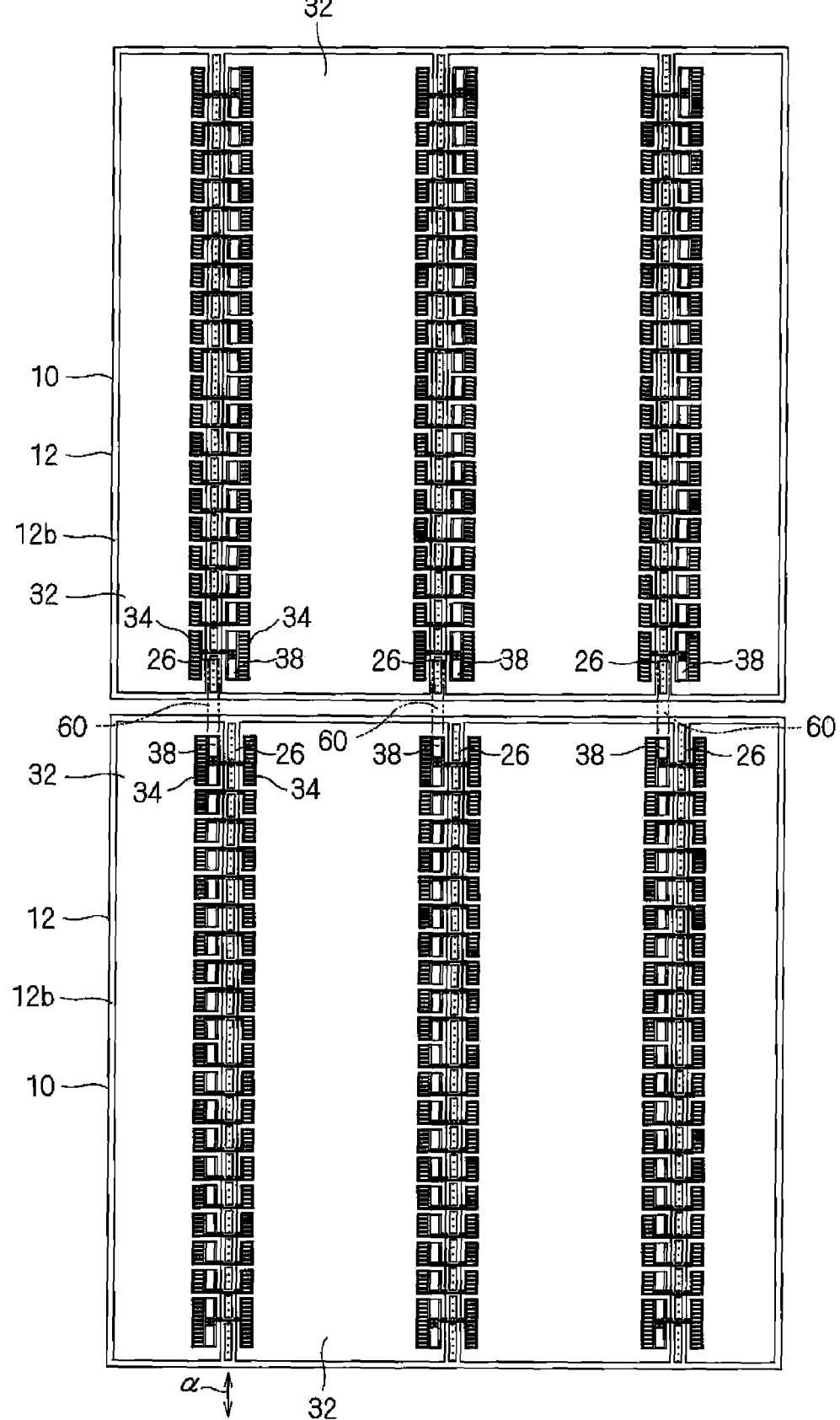
FIG. 27 is an enlarged back view showing the two connected solar cell element parts.
Figure 28:
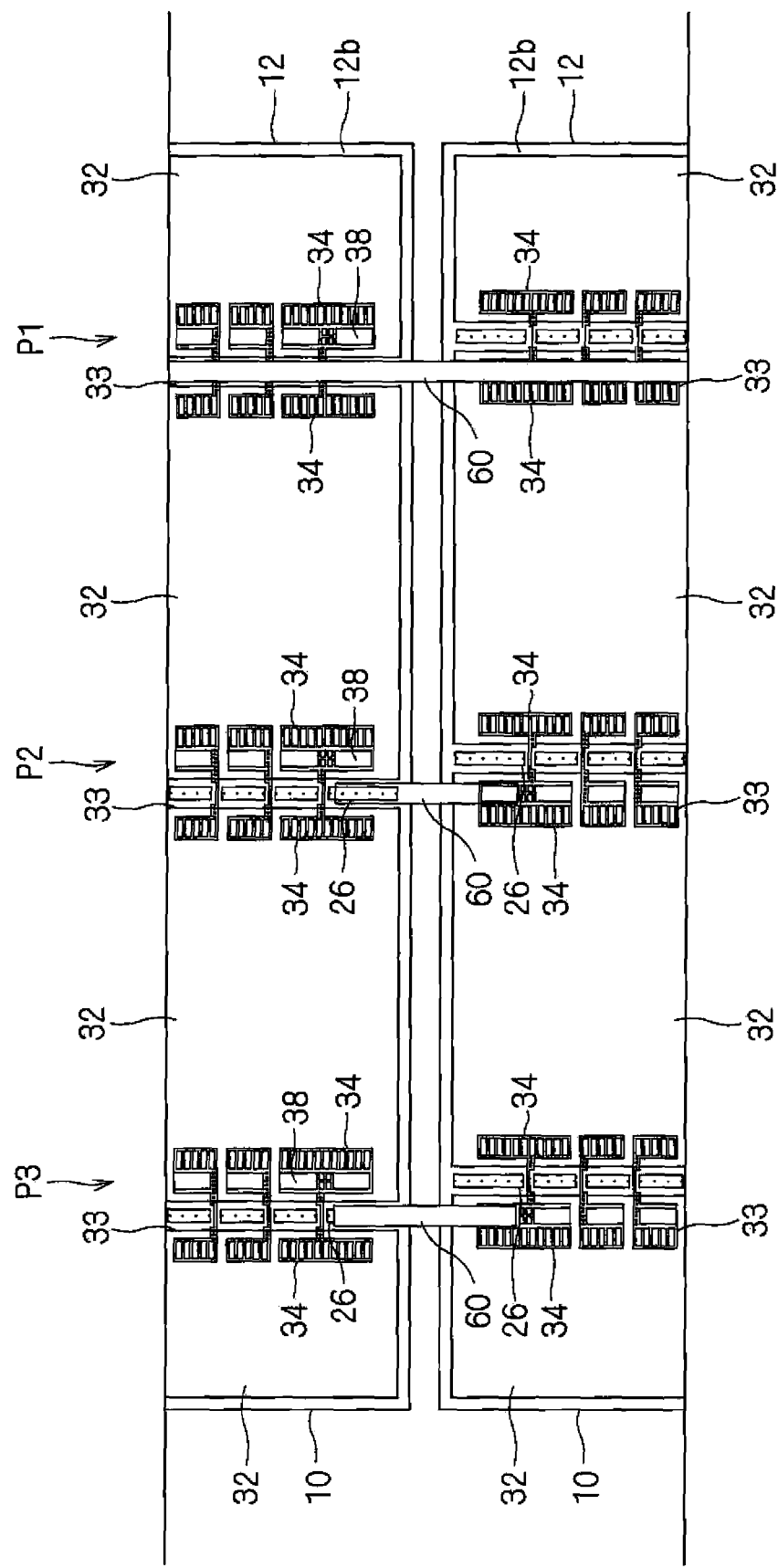
FIG. 28 is an explanatory view showing a connection part of the two solar cell elements.
Figure 29:
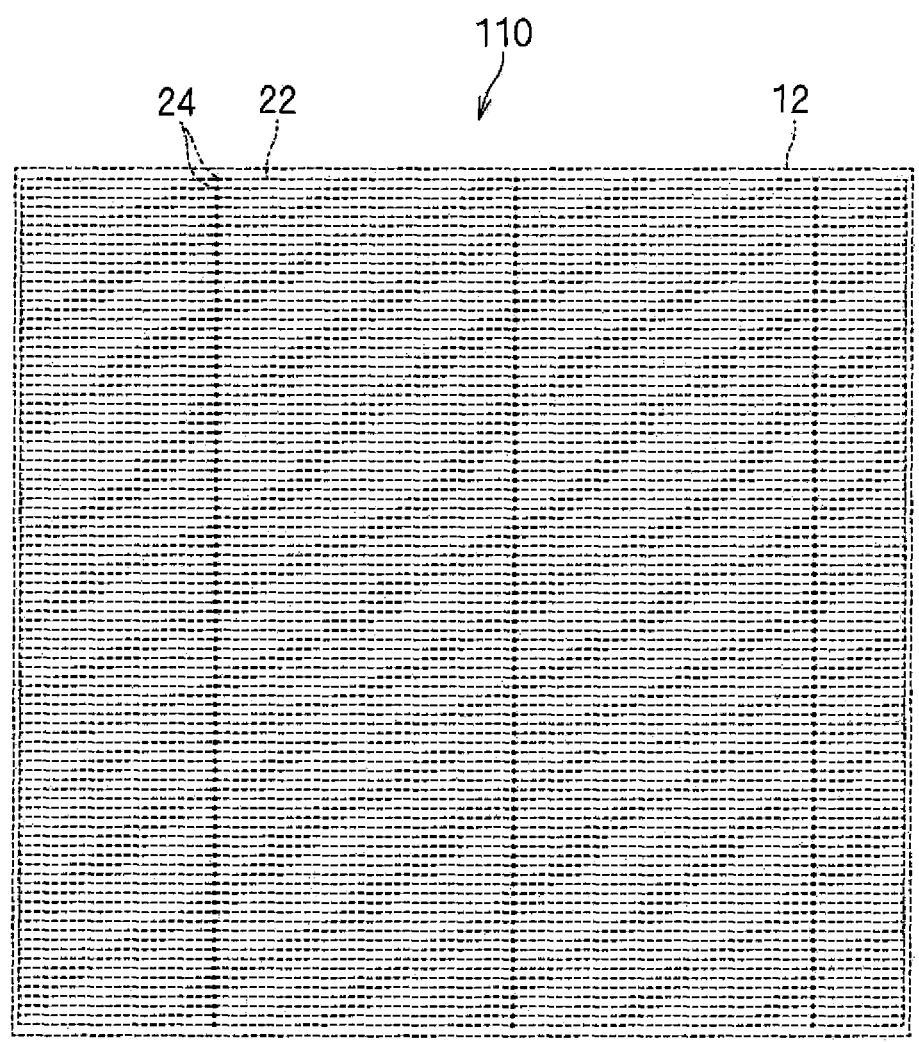
FIG. 29 is a front view of a solar cell element according to a second embodiment.
Figure 30:
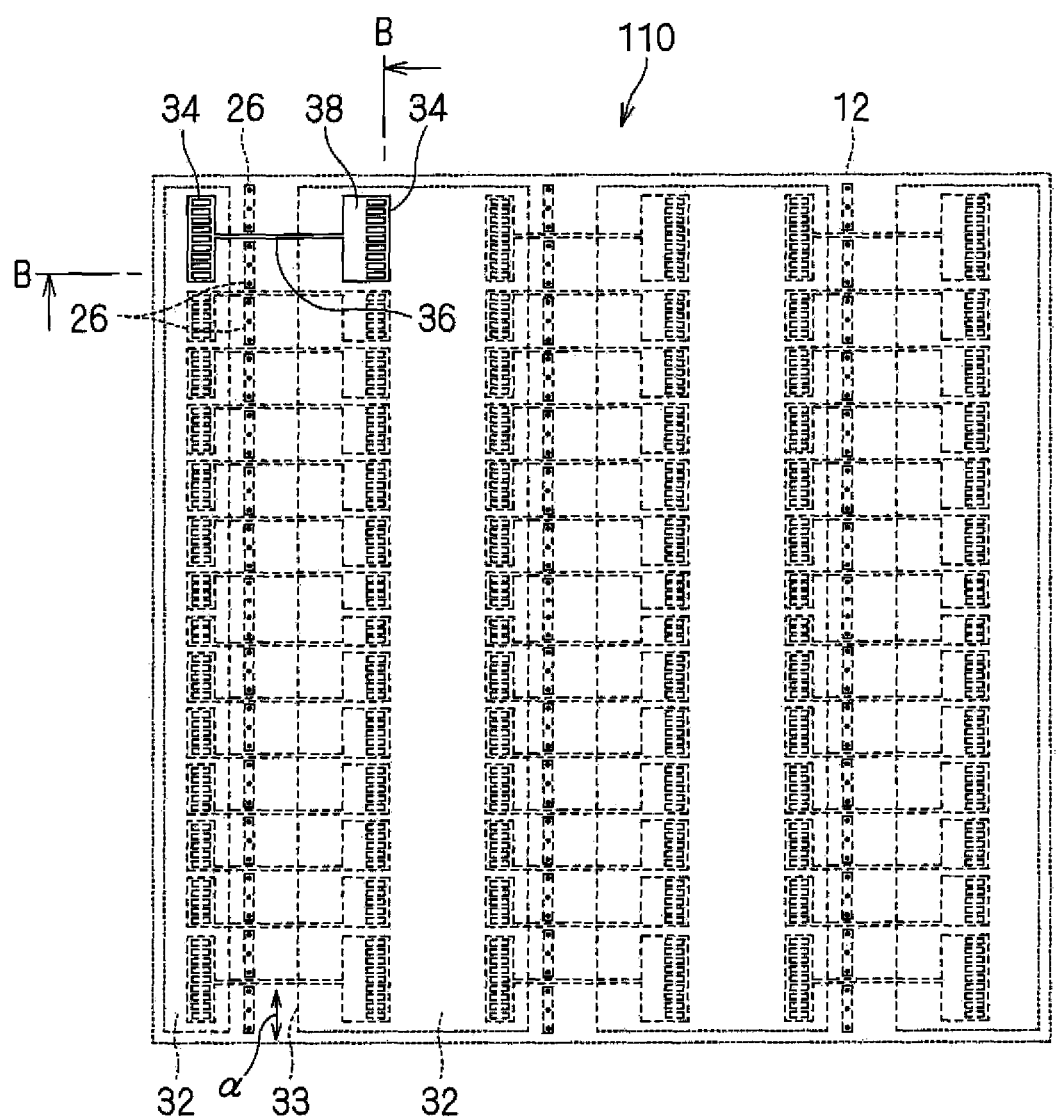
FIG. 30 is a back view of the above solar cell element.
Figure 33:
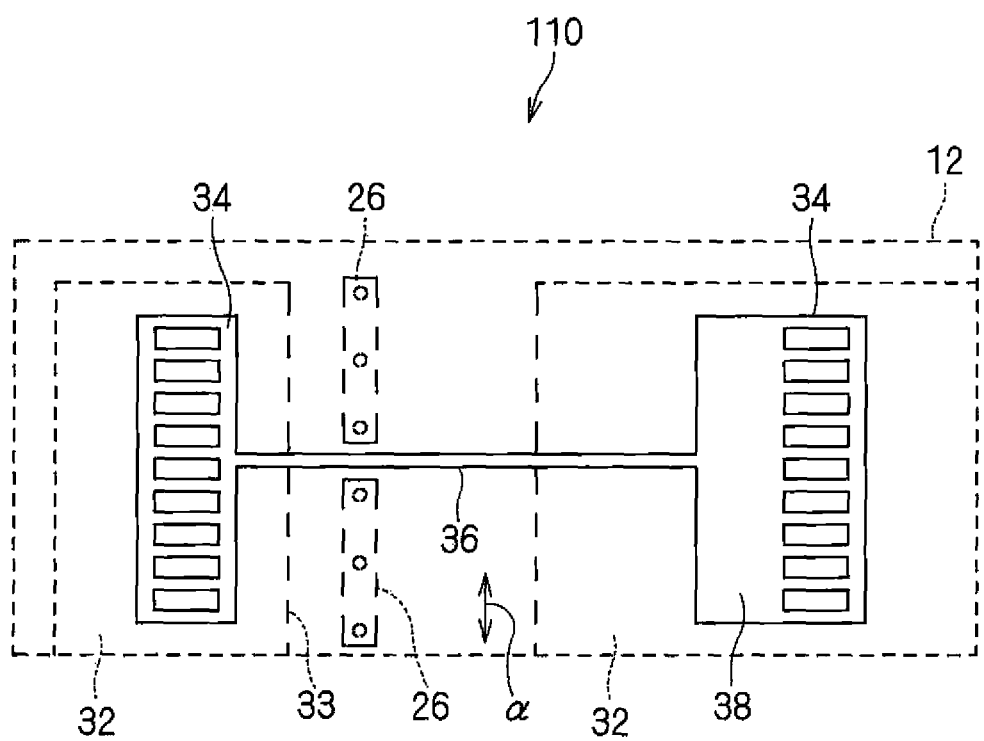
FIG. 33 is an enlarged view of a part B-B in FIG. 30.
Figure 35:
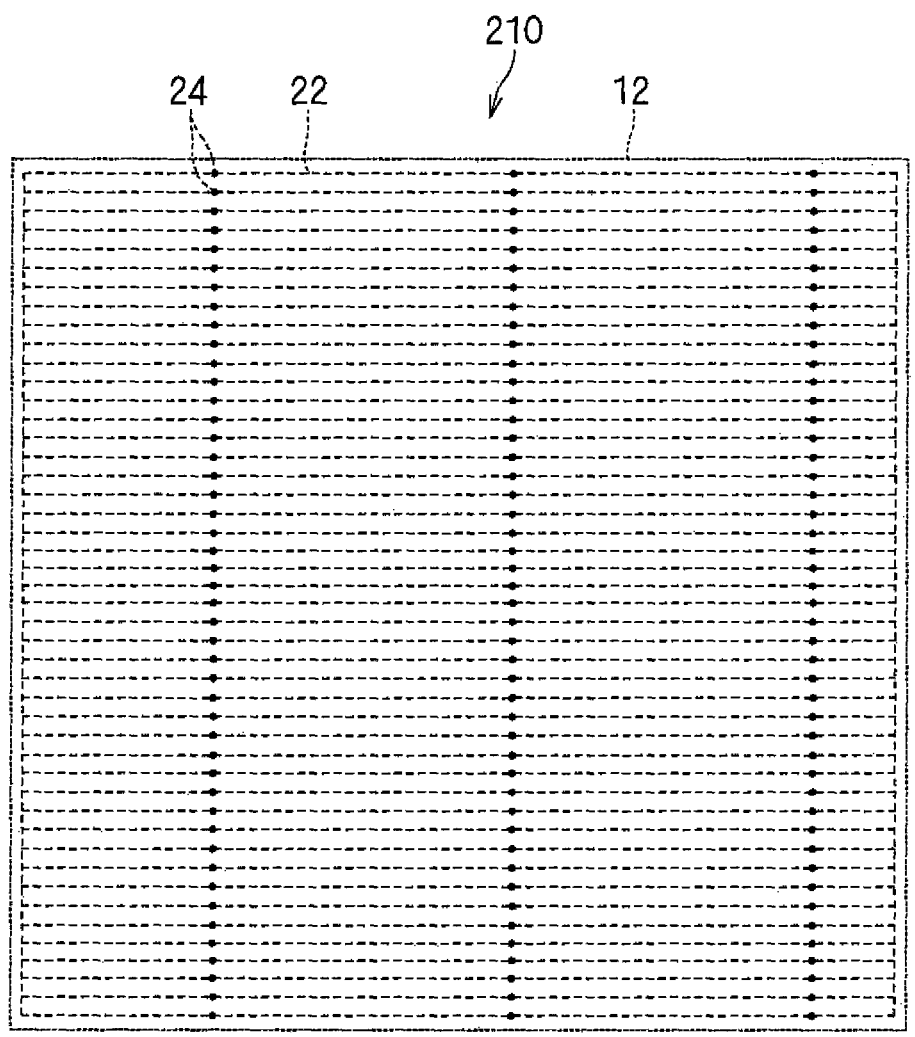
FIG. 35 is a front view of a solar cell element according to a third embodiment.
Figure 36:
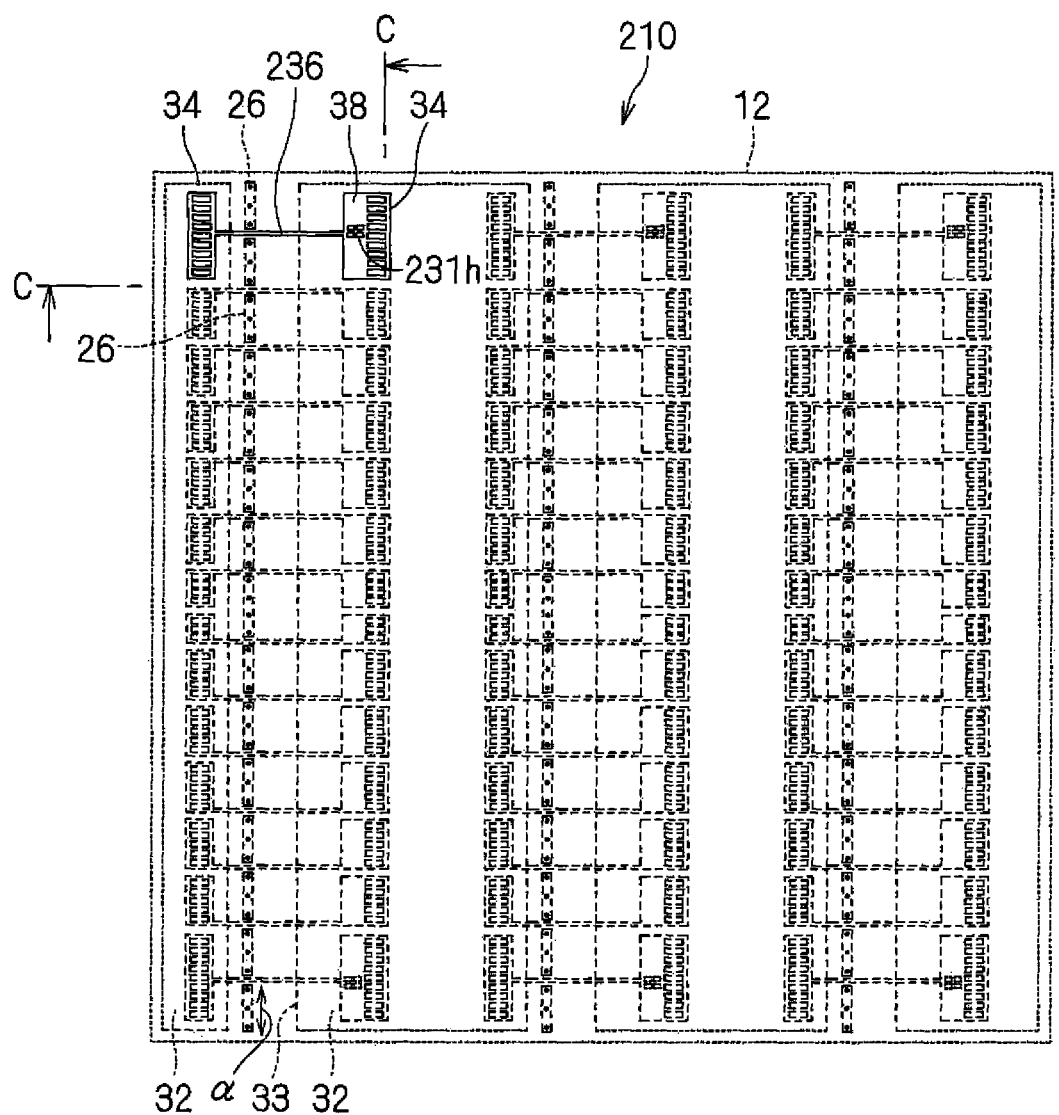
FIG. 36 is a back view of the above solar cell element.
Figure 39:
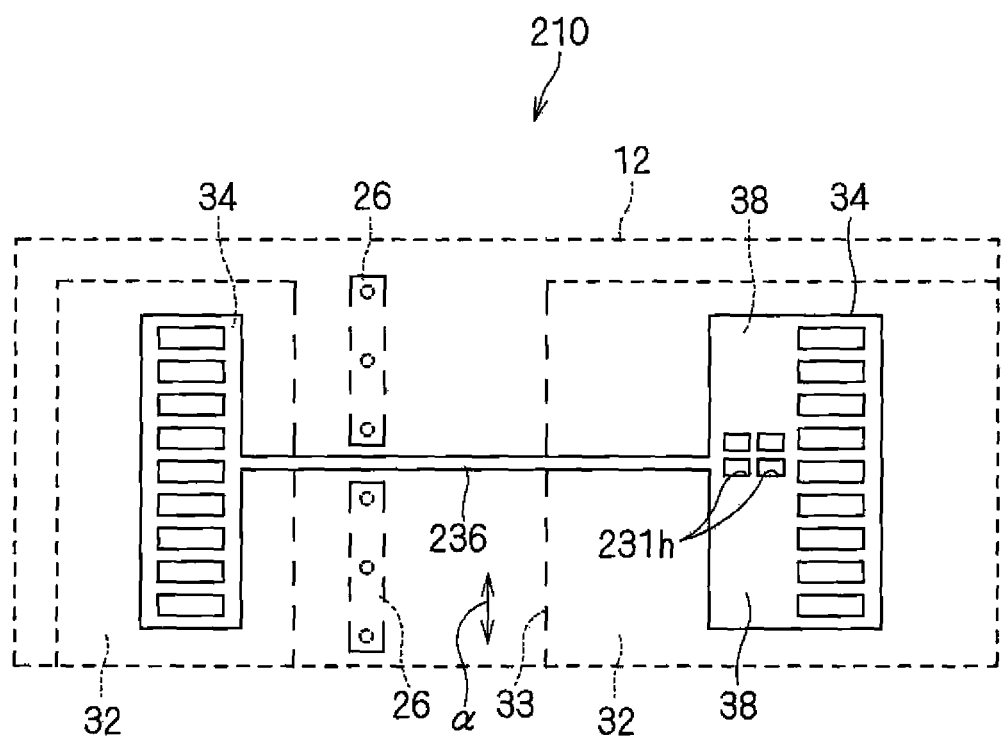
FIG. 39 is an enlarged view of a part C-C in FIG. 36.
Figure 40:
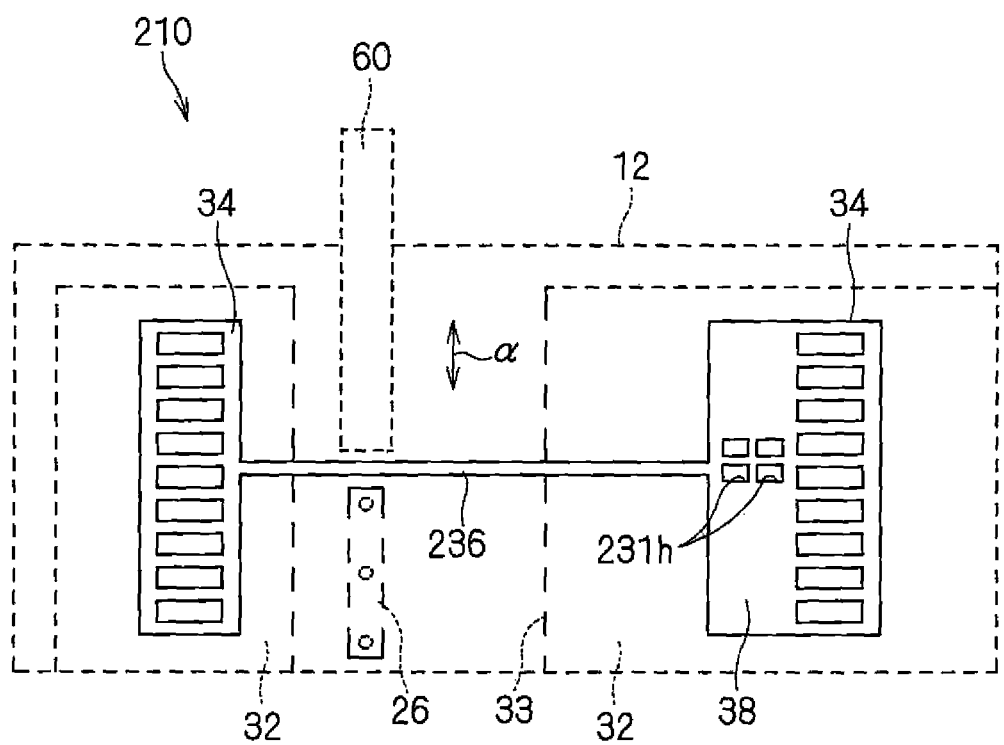
FIG. 40 is a view showing a state in which an external wiring is connected in FIG. 39.
Figure 41:
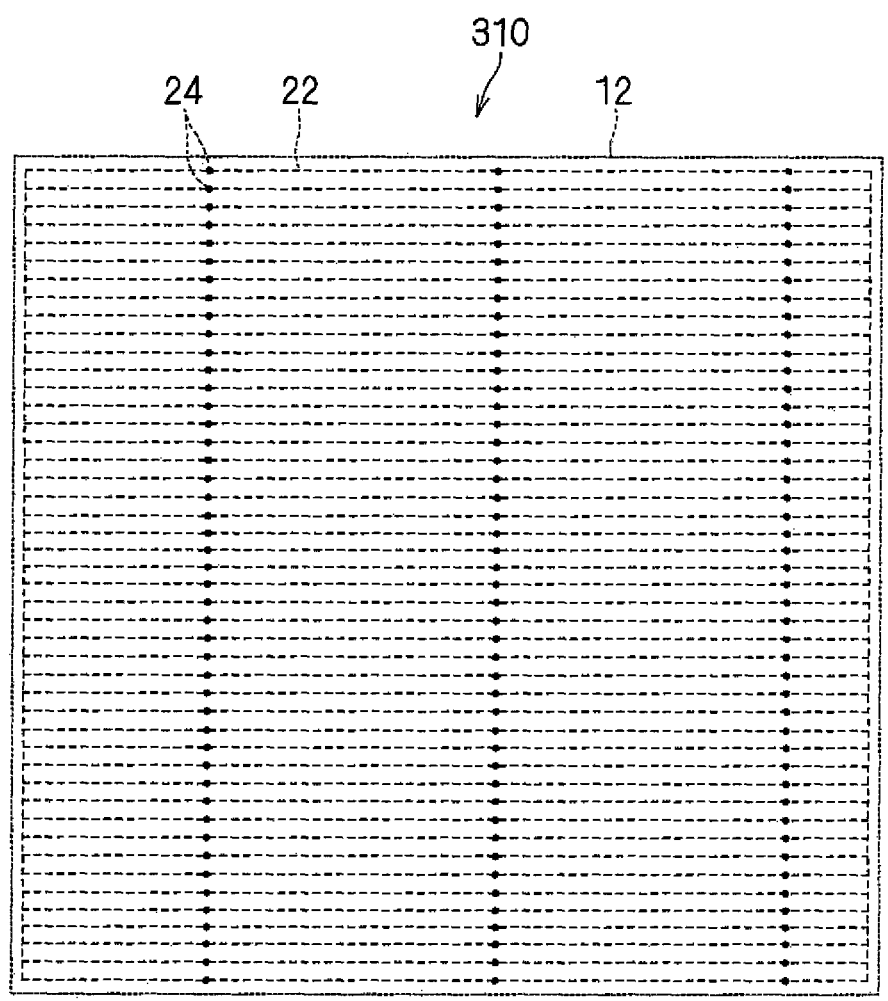
FIG. 41 is a front view of a solar cell element according to a fourth embodiment.
Figure 42:
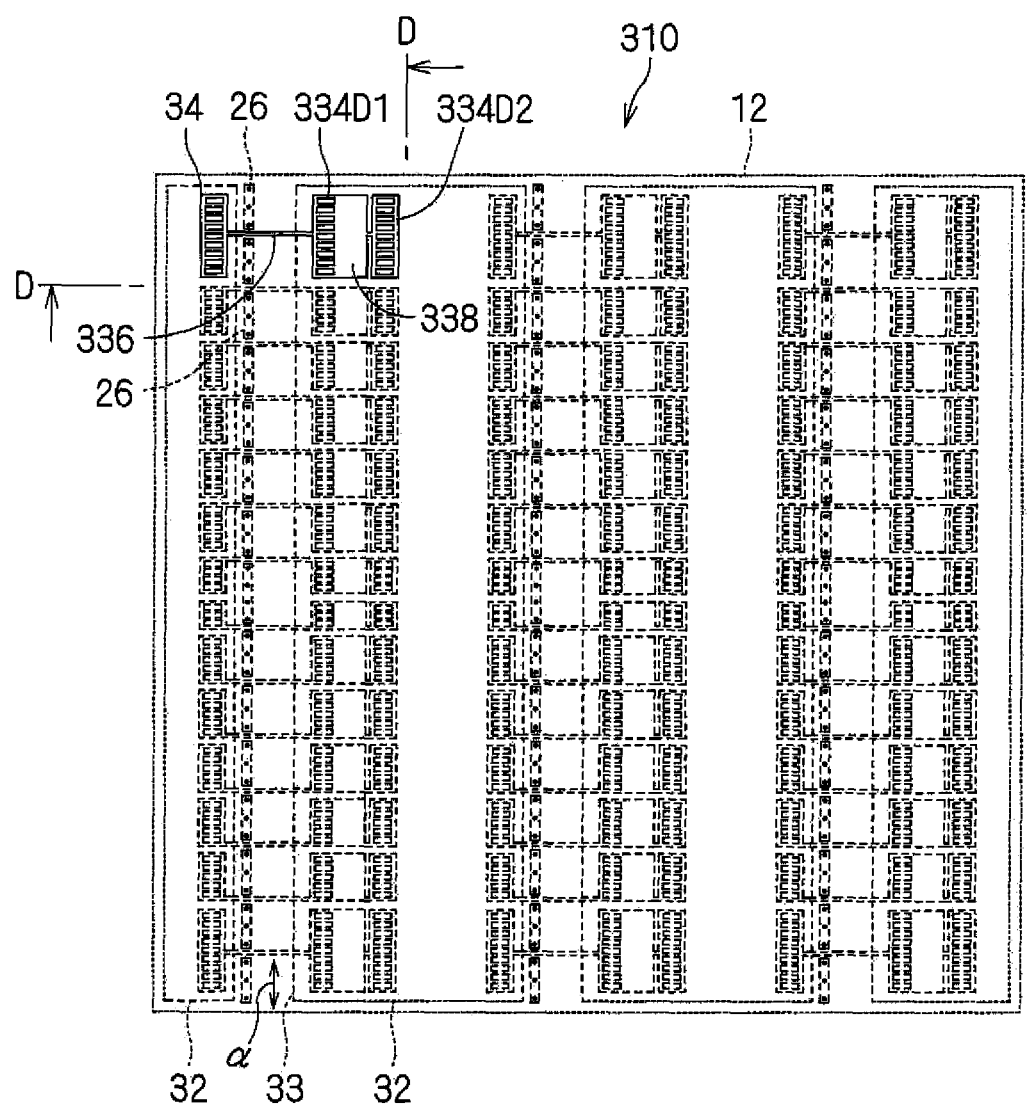
FIG. 42 is a back view of the above solar cell element.
Figure 43:
FIG. 43 is a plan view of the above solar cell element.
Figure 45:
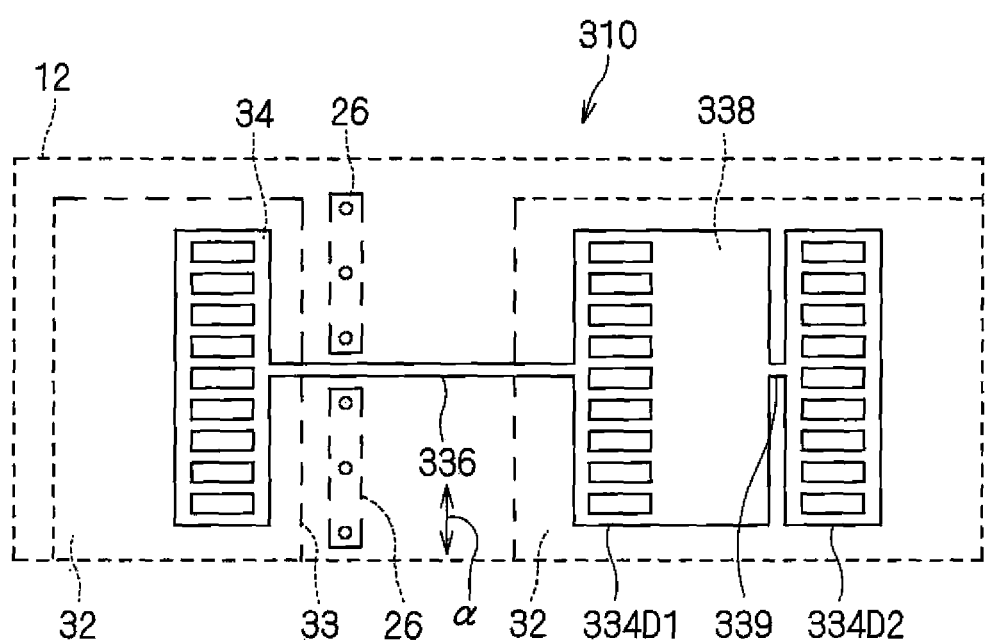
FIG. 45 is an enlarged view of a part D-D in FIG. 42.
Figure 46:
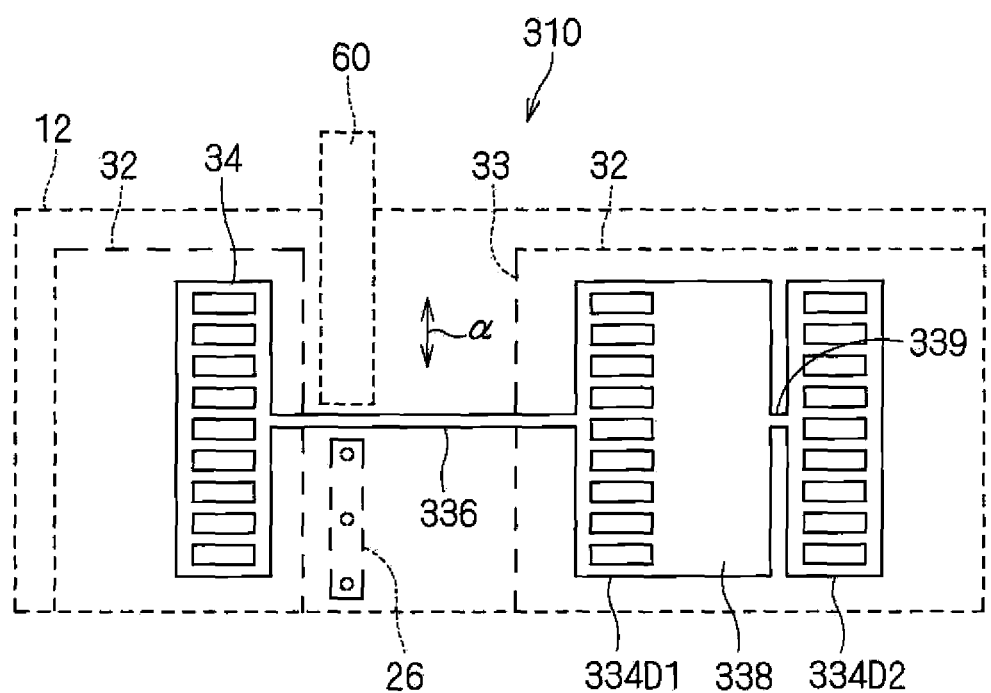
FIG. 46 is a view showing a state in which an external wiring is connected in FIG. 45.
Figure 47:
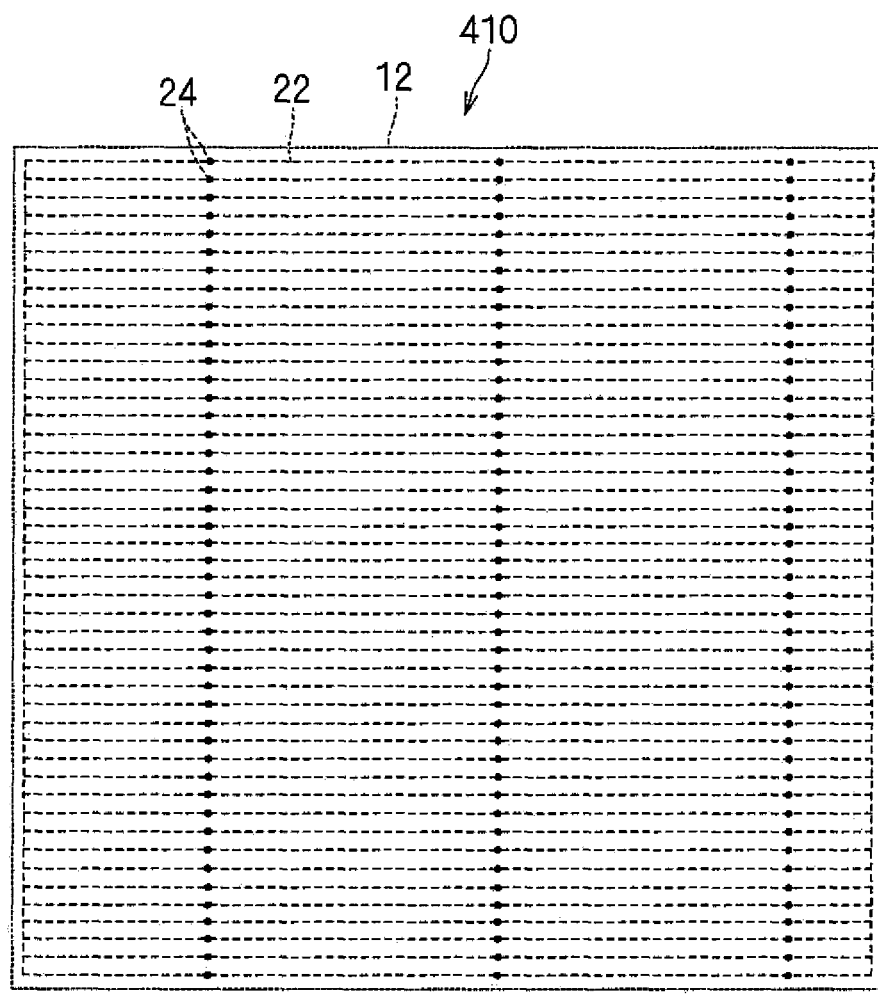
FIG. 47 is a front view of a solar cell element according to a fifth embodiment.
Figure 48:
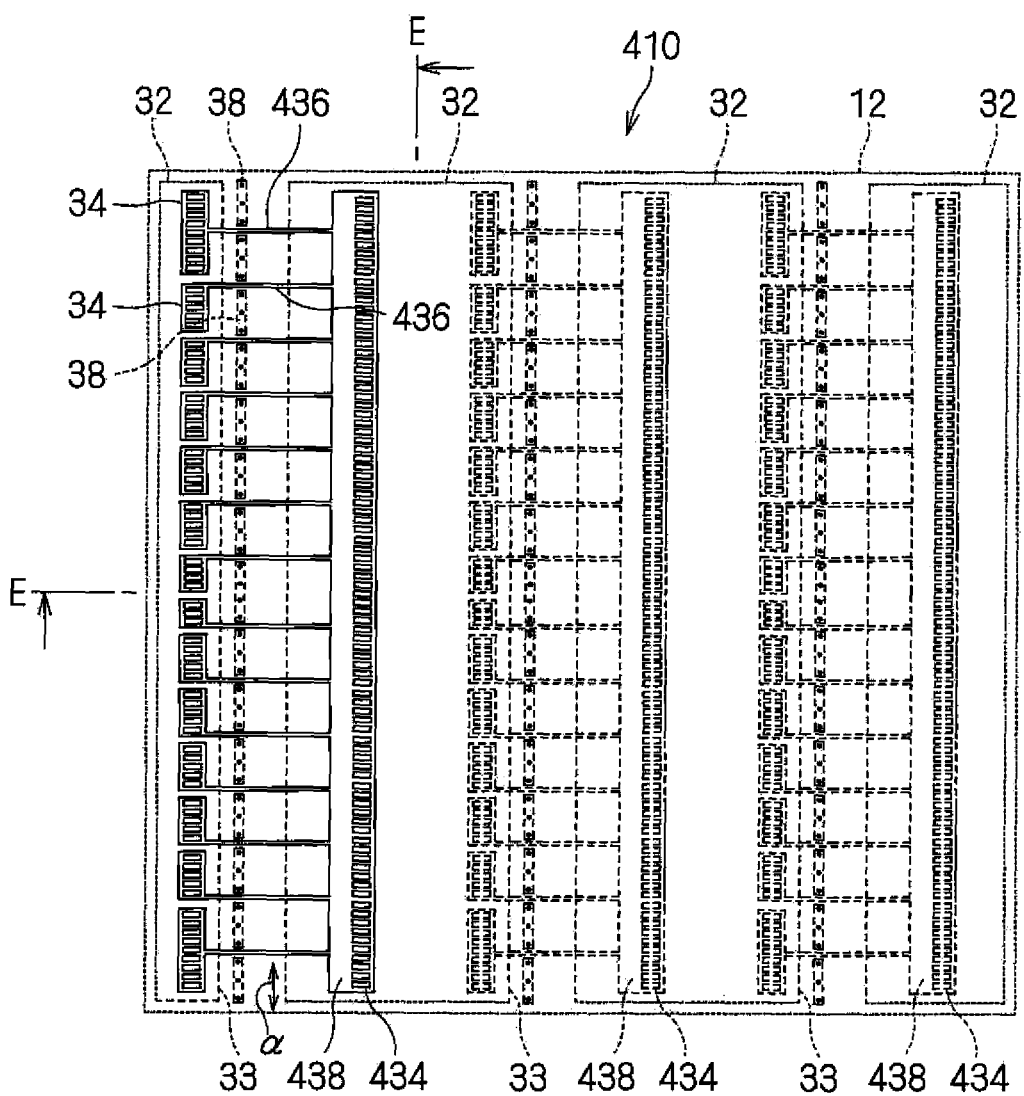
FIG. 48 is a back view of the above solar cell element.
Figure 50:
FIG. 50 is a left side view of the above solar cell element.
Figure 51:
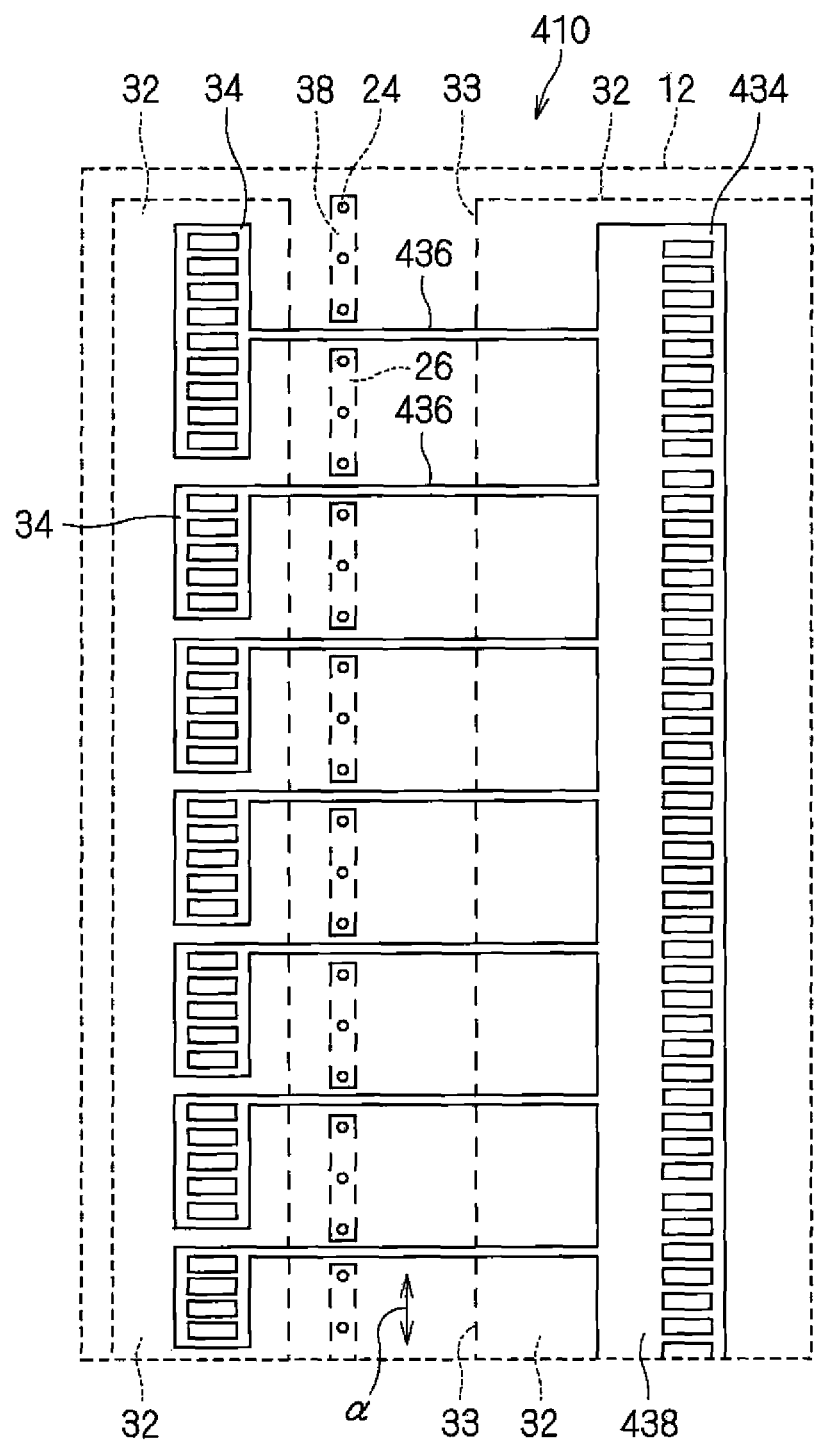
FIG. 51 is an enlarged view of a part E-E in FIG. 48.
Figure 53:
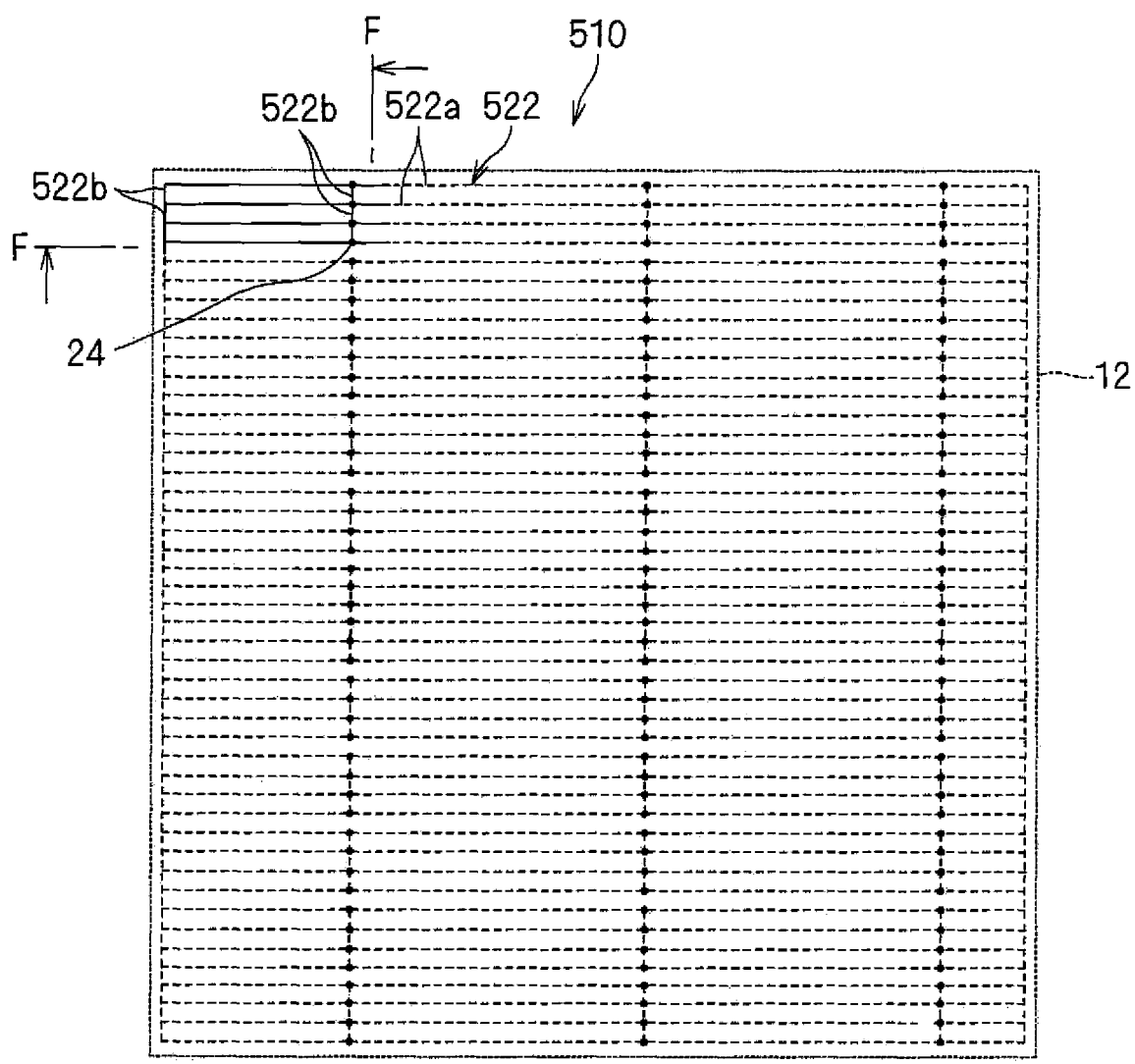
FIG. 53 is a front view of a solar cell element according to a sixth embodiment.
Figure 54:
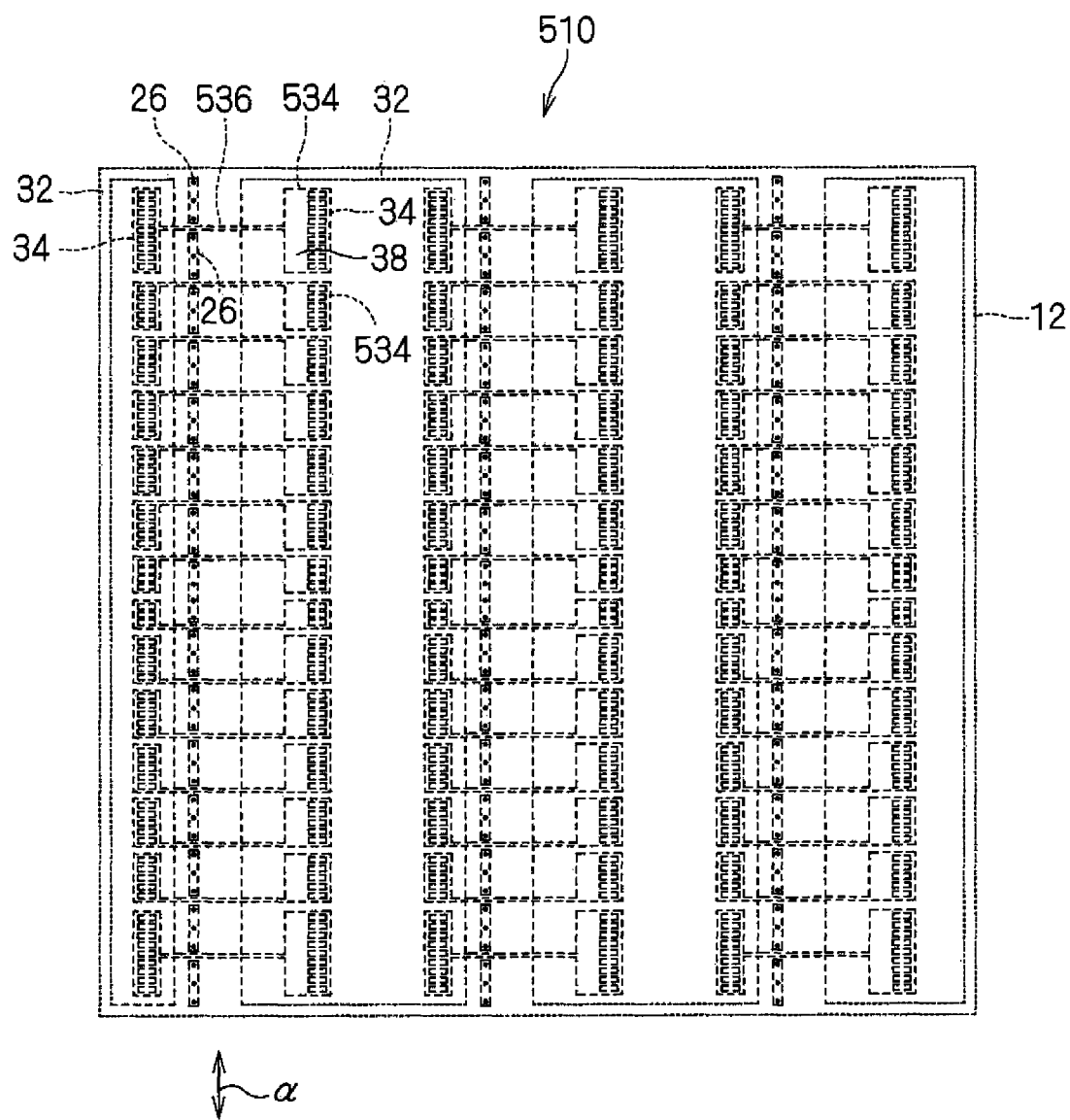
FIG. 54 is a back view of the above solar cell element.
Figure 56:
FIG. 56 is a left side view of the above solar cell element.
Figure 57:
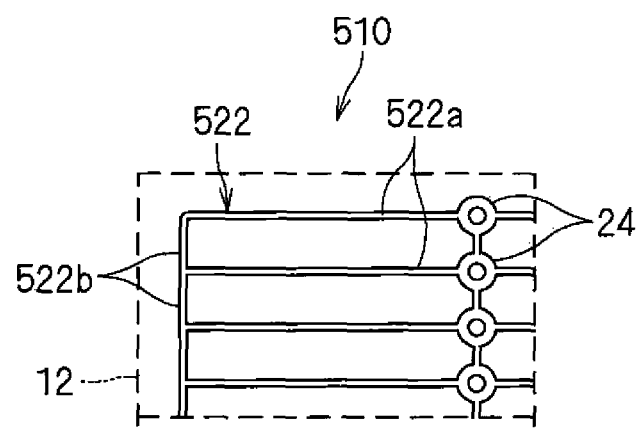
FIG. 57 is an enlarged view of a part F-F in FIG. 53.

The solar cell module 50 is provided with the plurality of solar cell elements 10 and the external wiring 60. In addition, FIGS. 16 to 25 show a part of the solar cell module 50 except for the external wiring 60, and FIGS. 26 to 28 show the external wiring 60. In addition, arrows P2 and P3 in FIGS. 27 and 28 only show parts in which the external wiring 60 connect the solar cell elements 10, and the arrow P2 in FIG. 28 shows a view showing the see-through external wiring 60.

The plurality of solar cell elements 10 form at least one row on a plane. Here, five solar cell elements 10 form one row and the two rows are provided. The number of the solar cell elements 10 in one row may be any number and the row number may be any number.

The plurality of solar cell elements 10 are adjacent to each other at intervals in each row. The solar cell elements 10 are arranged in such a manner that the α direction corresponds to the row direction of the solar cell elements 10. The solar cell elements 10 are adjacent to each other in such a manner that one end in the α direction is opposed to the other end of the solar cell elements 10 in the α direction. Thus, the first extracting electrode 26 and the second extracting electrode 38 are mutually opposed to each other between the adjacent solar cell elements 10. Thus, in each row of the solar cell elements 10, linear continuous parts of the first extracting electrodes 26 and linear continuous parts of the second extracting electrodes 38 are alternately arranged in a linear fashion, so as to be switched at the boundary of the solar cell elements 10.

In addition, as shown in FIGS. 26 to 28, the first extracting electrode 26 and the second extracting electrode 38 opposed to each other are mutually connected by the external wiring 60 between the adjacent solar cell elements 10 in each row.

The external wiring 60 is formed of an elongated conductive member having the same width as that of the first extracting electrode 26 and the second extracting electrode 38 or smaller. Thus, in each row of the solar cell elements 10, it is arranged so as to cover the whole part comprising the alternately arranged linear continuous parts of the first extracting electrodes 26 and linear continuous parts of the second extracting electrodes 38 to be connected to each first extracting electrode 26 and each second extracting electrode 38 with soldering and the like. Thus, the external wiring 60 electrically connect the opposed first extracting electrode 26 and second extracting electrode 38 between the mutually adjacent solar cell elements 10, and electrically connect the linearly arranged first extracting electrodes 26 (or second extracting electrodes 38) in each solar cell element 10 (refer to the arrow P1 in FIG. 28).

The external wiring 60 may employ for example a band-shaped copper foil having a thickness of 0.1 to 0.4 mm, and a width of 2 mm with a whole surface soldered. Thus, the external wiring 60 can be connected to the first extracting electrode 26 or the second extracting electrode 38 with soldering using hot air or a soldering bit, or using a reflow furnace or the like.

Regarding the solar cell element according to this embodiment, since the insulation layer 40 is formed on the surface of the connector electrode 36 of the solar cell element 10, the linear and flat external wiring 60 is connected to the linear continuous parts of the first extracting electrodes 26 of the solar cell element 10 with soldering or the like across the insulation film. Thus, the connection step between the solar cell element and the external wiring 60 can be simple, and the solar cell element is prevented from warping, and the external wiring 60 can be thick, so that series resistance can be further reduced, and the power generation efficiency can be enhanced in the solar cell module.

Actually, the external wiring 60 may only electrically connect the opposed first extracting electrode 26 and the second extracting electrode 38 between the mutually adjacent solar cell elements 10. In this case, another wiring may be used as a member to electrically connect the first extracting electrodes 26 (or the second extracting electrodes 38) linearly arranged in each solar cell element 10.

In addition, the solar cell elements 10 aligned as described above are disposed in a rectangular frame 70 and held between a pair of transparent plates 72 fitted in the frame 70 such that both surfaces of the solar cell elements 10 are covered with it. As the transparent plate 72, a glass plate or a transparent resin plate or the like may be used.

As described above, regarding the solar cell element 10, when the one end of the one solar cell element 10 in the α direction abuts on the other end of the other solar cell element 10 in the α direction, the first extracting electrode 26 abuts on the second extracting electrode 38 between them, so that the first extracting electrode 26 and the second extracting electrode 38 can be easily connected with the external wiring 60, and the solar cell module 50 comprising the solar cell elements 10 connected in series can be easily connected.

{Second Embodiment}

A description will be made of a solar cell element 110 according to a second embodiment with reference to FIGS. 29 to 34. In addition, in the following second to eighth embodiments, a description which is different from that in the first embodiment will be mainly made, and the same references are allotted to the same components as described in the first embodiment and a description of them is omitted.

In FIGS. 29 to 32, a bottom view of the solar cell element 110 is symmetrical to a plan view thereof, and a right side view of the solar cell element 110 is symmetrical to a left side view thereof. In addition, in FIGS. 29 to 34, a part which can be figured out as a partial design is shown with solid lines.

Regarding the solar cell element 110, a connector electrode 136 corresponding to the connector electrode 36 is in the form of a fine-band shape having approximately the same width.

The stress relaxation hole 31h provided in the first embodiment is not formed in the vicinity of an end of the connector electrode 136.

Thus, the external wiring 60 is connected to the first extracting electrode 26 and the second extracting electrode 38 with soldering or the like. In addition, it is shown that the external wiring 60 is connected to the first extracting electrode 26 positioned at the end in the α direction in FIG. 34, but actually, the external wiring 60 is connected to all of the linearly arranged first extracting electrodes 26, and the external wiring 60 is connected to all of the linearly arranged second extracting electrodes 38.

The same operation effect as that of the first embodiment can be provided in the solar cell element 110 except for the operation effect by the stress relaxation hole 31h or the like.

{Third Embodiment}

A description will be made of a solar cell element 210 according to a third embodiment with reference to FIGS. 35 to 40. In FIGS. 35 to 38, a bottom view of the solar cell element 210 is symmetrical to a plan view thereof, and a right side view of the solar cell element 210 is symmetrical to a left side view thereof. In addition, in FIGS. 35 to 40, a part which can be figured out as a partial design is shown with solid lines.

Regarding the solar cell element 210, a connector electrode 236 corresponding to the connector electrode 36 is in the form of a fine-band shape having approximately the same width.

In addition, a stress relaxation hole 231h corresponding to the above stress relaxation hole 31h is formed in the collector electrode 34 in which the second extracting electrode 38 is surrounded, and positioned on a longitudinal extended line of the connector electrode 236, but it is not formed at the end of the connector electrode 236 itself.

Thus, the external wiring 60 is connected to the first extracting electrode 26 and the second extracting electrode 38 with soldering or the like. In addition, it is shown that the external wiring 60 is connected to the first extracting electrode 26 positioned at the end in the α direction in FIG. 40, but actually, the external wiring 60 is connected to all of the linearly arranged first extracting electrodes 26, and the external wiring 60 is connected to all of the linearly arranged second extracting electrodes 38.

The same operation effect as that of the first embodiment can be provided in the solar cell element 210.

{Fourth Embodiment}

A description will be made of a solar cell element 310 according to a fourth embodiment with reference to FIGS. 41 to 46. In FIGS. 41 to 44, a bottom view of the solar cell element 310 is symmetrical to a plan view thereof, and a right side view of the solar cell element 310 is symmetrical to a left side view thereof. In addition, in FIGS. 41 to 46, a part which can be figured out as a partial design is shown with solid lines.

Regarding the solar cell element 310, the same collector electrode 34 as that in the first embodiment is formed in one of the base collector electrodes 32 provided across the space 33, and collector electrodes 334D1 and 334D2 corresponding to the collector electrode 34 are formed in the other base collector electrode 32.

The one collector electrode 334D1 is formed closer to the edge of the base collector electrode 32 along the space 33, and the other collector electrode 334D2 is formed further inside the base collector electrode 32 than the collector electrode 334D1. The respective collector electrodes 334D1 and 334D2 have the same ladder shape as that of the collector electrode 34.

In addition, a second extracting electrode 338 corresponding to the second extracting electrode 38 is formed between the collector electrodes 334D1 and 334D2.

The collector electrode 334D1 and the second extracting electrode 338 are adjacently formed so as to be in contact with each other, so that they are directly and electrically connected.

In addition, the collector electrode 334D2 and the second extracting electrode 338 are adjacently formed across the space. In addition, a fine line-shaped junction connection part 339 is formed in the longitudinal middle part of the collector electrode 334D2 and the second extracting electrode 338 to connect them, and the collector electrode 334D2 and the second extracting electrode 338 are more directly and electrically connected by the junction connection part 339.

In addition, a connector electrode 336 corresponding to the connector electrode 36 is in the form of a fine-band shape having approximately the same width. One end of the connector electrode 336 is connected to the collector electrode 34 existing on the one side of the space 33, and the other end of the connector electrode 336 is connected to the collector electrode 334D1 existing on the other side of the space 33. Thus, the connector electrode 36 electrically connects the collector electrodes 34, 334D1, and 334D2 adjacent to each other across the space 33.

In addition, the above stress relaxation hole 31h is omitted here.

Thus, the external wiring 60 is connected to the first extracting electrode 26 and the second extracting electrode 338 with soldering or the like in the same manner as that of the first embodiment. In addition, it is shown that the external wiring 60 is connected to the first extracting electrode 26 positioned at the end in the α direction in FIG. 46, but actually, the external wiring 60 is connected to all of the linearly arranged first extracting electrodes 26, and the external wiring 60 is connected to all of the linearly arranged second extracting electrodes 338.

The same operation effect as that of the first embodiment can be provided in the solar cell element 310.

In addition, since the collector electrode 334D2 and the second extracting electrode 338 are adjacent to each other across the space, and connected through the fine line-shaped junction connection part 339, heat transmitted from the second extracting electrode 338 to the collector electrode 334D2 is reduced. Therefore, when the external wiring 60 is connected to the second extracting electrode 338 with soldering, heat to melt the solder is controlled escaping, so that the soldering operation can be preferably performed.

{Fifth Embodiment}

A description will be made of a solar cell element 410 according to a fifth embodiment with reference to FIGS. 47 to 52. In FIGS. 47 to 50, a bottom view of the solar cell element 410 is symmetrical to a plan view thereof, and a right side view of the solar cell element 410 is symmetrical to a left side view thereof. In addition, in FIGS. 47 to 52, a part which can be figured out as a partial design is shown with solid lines.

Regarding the solar cell element 410, the same collector electrode 34 as that of the first embodiment is formed in the base collector electrode 32 positioned on one side across the space 33.

In addition, a collector electrode 434 corresponding to the collector electrode 34 is formed in the other base collector electrode 32 positioned on the other side across the space 33. The collector electrode 434 is in the form of a ladder shape, and integrally continued in almost overall α direction.

In addition, a second extracting electrode 438 corresponding to the second extracting electrode 38 has a fine-band shape and integrally continued in almost overall α direction, similar to the collector electrode 434. In other words, the second extracting electrode 438 is similar to the second extracting electrode 38 continuously provided across the space in the first embodiment, except for having no space.

In addition, a connector electrode 436 corresponding to the connector electrode 36 is in the form of a fine-band shape having approximately the same width. One end of the connector electrode 436 is connected to the one collector electrode 34 and the other end of the connector electrode 436 is connected to a portion of the second extracting electrode 438.

The stress relaxation hole 31h is not formed in the vicinity of an end of the connector electrode 436.

The same operation effect as that of the first embodiment can be also obtained in the solar cell element 410 except for the operation effect by the stress relaxation hole 31h and the like.

In addition, since the plurality of collector electrodes 434 are separately formed across the space and then the collector electrodes 34 are connected to the second extracting electrodes 438 by the connector electrodes 36, respectively, a current concentrating due to an electric resistance difference of the connector electrodes 436 can be reduced.

Meanwhile, in this embodiment, the collector electrode 34 positioned on the one side across the space 33 may be continued in almost overall α direction without the space, similar to the collector electrode 434.

In this case, the connector electrodes 436 may be reduced in number such as one. When the number of the connector electrodes 436 is reduced, the width of the connector electrode 436 is preferably increased to ensure a sufficient cross-sectional area.

{Sixth Embodiment}

A description will be made of a solar cell element 510 according to a sixth embodiment with reference to FIGS. 53 to 57. In FIGS. 53 to 56, a bottom view of the solar cell element 510 is symmetrical to a plan view thereof, and a right side view of the solar cell element 510 is symmetrical to a left side view thereof. In addition, in FIGS. 53 to 57, a part which can be figured out as a partial design is shown with solid lines.

Regarding the solar cell element 510, a light-receiving surface electrode 522 corresponding to the light-receiving surface electrode 22 has a plurality of linear conductors 522a formed in approximately parallel, and a light-receiving surface side connection part 522b to connect the linear conductors 522a to each other.

The linear conductors 522a are formed at approximately regular intervals in approximately parallel, similar to the above linear conductor 22a. In addition, it is electrically connected to the first extracting electrode 26 through the conduction part 24 in the longitudinal middle of each linear conductor 522a.

The adjacent linear conductors 522a are electrically connected to each other at their ends and at the conduction part 24, through the linear light-receiving surface side connection part 522b extending in the direction perpendicular to the linear conductor 522a.

In addition, a connector electrode 536 corresponding to the connector electrode 36 is in the form of a fine-band shape having approximately the same width.

The stress relaxation hole 31h is not formed in the vicinity of an end of the connector electrode 536.

The same operation effect as that of the first embodiment can be also obtained in the solar cell element 510 except for the operation effect by the stress relaxation hole 31h and the like.

In addition, the linear conductors 522a of the light-receiving surface electrode 522 are electrically connected through the light-receiving surface connection part 522b in each conduction part 24, on the light-receiving surface side of the solar cell element 510. Therefore, even when the conduction part 24 is partially insufficient in formation, it can be electrically connected to the first extracting electrode 26 through another conduction part 24 by the light-receiving surface side connection part 522b.

{Seventh Embodiment}

Figure 58:
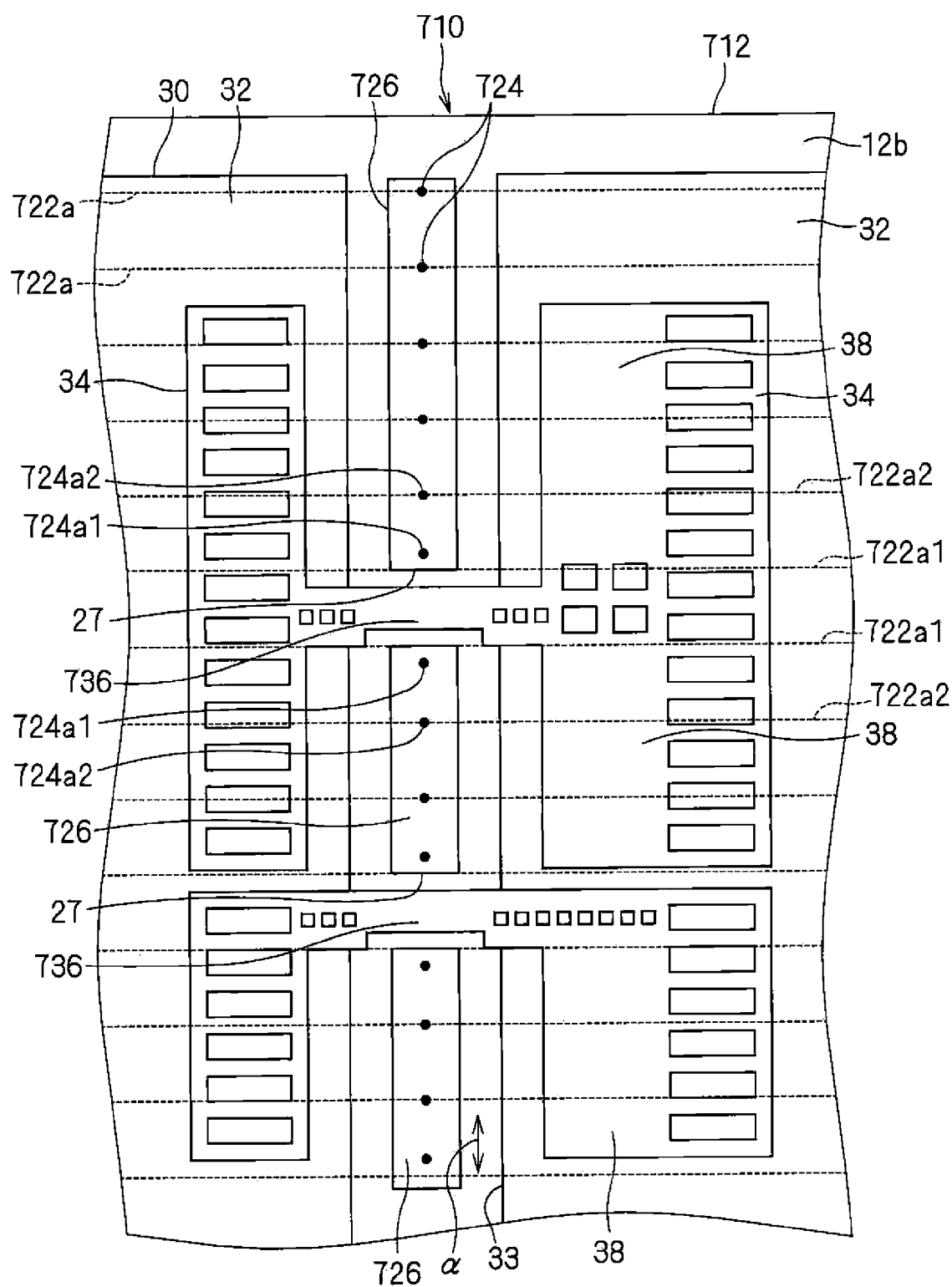
FIG. 58 is an essential part enlarged back view of a solar cell element according to a seventh embodiment.
Figure 59:
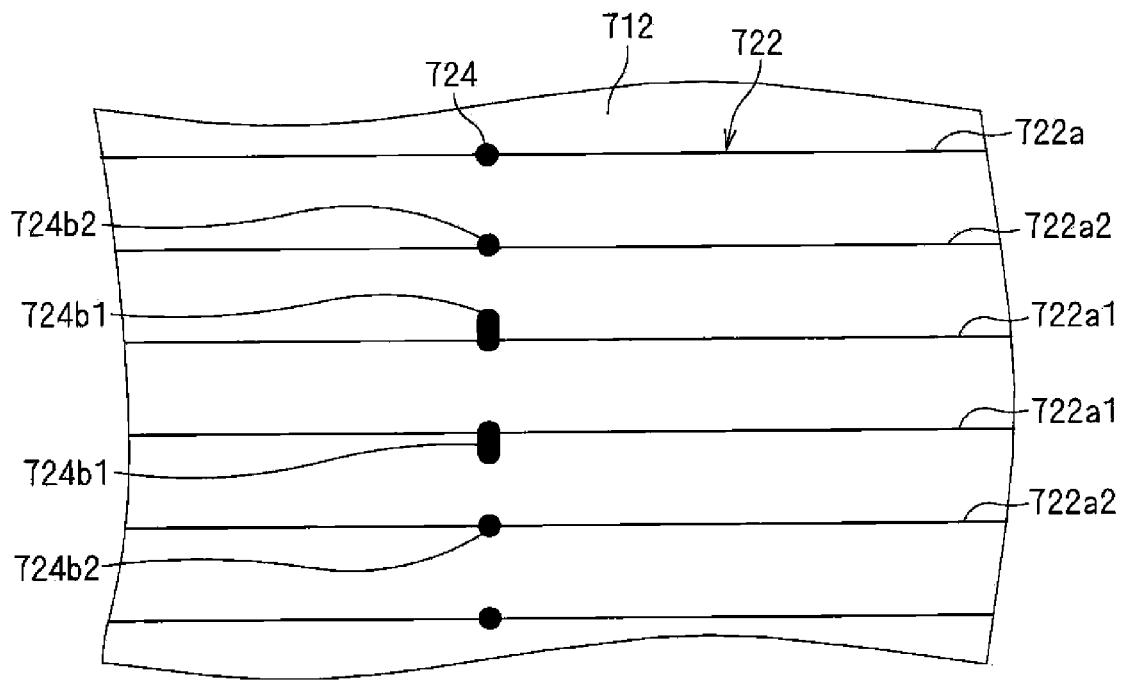
FIG. 59 is an essential part enlarged front view of the above solar cell element.
Figure 60:
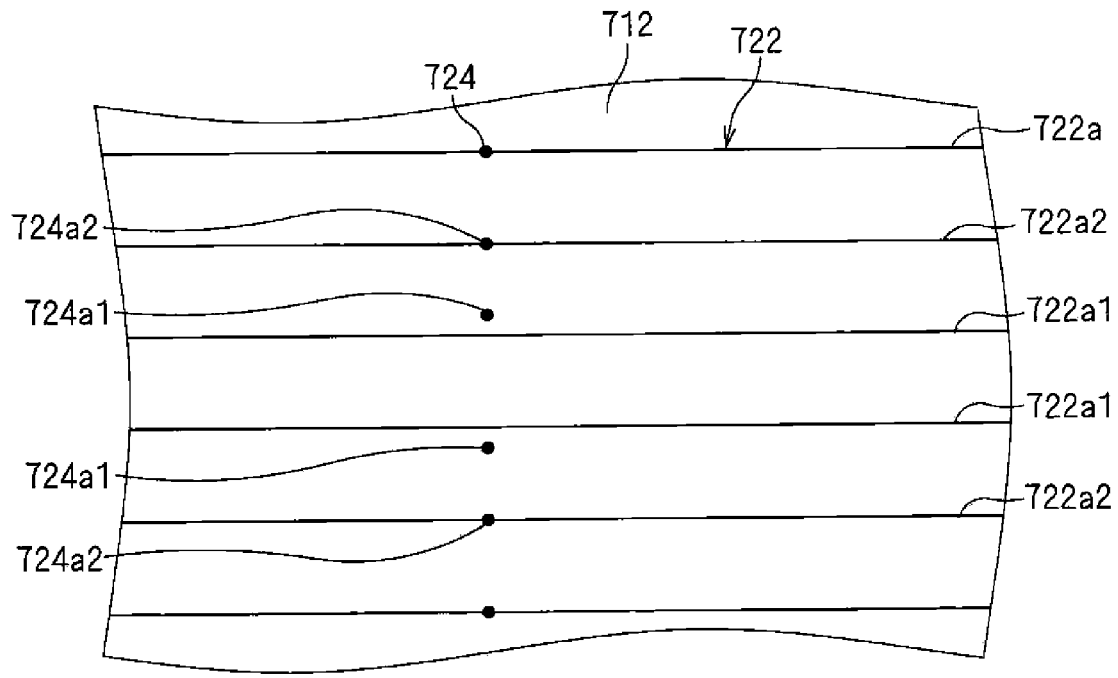
FIG. 60 is a view in which first and second pads are omitted in FIG. 59.

A description will be made of a solar cell element 710 according to a seventh embodiment with reference to FIGS. 58 to 60. In addition, in FIG. 58, a linear conductor 722a which appears in planar see-through view is shown by a dotted line.

The solar cell element 710 comprises a light-receiving surface electrode 722 including a plurality of linear conductors 722a, a first extracting electrode 726, and a plurality of conduction parts 724, as a first electrode.

The linear conductors 722a have the same configuration as that of the linear conductor 22a described in the first embodiment, and are formed in approximately parallel. The linear conductors 722a are formed at approximately regular intervals in approximately parallel. A width of the linear conductor 722a is for example 50 µm to 200 µm.

The linear conductor 722a is occasionally separated to a first linear conductor 722a1 and a second linear conductor 722a2 for convenience of the description. The first linear conductor 722a1 is the linear conductor 722a formed so as to be closest to an edge of the first extracting electrode 726 (more specifically, edge of the first extracting electrode 726 in the α direction) in planar see-through view. The second linear conductor 722a2 is arranged so as to pass through further inside the first extracting electrode 726 than the edge crossed by the first linear conductor 722a1, in planar see-through view.

In addition, the first extracting electrode 726 is formed with the same configuration and arrangement as the first extracting electrode 26 in general. Meanwhile, a connector electrode 736 according to this embodiment has the same configuration as that of the connector electrode 36 except that its width is larger than that of the connector electrode 36. Here, since the connector electrode 736 is wide, a space between the first extracting electrodes 726 is wider than the space between the extracting electrodes 26.

The conduction parts 724 are provided in each of the linear conductors 722a. In addition, similar to the above conduction part 24, the conduction part 724 penetrates a semiconductor substrate 712 corresponding to the semiconductor substrate 12, and electrically connects the corresponding linear conductor 722a to the first extracting electrode 726.

Here, the conduction part 724 is occasionally separated to a first conduction part 724a1 and a second conduction part 724a2 for the convenience of the description. The first conduction part 724a1 is provided so as to correspond to the first linear conductor 722a1, and the second conduction part 724a2 is provided so as to correspond to the second linear conductor 722a2.

The first conduction part 724a1 is formed further inside the first extracting electrode 726 than the corresponding first linear conductor 722a1 in planar see-through view so as to be connected to the first extracting electrode 726. Thus, on the second surface side of the semiconductor substrate 712, the first conduction part 724a1 is directly connected to the first extracting electrode 726. In addition, on the first surface side of the semiconductor substrate 712, a first pad 724b1 is formed as a relay conduction part to connect the first linear conductor 722a1 to the corresponding first conduction part 724a1. The first pad 724b1 covers the whole first conduction part 724a1, and the first linear conductor 722a1 on the side of the first conduction part 724a1, and formed into an ellipsoidal shape. Thus, the first conduction part 724a1 and the first linear conductor 722a1 formed in different positions on the first surface side of the semiconductor substrate 712 are electrically connected by the first pad 724b1. In addition, the first pad 724b1 is not necessarily in the form of the ellipsoid, and it may be approximately circular, polygonal, or linear. In addition, the first pad 724b1 is preferably integrally formed with the first linear conductor 722a1 at the same time, but this is not indispensable. The first pad 724b1 may be formed at the same time with the first conduction part 724a1, or the first linear conductor 722a1 and the first conduction part 724a1 may be separately formed. That is, the relay conduction part only has to electrically connect the first linear conductor 722a1 to corresponding first conduction part 724a1. In addition, a short radial dimension of the first pad 724b1 is for example 100 µm to 500 µm.

In addition, the second conduction part 724a2 is formed at an intersection of the second linear conductor 722a2 with the first extracting electrode 726 in planar see-through view. Here, the second conduction part 724a2 is formed at an intersection of a width-direction center line of the second linear conductor 722a2 with a width-direction center line of the first extracting electrode 726 in planar see-through view. Thus, on the first surface side of the semiconductor substrate 712, a second pad 724b2 is formed so as to cover the second conduction part 724a2, and the second linear conductor 722a2 is provided so as to pass through approximately the center of the second pad 724b2. Thus, the second conduction part 724a2 and the second linear conductor 722a2 are directly and electrically connected. In addition, on the second surface side of the semiconductor substrate 712, the second linear conductor 722a2 is positioned on the width-direction center line of the first extracting electrode 726, and at that position, the second conduction part 724a2 and the first extracting electrode 726 are directly and electrically connected. In addition, a diameter of the second pad 724b2 is for example 100 µm to 500 µm. In addition, a shape of the second pad 724b2 is not necessarily circular, and it may be ellipsoidal, or polygonal or the like. Actually, the second pad 724b2 preferably has a shape corresponding to a shape of a through hole formed in the semiconductor substrate 712.

The above configuration may be regarded as follows. That is, the linear conductors 722a includes the two first linear conductor 722a1 which sandwich the connector electrode 736, and the two second linear conductors 722a2 positioned outside them in planar see-through view. The first conduction part 724a1 is provided closer to the first linear conductor 722a1, between the first linear conductor 722a2 and the first linear conductor 722a1. The first pad 724b1 is formed into the ellipsoidal shape so as to stride the first linear conductor 722a1 and the first conduction part 724a1.

Regarding the solar cell element 710 configured as described above, the first conduction part 724a1 can be formed in a position shifted from the first linear conductor 722a1, so that a degree of layout freedom of the first extracting electrode 726, the connector electrode 736, or the linear conductor 722a can be improved.

For example, when the space between the first conduction part 724a1 is increased, the width of the connector electrode 736 can be large. As a result, the power collected by the base collector electrode 32 and the collector electrode 34 can be efficiently transmitted to the second extracting electrode 38.

Furthermore, on the light-receiving surface side of the solar cell element 710, the first and second pads 724b1 and 724b2 provided so as to correspond to the respective linear conductors 722a appear to be arranged at regular intervals, which is preferable in view of appearance.

In addition, since the second conduction part 724a2 is directly connected to the second linear conductor 722a2 and the first extracting electrode 726, a resistance loss between the second linear conductor 722a2 and the first extracting electrode 726 can be reduced.

While the description has been made of the example in which the first linear conductor 722a1 passes through the edge of the first extracting electrode 726 in planar see-through view in this embodiment, the present invention may be applied to the following case, that is, a case where the first linear conductor passes through the position shifted from the first extracting electrode in planar see-through view, or passes between the first extracting electrodes, for example, or a case where it passes through the outside the one positioned at the outermost end of the first extracting electrodes. These cases also, similar to the above, may employ the configuration in which the conduction part corresponding to the first linear body is formed further inside the first extracting electrode than the first linear conductor, and on the first surface side of the semiconductor substrate, the first linear conductor and the conduction part are connected by the relay conduction part.

{Eighth Embodiment}

Figure 61:
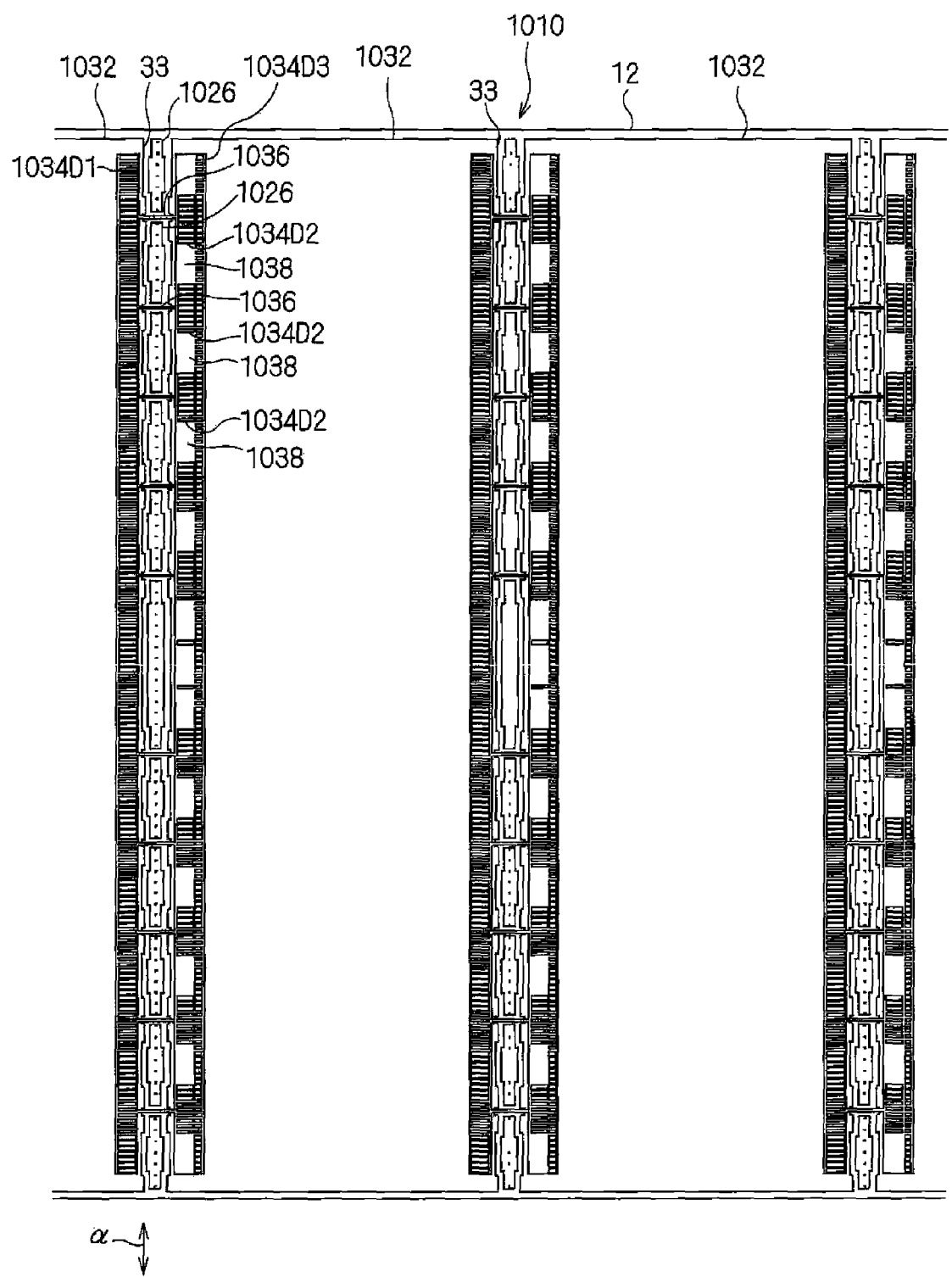
FIG. 61 is a back view of a solar cell element according to an eighth embodiment.
Figure 62:
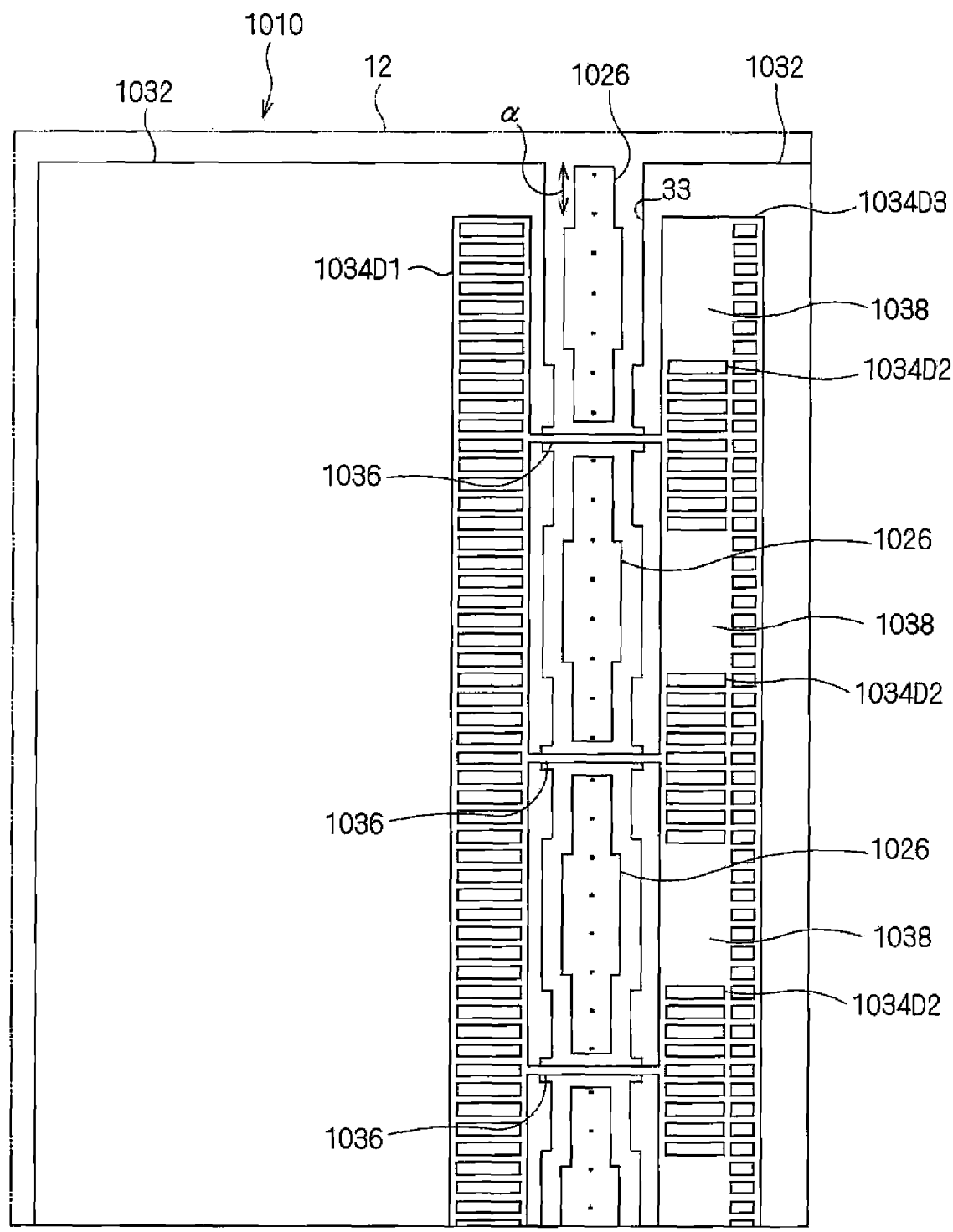
FIG. 62 is an essential part enlarged back view of the above solar cell element.

A description will be made of a solar cell element 1010 according to an eighth embodiment. As shown in FIGS. 61 and 62, regarding the solar cell element 1010, a first extracting electrode 1026 corresponding to the first extracting electrode 26 is formed so as to be narrow at both ends in the α direction, and wide in its center part.

In addition, a base collector electrode 1032 corresponding to the base collector electrode 32 is formed to be wide to narrow the space 33 based on the narrow both ends of the first extracting electrode 1026. Furthermore, in the vicinity of the position of a connector electrode 1036, a side edge of the first extracting electrode 1026 is recessed so as not to narrow the space 33.

In addition, a collector electrode 1034D1 is formed in the base collector electrode 1032 positioned on one side across the space 33. The collector electrode 1034D1 has a ladder shape and is integrally continued in approximately overall α direction.

In addition, collector electrodes 1034D2 and 1034D3 corresponding to the collector electrode 34 are formed in the base collector electrode 1032 positioned on the other side across the space 33.

The one collector electrode 1034D2 is formed close to an edge of the base collector electrode 32 along the space 33, and the other collector electrode 1034D3 is formed further inside the base collector electrode 32 than the collector electrode 1034D2. The respective collector electrodes 1034D2 and 1034D3 have a ladder shape similar to the collector electrode 34, and the collector electrode 1034D3 is integrally continued in approximately overall α direction. In addition, a width dimension of the collector electrode 1034D3 is smaller than a width dimension of the collector electrode 1034D1.

In addition, a second extracting electrode 1038 corresponding to the second extracting electrode 38 is formed between the collector electrodes 1034D2. In other words, this configuration may be regarded as a configuration in which the collector electrodes 1034D2 are provided in the spaces of the second extracting electrodes 1038 linearly continued across the spaces in the first embodiment. The collector electrodes 1034D2 and 1034D3 and the second extracting electrode 1038 are directly and electrically connected as they are formed adjacently so as to be in contact with each other.

In addition, a connector electrode 1036 corresponding to the connector electrode 36 is formed to be a fine-band shape having approximately the same width. One end of the connector electrode 1036 is connected to the collector electrode 1034D1 positioned on one side across the space 33, and the other end of the connector electrode 1036 is connected to the collector electrode 1034D2 positioned on the other side across the space 33. Thus, the connector electrode 1036 electrically connects the collector electrodes 1034D1, 334D2, 334D3 adjacent to each other across the space 33.

Here, the stress relaxation hole 31h is omitted.

Thus, the external wiring 60 is connected to the first extracting electrode 1026 and the second extracting electrode 1038 with soldering or the like in the same manner as in the first embodiment. The connecting manner of the external wiring 60 is similar to that described in the above embodiment (refer to FIG. 34, for example).

The same operation effect as that in the first embodiment can be obtained in this solar cell element 1010.

In addition, since the first extracting electrode 1026 is small in width at both ends in the α direction and large in width in the middle, the base collector electrode 1032 and the high-concentration doped layer 16 formed under it can be widely formed, so that characteristics as the solar cell element can be improved.

Furthermore, since the part of the base collector electrode 1032 is recessed in the position of the connector electrode 1036, the position can be used in alignment in forming the base collector electrode 1032 on the semiconductor substrate 12, so that productivity can be improved.

In addition, since the collector electrode 1034D2 is provided between the second extracting electrodes 1038, the power can be efficiently collected, and thermal stress generated in the base collector electrode 1032 can be reduced.

{Variation}

In addition, each configuration described in each embodiment and each variation can be appropriately combined as long as they are consistent with each other.

While the solar cell element and the solar cell module have been described in detail in the above, the above-described description is illustrative in all aspects and the present invention is not limited to it. Various kinds of modifications and changes may be added within the scope of the present invention, and numerous variations which are not shown can be employed without departing from the scope of the present invention.

The invention claimed is:

1. A solar cell element comprising:
   a semiconductor substrate including a first surface to receive light, and a second surface provided on a back side of the first surface;
   a plurality of base collector electrodes provided on the second surface of the semiconductor substrate;
   a plurality of collector electrodes, at least one collector electrode from amongst the plurality being placed on each of said base collector electrodes in a thickness direction of said substrate, such that each collector electrode is electrically connected to said base collector electrode on which said collector electrode is placed;
   a connector electrode provided to said second surface and electrically connected to at least one of plurality of said collector electrodes;
   a first extracting electrode provided between the plurality of said base collector electrodes; and
   a second extracting electrode provided to said second surface and electrically connected to said connector electrode,
   wherein a first electrode comprises a light-receiving surface electrode provided on the first surface of the semiconductor substrate, the first extracting electrode, and a conduction part provided so as to penetrate the semiconductor substrate, and electrically connecting the light-receiving surface electrode to the first extracting electrode, and a second electrode having a polarity different from that of the first electrode comprises the plurality of base collector electrodes, the plurality of collector electrodes, the connector electrode, and the second extracting electrode, wherein each electrode of the plurality of base collector electrodes and each electrode of the plurality of collector electrodes comprises a conductive material, and wherein the connector electrode, the first extracting electrode, the second extracting electrode, the first electrode and the second electrode each comprise a conductive material, and wherein each of the plurality of base collector electrodes, the plurality of collector electrodes, the connector electrode, and the second extracting electrode is spaced apart from the first extracting electrode and is not connected to the first extracting electrode.

2. The solar cell element according to claim 1, wherein the light-receiving surface electrode comprises a part not overlapping the connector electrode in a planar cross-section, between the plurality of base collector electrodes.

3. The solar cell element according to claim 1, wherein the light-receiving surface electrode includes a plurality of linear conductors formed on the first surface of the semiconductor substrate at approximately regular intervals in approximately parallel.

4. The solar cell element according to claim 1, wherein the at least one collector electrode and the connector electrode are formed as the same layer.

5. The solar cell element according to claim 1, wherein a plurality of first extracting electrodes are provided so as to be separated along an extending direction of a region between the plurality of base collector electrodes, and the connector electrode is provided so as to pass between the plurality of first extracting electrodes.

6. The solar cell element according to claim 1, wherein a plurality of first extracting electrodes and the plurality of collector electrodes are separated at approximately the same positions along an extending direction of a region between the plurality of base collector electrodes.

7. The solar cell element according to claim 1, wherein the collector electrodes are provided along respective edges of the plurality of base collector electrodes and are provided along respective edges of the plurality of base collector electrodes.

8. The solar cell element according to claim 1, wherein a stress relaxation hole is formed in the vicinity of an end of the connector electrode.

9. A solar cell module comprising:
a plurality of solar cell elements arranged in line according to claim 1; and
an external wiring to mutually connect the first extracting electrode and the second extracting electrode between the adjacent solar cell elements.

10. The solar cell element comprising:
a semiconductor substrate including a first surface to receive light, and a second surface provided on a back side of the first surface;
a plurality of base collector electrodes provided on the second surface of the semiconductor substrate;
a plurality of collector electrodes, at least one collector electrode from amongst the plurality being placed on each of said base collector electrodes in a thickness direction of said substrate, such that each collector electrode is electrically connected to said base collector electrode on which said collector electrode is placed;
a connector electrode provided to said second surface and electrically connected to at least one of plurality of said collector electrodes;
a first extracting electrode provided between the plurality of said base collector electrodes; and
a second extracting electrode provided to said second surface and electrically connected to said connector electrode, wherein
a first electrode comprises a light-receiving surface electrode provided on the first surface of the semiconductor substrate, the first extracting electrode, and a conduction part provided so as to penetrate the semiconductor substrate, and electrically connecting the light-receiving surface electrode to the first extracting electrode, and
a second electrode having a polarity different from that of the first electrode comprises the plurality of base collector electrodes, the plurality of collector electrodes, the connector electrode, and the second extracting electrode, wherein
the first electrode comprises a light-receiving surface electrode including a plurality of linear conductors provided on the first surface of the semiconductor substrate, the first extracting electrode, and a plurality of conduction parts provided so as to correspond to the plurality of linear conductors, penetrating the semiconductor substrate, and electrically connecting the plurality of linear conductors to the extracting electrodes,
the plurality of linear conductors include a first linear conductor passing through an edge part of the first extracting electrode or passing through a part adjacent to the first extracting electrode in a planar cross-section,
a conduction part, from among the plurality of conduction parts, corresponding to the first linear conductor, is formed further inside the first extracting electrode than an amount the conduction part is inside the first linear conductor, and the conduction part is connected to the first extracting electrode in a planar cross-section, and
a relay conduction part is formed on the first surface side of the semiconductor substrate, and electrically connecting the first linear conductor to the corresponding conduction part.

11. The solar cell element according to claim 10, wherein the plurality of linear conductors include a second linear conductor arranged so as to cross the first extracting electrode in a planar cross-section, and a conduction part, from among the plurality of conduction parts, corresponding to the second linear conductor is formed in an intersection of the second linear conductor with the first extracting electrode in a planar cross-section.

12. The solar cell element according to claim 1, wherein the plurality of collector electrodes, the connector electrode, the first extracting electrode and the second extracting electrode comprise materials having a higher conductivity than that of the plurality of base collector electrodes.

13. The solar cell element according to claim 12, wherein the plurality of base collector electrodes comprise aluminum, and the plurality of collector electrodes, the connector electrode, the first extracting electrode and the second extracting electrode comprise silver.

14. The solar cell element according to claim 1, wherein each of the plurality of base collector electrodes includes aluminum, and wherein each of the plurality of collector electrodes, the connector electrode, the first electrode, and the second extracting electrode includes silver.

15. The solar cell element according to claim 1, wherein a high-concentration doped layer is arranged on the second surface of the semiconductor substrate, and wherein the base collector electrodes are arranged thereon.

16. The solar cell element according to claim 1, wherein an opposite-conductivity type layer is arranged at a side of the first surface of the semiconductor substrate, and wherein the light-receiving surface electrode is arranged thereon.

* * * * *